(12) United States Patent
Yap et al.

(10) Patent No.: US 11,282,970 B1
(45) Date of Patent: Mar. 22, 2022

(54) WIDEBAND DETECTOR STRUCTURES

(75) Inventors: Daniel Yap, Newbury Park, CA (US); Rajesh D. Rajavel, Oak Park, CA (US); Sarabjit Mehta, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/372,366

(22) Filed: Feb. 13, 2012

(51) Int. Cl.
    *H01L 31/0236* (2006.01)
    *H01L 27/146* (2006.01)
    *H01L 31/0352* (2006.01)

(52) U.S. Cl.
    CPC .. *H01L 31/02363* (2013.01); *H01L 27/14685* (2013.01); *H01L 31/035281* (2013.01)

(58) Field of Classification Search
    CPC ....... H01L 31/02366; H01L 31/035281; H01L 27/1422–1427; H01L 27/142; H01L 27/14669
    USPC ...................... 257/432, 434, 466; 250/338.4; 136/243–265
    See application file for complete search history.

(56) References Cited

U.S. PATENT DOCUMENTS

2011/0073762 A1* 3/2011 Soma et al. ............... 250/338.4

OTHER PUBLICATIONS

Hamamatsu, Solid State Division, Technical Information (SD-12) by Hamamatsu Photonics K., "Characteristics and Use of infrared detectors," 43 pages.

A. Rogalski, "Quantum well photoconductors in infrared detector technology," Journal of Applied Physics, vol. 93, No. 8, Apr. 15, 2003, pp. 4355-4391.

M. A. Green, et al., "Very High Efficiency Silicon Solar Cells—Science and Technology", IEEE Transactions on Electron Devices, vol. 46, No. 13, Oct. 1999, pp. 1940-1947.

P. Campbell and M. A. Green, "Light trapping properties of pyramidally textured surfaces," Journal of Applied Physics, vol. 62, No. 1, Jul. 1, 1987, pp. 243-249.

R. Brendel, et al., "Ultrathin crystalline silicon solar cells on glass substrates," Applied Physics Letters, vol. 70, No. 3, 1997, pp. 390-392.

R. M. Swanson, et al., "Point-contact silicon solar cells, IEEE Transactions on Electron Devices," vol. ED-31, No. 5, May 1984, pp. 661-664.

(Continued)

*Primary Examiner* — Sue A Purvis
*Assistant Examiner* — Scott Stowe
(74) *Attorney, Agent, or Firm* — Lewis Roca Rothgerber Christie, LLP

(57) ABSTRACT

An apparatus and method for a detector are disclosed. The apparatus disclosed contains a non-absorbing layer shaped as one or more pyramids, one or more collector regions, an absorber layer disposed between the one or more collector regions and the non-absorbing layer, a first electrical contact, and a second electrical contact, wherein the absorber layer is configured to absorb photons of incident light and generate minority electrical carriers and majority electrical carriers, wherein the one or more collector regions are electrically connected with the absorber layer and with the first electrical contact for extracting the minority electrical carriers, and the absorber layer is electrically connected with the one or more collector regions and with the second electrical contact to extract the majority electrical carriers.

29 Claims, 66 Drawing Sheets

(56) References Cited

OTHER PUBLICATIONS

R. A. Sinton, et al., "27.5 percent silicon concentrator solar cells," IEEE Electron Device Letters, vol. EDL-7 No. 10, Oct. 1986, pp. 567-569.

Kayes, et al., "Comparison of the device physics principles of planar and radial p-n junction nanorod solar cells," J. Appl. Physics, vol. 97, 114302 (2005) 12 pages.

L. Hu and G. Chen, "Analysis of optical absorption in silicon nanowire arrays for photovoltaic applications," Nano Letters, vol. 7, No. 11, Nov. 2007, pp. 3249-3252.

E. Garnett and P. Yang, "Light trapping in silicon nanowire solar cells," Nano Letters, vol. 10 (2010), pp. 1082-1087.

A. K. Sood, et al., "Next generation nanostructures based EO/IR focal plane arrays for unattended ground sensor applications," Proceedings of SPIE vol. 7693 (2010), p. 76930C, 10 pages.

S. E. Han and G. Chen, "Toward the Lambertian limit of light trapping in thin nano-structured silicon solar cells," Nano Letters, vol. 10 (2010), pp. 4692-4696.

A. K. Dutta, et al., "High efficiency solar cells based on micro-nanoscale structures," Proceedings of SPIE vol. 7683 (2010), 15 pages.

R. Esteban, M Laroche and J. J. Greffet, "Dielectric gratings for wide-angle, broadband absorption by thin film photovoltaic cells," Applied Physics Letters, vol. 97, 221111 (2010) 4 pages.

P. Klipstein, "XBn barrier photodetectors for high sensitivity and high operating temperature infrared sensors," Proceedings of SPIE, vol. 6940, paper 69402U-1, 2008, 13 pages.

P. Campbell, S. R. Wenham and M.A. Green, "Light trapping and reflection control with tilted pyramids and grooves," Conference Record of the Twentieth IEEE Photovoltaic Specialists Conference, 1988, pp. 713-716.

S. Maimon and G. W. Wicks, "nBn detector, an infrared detector with reduced dark current and higher operating temperature," Applied Physics Letters, vol. 89, p. 151109 (2006), 4 pages.

Rogalski, A., "Third-Generation infrared photodedector arrays," Applied Physics Reviews—Focused Review, Journal of Applied Physics, 105, 091101, 2009. 44 pages.

* cited by examiner

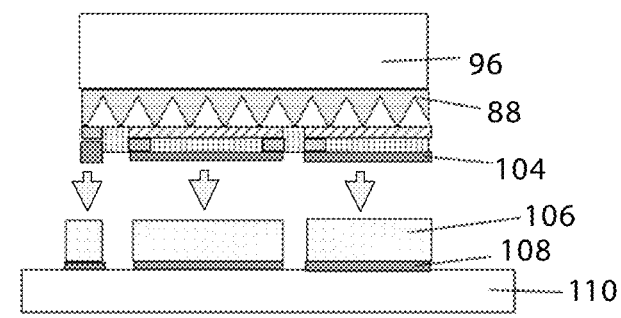
FIG. 9i
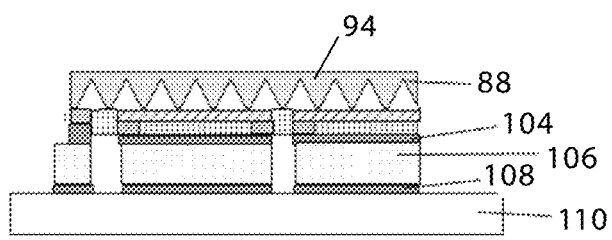
FIG. 9j
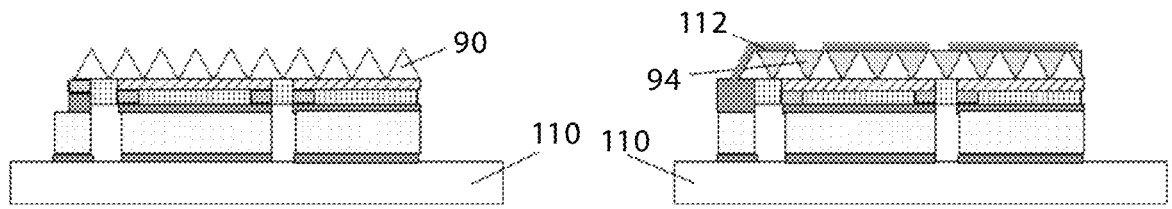
FIG. 9k                    FIG. 9l

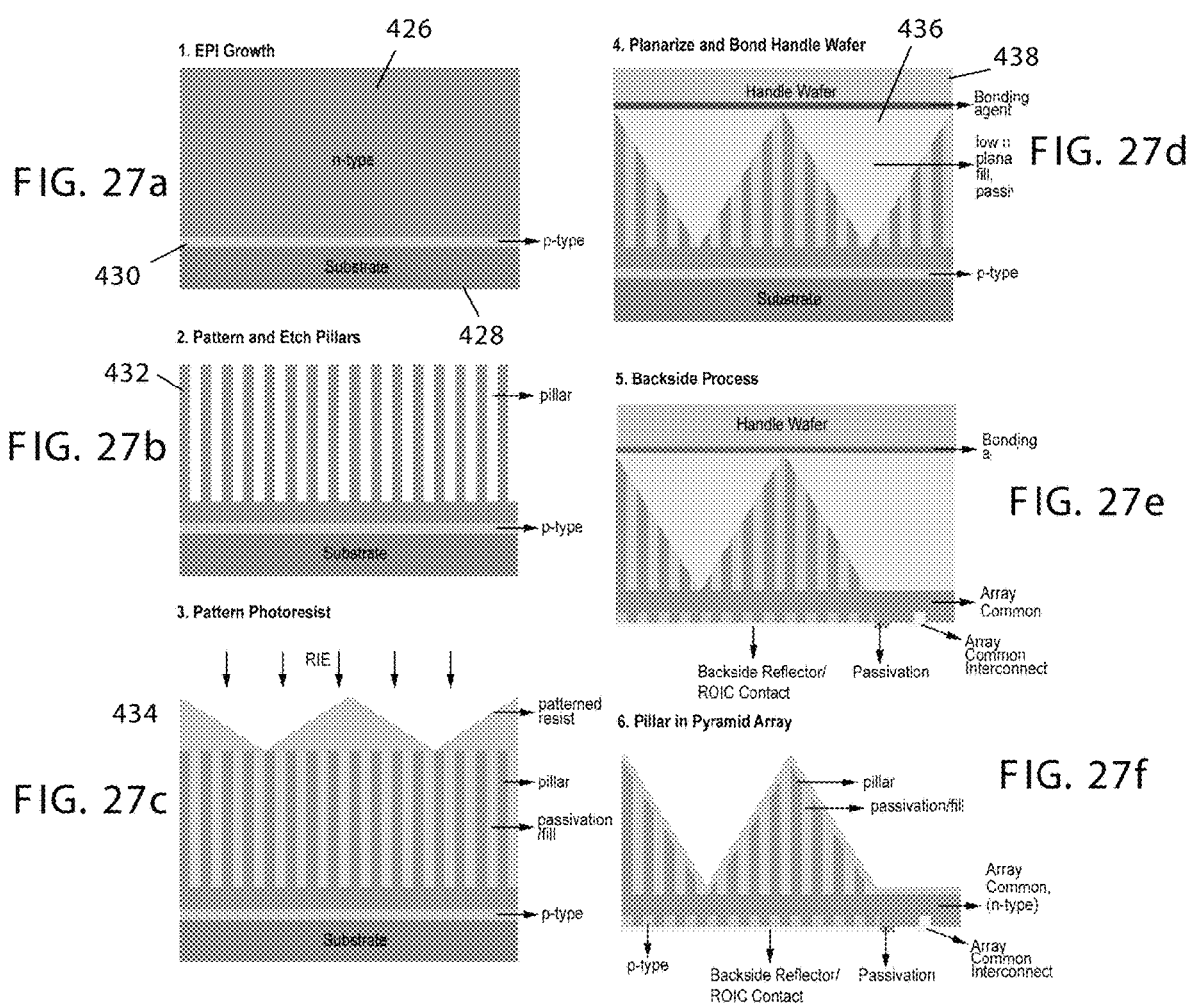

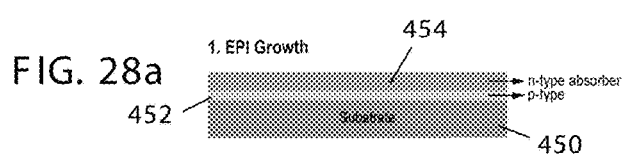
FIG. 28a  1. EPI Growth
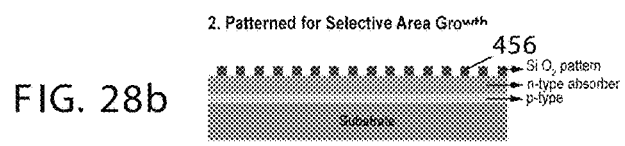
FIG. 28b  2. Patterned for Selective Area Growth
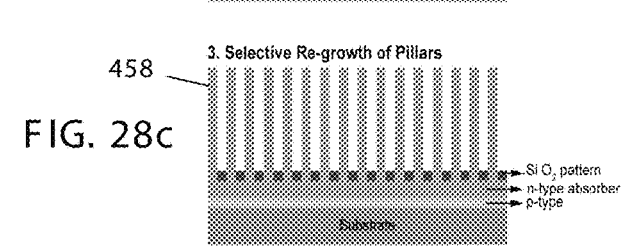
FIG. 28c  3. Selective Re-growth of Pillars
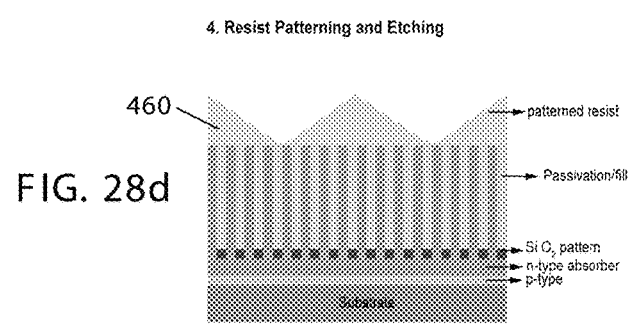
FIG. 28d  4. Resist Patterning and Etching
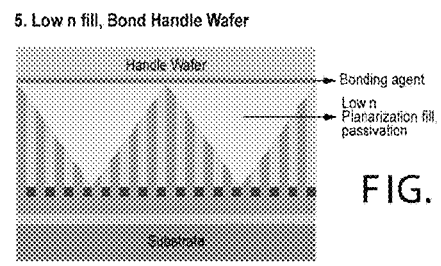
FIG. 28e  5. Low n fill, Bond Handle Wafer
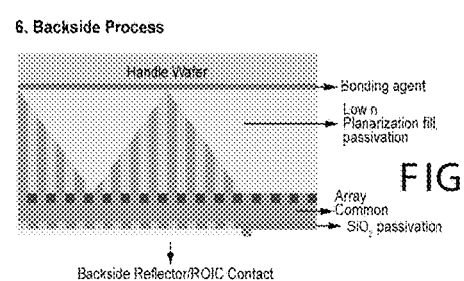
FIG. 28f  6. Backside Process
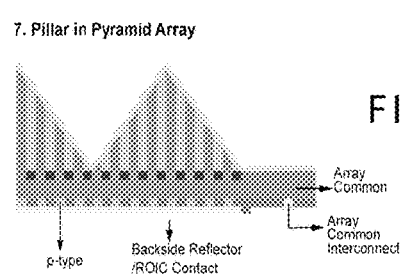
FIG. 28g  7. Pillar in Pyramid Array

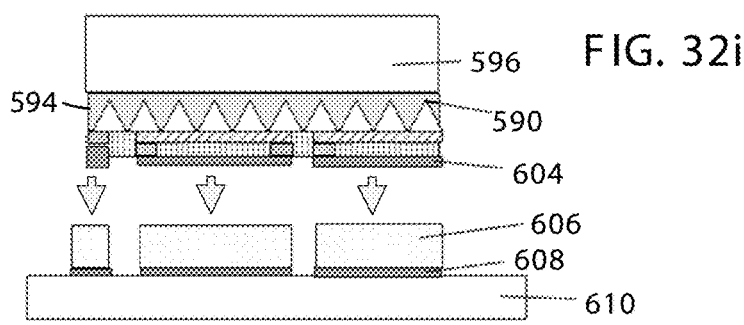
FIG. 32i
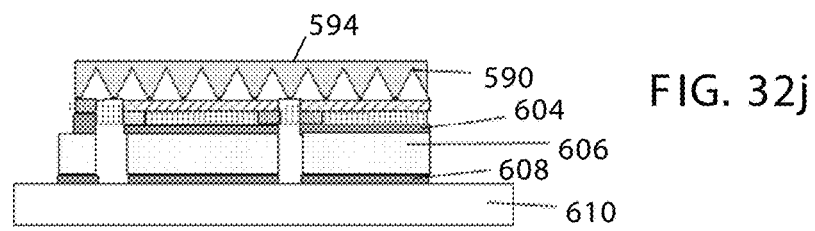
FIG. 32j
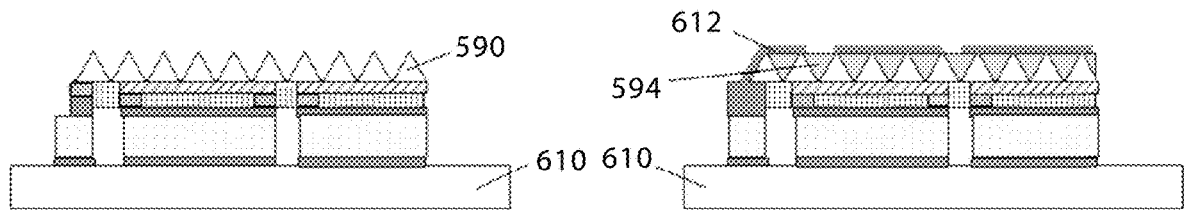
FIG. 32k
FIG. 32l

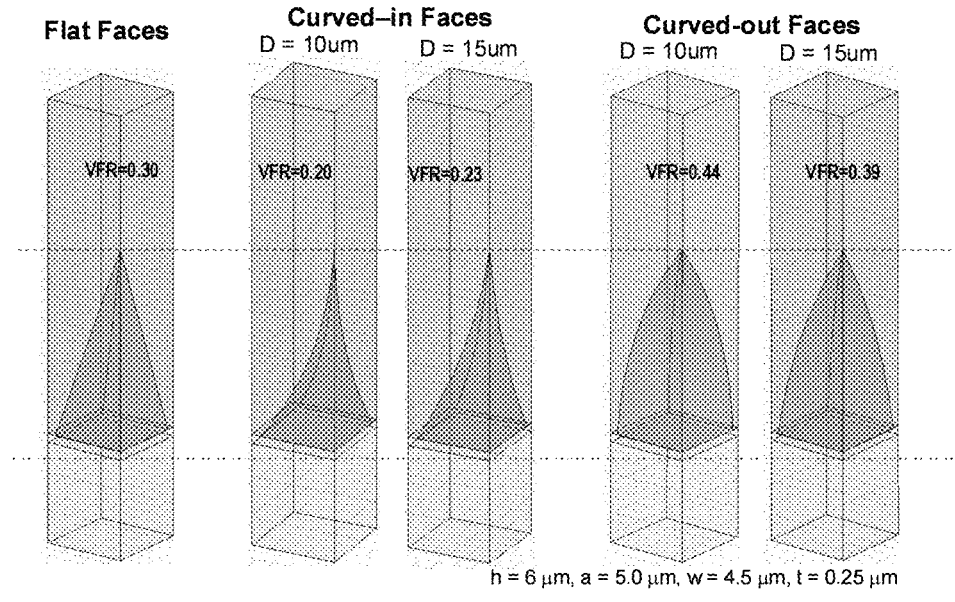
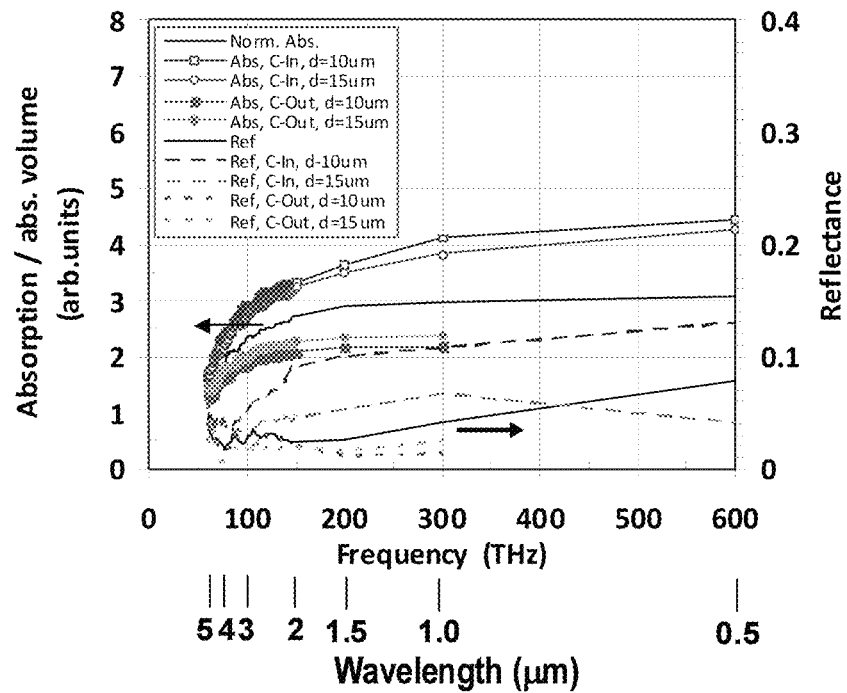
FIG. 40f

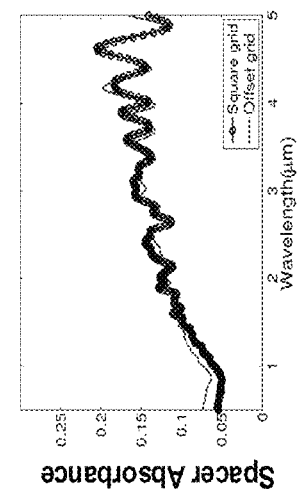
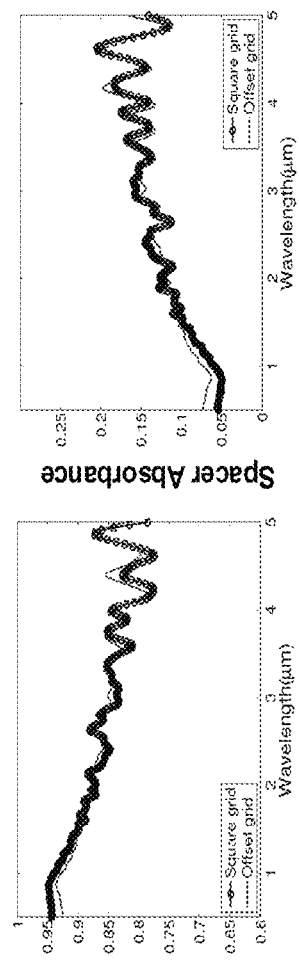
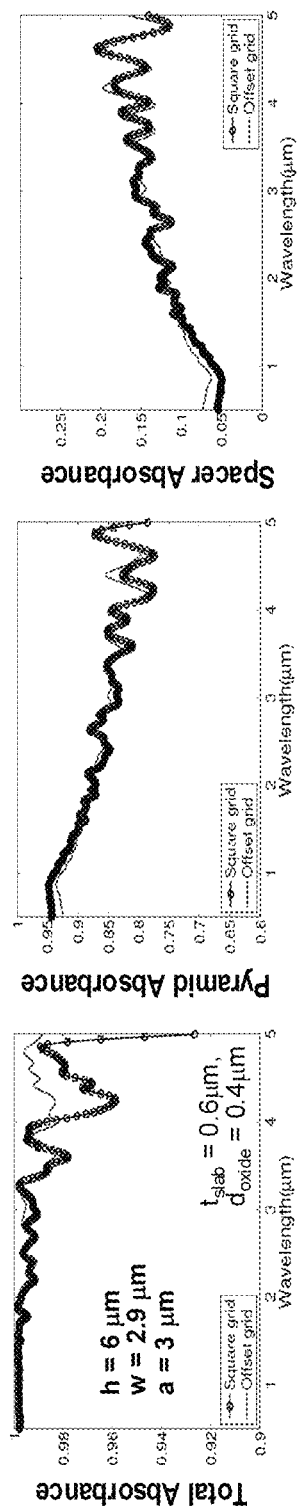
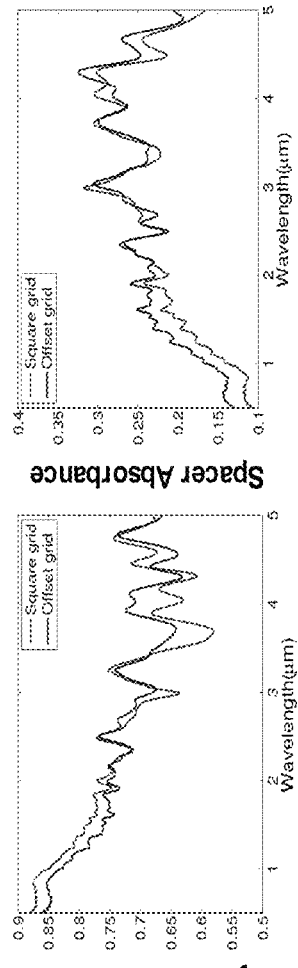
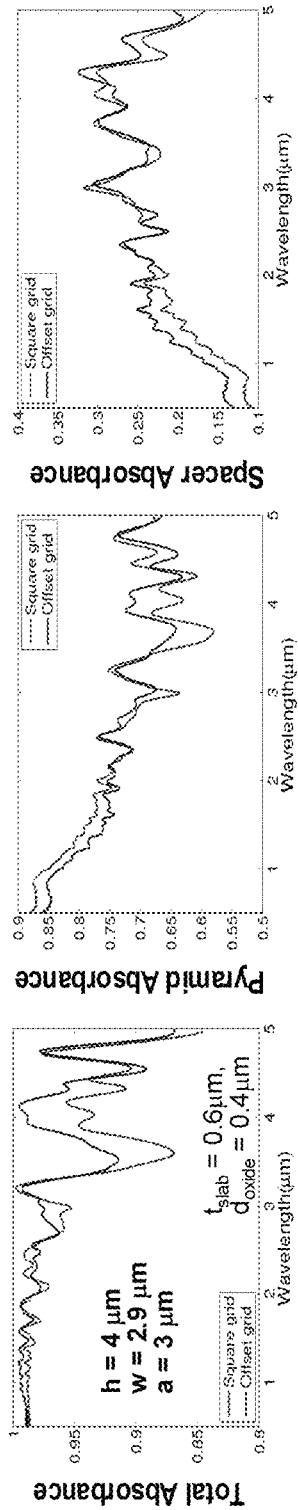
FIG. 41a  FIG. 41b  FIG. 41c
FIG. 42a  FIG. 42b  FIG. 42c

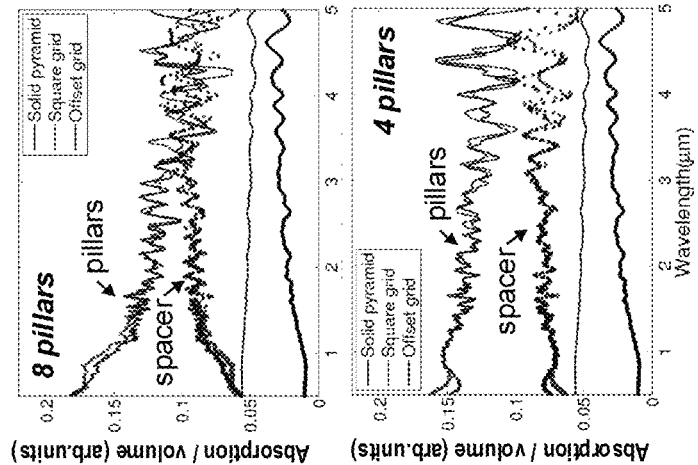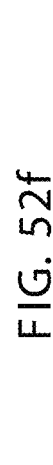
FIG. 52a  FIG. 52b  FIG. 52c
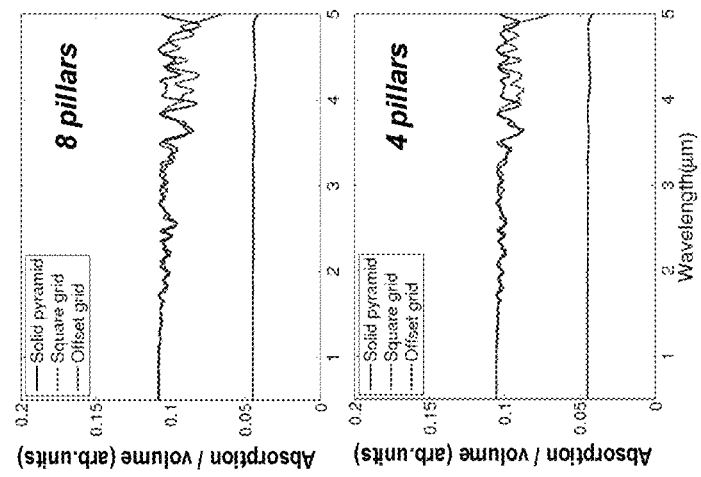
FIG. 52d  FIG. 52e  FIG. 52f

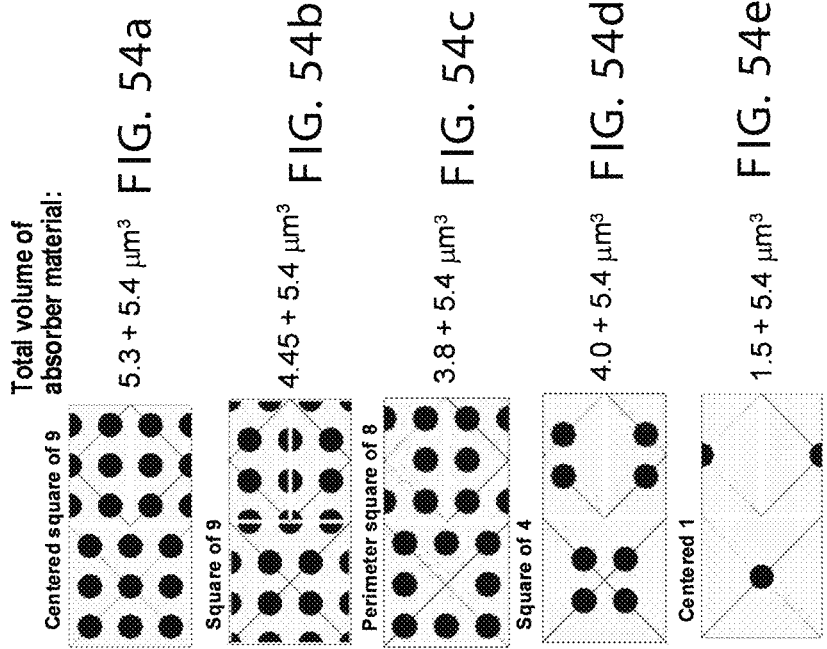
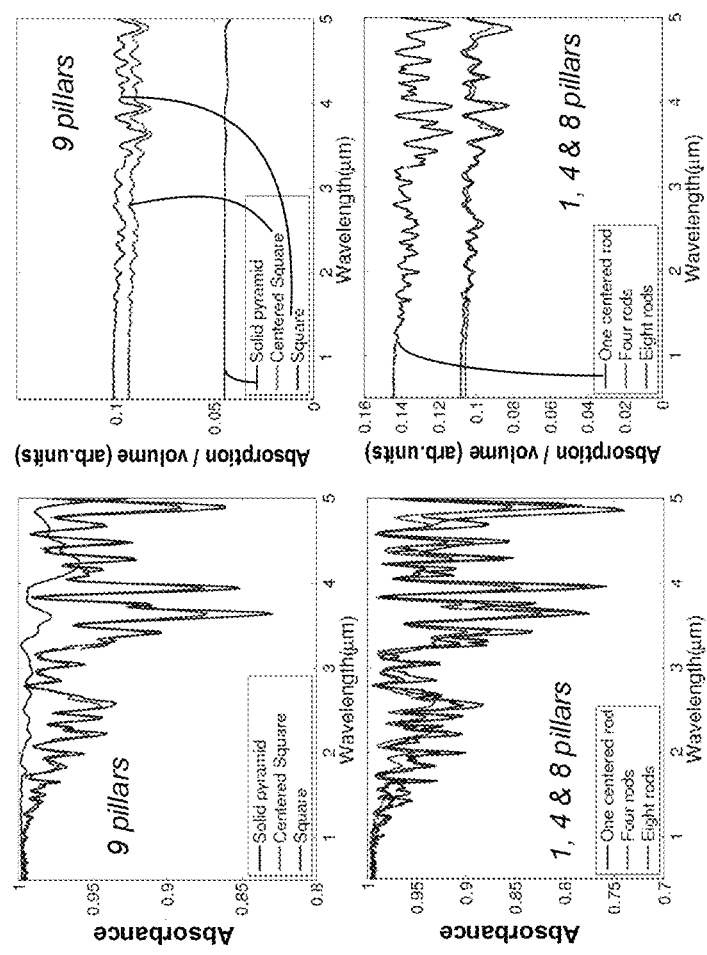

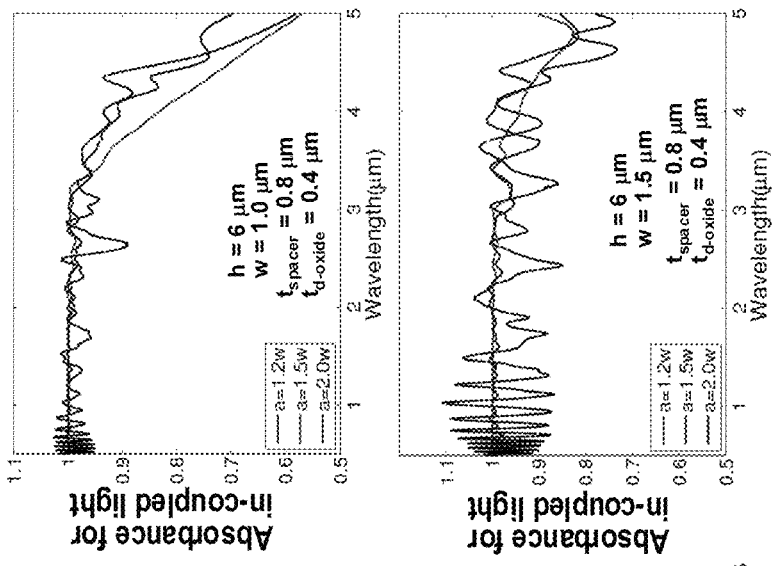
FIG. 57a FIG. 57b FIG. 57c
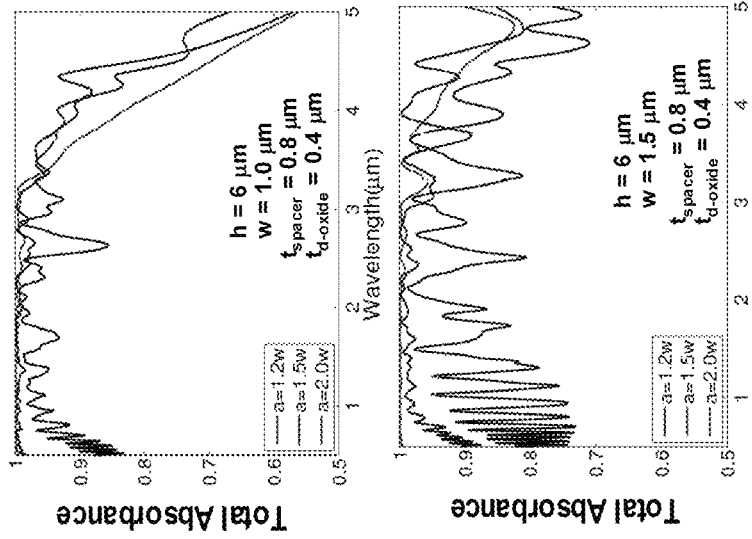
FIG. 57d FIG. 57e FIG. 57f
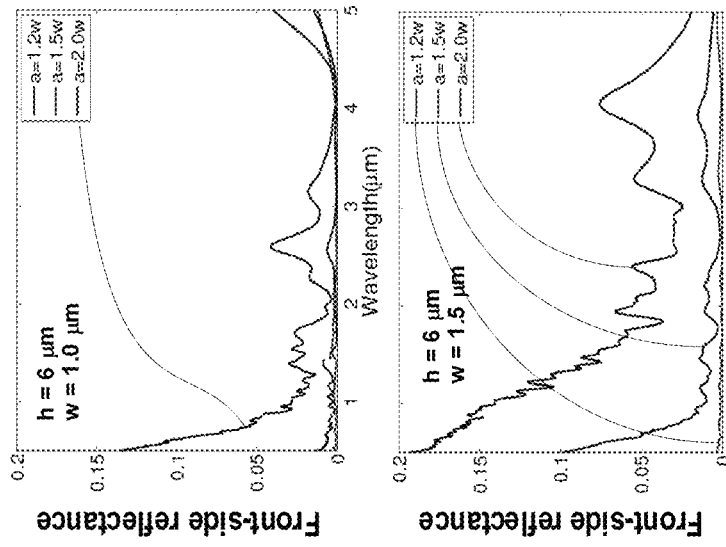

Simulations of structures with single-pass slab, for two different pillar shapes (rectangular and pyramid-shaped)

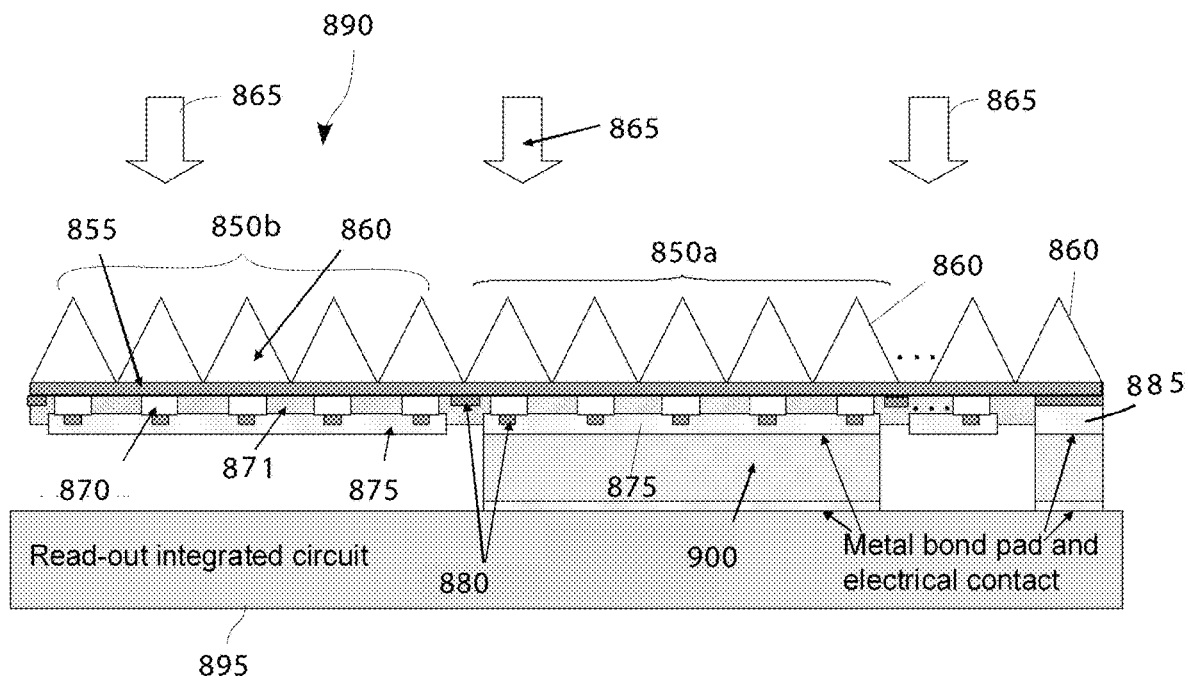
FIG. 60
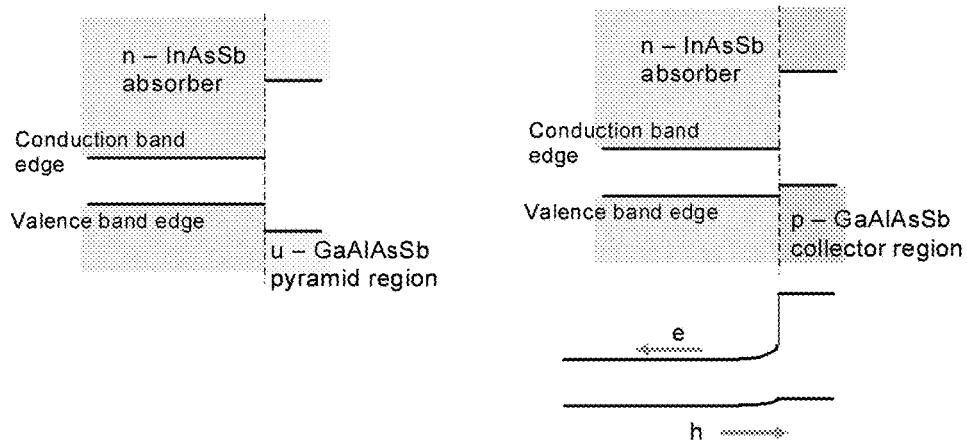
FIG. 61a
FIG. 61b

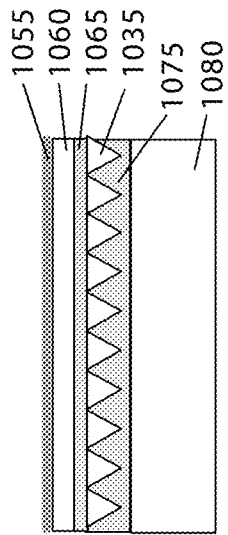
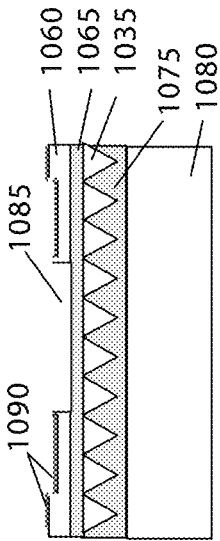
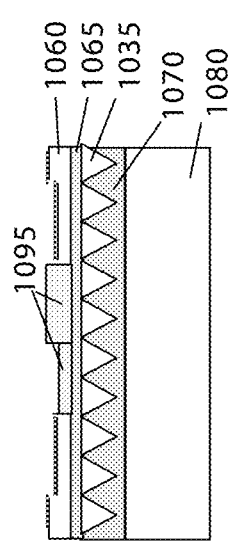
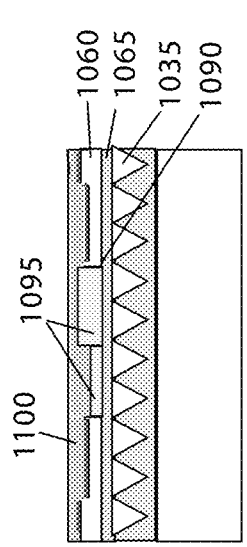
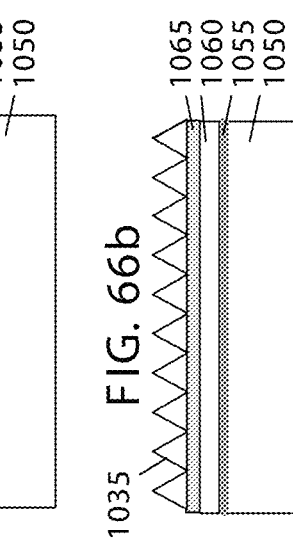
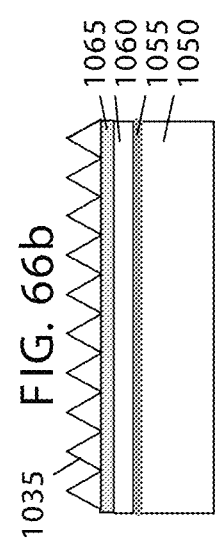

WIDEBAND DETECTOR STRUCTURES

This application is related to co-pending application U.S. application Ser. No. 12/544,221, filed on Aug. 20, 2009, for "Reduced Volume Infrared Detector" by Daniel Yap, Rajesh D. Rajavel, Sarabjit Mehta and James H. Schaffner, the disclosure of which is incorporated herein by reference in its entirety.

FIELD

The present disclosure relates generally to photon detectors.

BACKGROUND AND PRIOR ART

According to prior art, optical quantum detectors (which absorb incident photons and generate electrical charge carriers) generally have highest sensitivity over a fairly small bandwidth, generally one octave or less. Contrary to the present disclosure, prior art detectors, used in optical imagers, generally make use of an optical anti-reflective coating to increase the amount of incident light that is coupled into their light-absorbing material.

Prior art infrared detectors are described in a Technical Information document (SD-12) by Hamamatsu Photonics K. K. Examples of prior photovoltaic and photoconducting detectors that have sensitivity in MWIR and/or LWIR wavelengths are described in an article by A. Rogalski (Journal of Applied Physics, vol. 93, no. 8, 15 Apr. 2003, pp. 4355-4391). In general, these detectors are formed as 2-dimensional arrays of detector pixels that are connected physically and electrically to a silicon read-out integrated circuit (ROIC). Photovoltaic detectors typically contain P-type semiconductor material, N-type semiconductor material and a PN junction. The incident light can be absorbed primarily in the P-type material, primarily in the N-type material or in substantially both P-type and N-type materials.

As depicted in FIGS. 1a-1d, prior infrared detectors 20, 22 and 24 often comprise a substrate 10 on which the array of detector pixels 12 is formed. The incident light 14 illuminates the substrate 10 and passes through the optically transparent substrate 10 to the detector pixels 12, as depicted in FIG. 1a. For these detectors, each detector pixel 12 may be located on the side of the substrate 10 that faces the ROIC 18 and may be connected to the ROIC 18 by means of a solder bump 16, depicted in FIGS. 1b and 1d. With the detectors 20 and 22, the substrate 10 is generally not removed and individual pixels 12 are defined by etching mesa structures that include the PN junction of a detector pixel 12. For detector 24, illustrated in FIG. 1c, which comprise a thick film of the light-absorbing material 30, electrical vias 28 are etched through the absorbing film 30 and a PN junction 32 is formed around each of the vias 28. Metal 34 is then coated over the vias 28 and provide electrical connections between the PN junctions 32 and the ROIC 18. According to prior art, detectors 20, 22 and 24 can be coated with an anti-reflecting film to improve the capture of the light 14. The anti-reflecting film is normally composed of one or more quarter-wave thickness layers of material that have a value for its refractive index that is between the value of the refractive index of the incident medium (such as air) and the refractive index of the substrate 14.

According to prior art, the infrared detectors 20, 22 and 24 can achieve high external quantum efficiency only over a limited optical bandwidth because of their anti-reflective coatings. Because a quarter-wave thickness is achieved exactly for only one specific wavelength of the incident light, the anti-reflective coating is effective for only a small band of wavelengths (nominally less than an octave).

To achieve high internal quantum efficiency, the light-absorbing layer (or layers) of infrared detectors in the prior art must have a thickness that is sufficiently large to permit enough of the incident light, coupled in through its front surface, which typically is the back side of the absorber, to be absorbed. In fact, the thickness of the absorber must be sufficient to absorb light at the longest wavelength of its desired band of operation. For high efficiency, that thickness is typically several times the value of the longest wavelength of the band, even when the detector has a metal reflector at its back side (the side facing away from the incident light) that enables the overall path-length of the light through the absorber to be doubled. Noisy "dark" current can be generated in the volume of the absorber because of thermal generation of electrical carriers. Thus, having a thick absorber means that the total volume of material contributing to the dark current is large, and the dark current is high. This degrades the detectivity of the detectors 20, 22 and 24.

In contrast, a novel infrared detector (imager) presently disclosed, does not require an anti-reflecting film and it provides low reflection for incident light over a large bandwidth of multiple octaves with reduced dark current.

Like optical quantum detectors, solar cells have also been developed to absorb light, however at visible wavelengths. And, solar cells generally do not absorb light at MWIR wavelengths. Solar cells are generally made from material such as silicon. Although both solar cells and infrared imagers have been widely used commercial products for several decades, there does not appear to be any known attempts to combine the features of these two kinds of devices.

Surfaces with shallow pyramid-shaped features and the light trapping benefits of such surfaces are known from the field of solar cells. An article by M. A. Green, et al. ("Very High Efficiency Silicon Solar Cells—Science and Technology", IEEE Transactions on Electron Devices, vol. 46, no. 13, October 1999, pp. 1940-1947) describes solar cells that contain pyramid-shaped surfaces. The light trapping properties of pyramidally textured surfaces is described in an article by P. Campbell and M. A. Green (Journal of Applied Physics, vol. 62, no. 1, 1 Jul. 1987, pp. 243-249). Prior art solar cell 38, depicted in FIG. 2, has pyramids 40 with height that are small compared to the overall thickness of the light-absorbing material 42. This is because for solar cells, the dark current noise is not a problem of concern. In contrast, in the infrared imager presently disclosed, the height of the pyramid is large compared to the overall thickness of the light absorbing material, with that pyramid height being about one half of the overall thickness of the light absorbing material.

Another prior art solar cell 44, depicted in FIG. 3, has triangular-shape features 46 whose height is large compared to the overall thickness of the light absorbing material 48. This solar cell is described in an article by R. Brendel, et al. ("Ultrathin crystalline silicon solar cells on glass substrates," Applied Physics Letters, vol. 70, no. 3, 20 Jan. 1997, pp. 390-392). In the solar cell 44, the PN junctions 50 are located near the sloped faces or sidewalls at the backside of the device. In contrast, for some embodiments of the present invention, the PN junctions may be located near the tips of the pyramid structures at the backside of the device. This allows the infrared imager presently disclosed to achieve reduced area of the junction depletion regions, thereby reducing the dark current from those depletion regions.

Another prior art solar cell with back-side electrical contacts whose PN junction area is small is described in an article by R. M. Swanson, et al. ("Point-contact silicon solar cells," IEEE Transactions on Electron Devices, vol. ED-31, no. 5, May 1984, pp. 661-664). Solar cells having localized PN junctions at their back side as wells as pyramid-shaped texturing of their front side are depicted in FIG. 4a and are described in an article by R. A. Sinton, et al. (27.5 percent silicon concentrator solar cells," IEEE Electron Device Letters, vol. EDL-7 no. 10, October 1986, pp. 567-569). Diffusion of the doped regions to create such PN junctions involves subjecting the material to fairly high temperatures, generally >400 degrees-C, and may be incompatible with the processes involved in fabricating devices that have thin light absorbing material.

An article by Kayes, et al. (J. Appl. Physics, vol. 97, pp. 114302 (2005)) describes another solar cell with regions of light absorbing material comprising high-aspect-ratio nanorods 43 as shown in FIG. 4b. Each nanorod has a radial PN junction. An article by Hu, et al. (Nano Letters, vol. 7, no. 11, p. 3249 (2007) reports simulation results for the reflectance and absorption of a nanorod array structure. The PN junctions in these prior art light absorbers and electrical current generators are very different from the PN junctions of the presently disclosed detectors. These prior art devices have very large PN junction area and thus the relative contribution of the dark current due to generation in the junction depletion regions is very high. In contrast, the presently disclosed detectors have smaller PN junction area and they can benefit from the reduction of the absorber volume.

Articles by L. Hu and G. Chen ("Analysis of optical absorption in silicon nanowire arrays for photovoltaic applications," Nano Letters, vol. 7, no. 11, November 2007, pp. 3249-3252) and by E. Garnett and P. Yang ("Light trapping in silicon nanowire solar cells," Nano Letters, vol. 10 (2010), pp. 1082-1087) describe the absorbance and reflectance properties of arrays of rods that have circular cross-section as shown in FIG. 4c. The diameter of the rods 47 remains approximately constant over the length of the rod 47. For the structure of Hu and Chen (not shown), the diameter of these narrow rods is roughly $1/10^{th}$ the wavelength of the light to be absorbed and the gap between adjacent rods is equal to the rod diameter. The height of the vertically aligned rods ranges from approximately 1× to approximately 4.5× the longest wavelength, $\lambda_{max}$, of the incident light. With the narrow rods, the absorption of the shorter-wavelength light is effective but the absorption of the longer-wavelength incident light is quite poor. For the structure of Garnett and Yang (shown in FIG. 4c), the diameter of the narrow rods 47 is approximately equal to the shortest wavelength, $\lambda_{min}$, of the incident light and the gap between adjacent rods 47 is comparable to the rod diameter. Improved absorption of even the longer wavelength light, whose wavelength is as much as 3× the rod diameter, was reported. This improvement was achieved for rods 47 whose height is $2\lambda_{max}$ to $5\lambda_{max}$. The structure of Garnett and Yang also includes a laterally continuous layer of light-absorbing material 35 underneath the light-absorbing rods such that the overall thickness of the structure is approximately $7\lambda_{max}$. However, for structures that absorb light of even longer wavelengths, such as MWIR or LWIR wavelengths, it is desirable to reduce the overall thickness of the structures such that the overall thickness can be less than 2× and preferably roughly equals the longest wavelength of the incident light to be absorbed or detected.

An article by A. K. Sood, et al., (Next generation nanostructures based EO/IR focal plane arrays for unattended ground sensor applications," Proceedings of SPIE Vol. 7693 (2010), p. 76930C) describes optical detectors that contain arrays of narrow pillars of circular cross-section whose diameter remains approximately the same over the length of the pillars. Like the articles discussed above on the solar cells, the length of those pillars is either many time greater than the longest wavelength of the incident light to be absorbed or the diameter of the pillars is much smaller than even the shortest wavelength of the incident light to be absorbed.

An article by S. E. Han and G. Chen ("Toward the Lambertian limit of light trapping in thin nano-structured silicon solar cells," Nano Letters, vol. 10 (2010), pp. 4692-4696) describes a solar cell (not shown) that comprises an array of narrow rods that have pointed tips instead of flat tops. The width of the rods is slightly larger than the shortest wavelength of the incident light and is approximately equal to ½ the wavelength of the longest-wavelength $\lambda_{max}$ incident light. The height of the pointed tip is comparable to $\lambda_{max}$. The overall length of the tall rods is approximately $7.5\lambda_{max}$. The spacing between adjacent rods is approximately equal to the width of the rods. These pointed rods are placed, with their tips pointing toward the incident light, above an oxide layer that is above a metal back-side reflector.

An article by A. K. Dutta, et al., ("High efficiency solar cells based on micro-nano scale structures," Proceedings of SPIE Vol. 7683 (2010), p. 76830O) describes enhanced absorption of the longer-wavelength light that is achieved by having an array of circular light-absorbing pillars above a light-absorbing substrate. However, this article also indicates that the absorbance spectrum contains many large peaks and dips at those longer wavelengths, so the average absorbance in the wavelength range of those peaks and dips is less than 0.8 even though the overall thickness of the InP direct-bandgap light-absorbing material is 50 μm. This article also describes an absorber comprising an array of trapezoid-shaped cylindrical light absorbing structures 49 (as shown FIG. 4d) that are above a laterally continuous light-absorbing layer 51. The height of the trapezoids 49 is 5 μm, (i.e., approximately $5\lambda_{max}$ with $\lambda_{max}$=1.0 μm). The diameter of the tip of the trapezoid 49 is 0.5 μm, slightly greater than the shortest wavelength $\lambda_{min}$ of the incident light considered. High solar-irradiance conversion efficiency was obtained for an array of cylindrical trapezoids whose base width is 1 μm and whose height is 5 μm, such that the base-width to height ratio is 0.2. The best conversion efficiency was achieved when the bases of adjacent trapezoids 49 touch and there is no gap between those adjacent trapezoids 49.

An article by R. Esteban, M Laroche and J. J. Greffet ("Dielectric gratings for wide-angle, broadband absorption by thin film photovoltaic cells," Applied Physics Letters, Vol. 97, p. 221111 (2010)) describes a solar cell that has saw-tooth shaped non-absorbing structures 53 abutting one side of a thin light-absorbing layer 55 that has a metal reflector 57 on its other side (as shown in FIG. 4e). The saw-tooth structure 53 is asymmetric in that the angle of the sidewall on one side of the saw tooth is different from the angle of the sidewall on the other side of the saw tooth. The saw-tooth grating shown in FIG. 4e is a 2-dimensional structure whereas the pyramidal arrays of the present disclosure are 3-dimensional structures. For the variations described in the Esteban article, the height of the saw tooth structure 53 ranges between one-eighteenth and one-half the maximum wavelength of the incident light (i.e., between $\lambda_{max}/18$ and $\lambda_{max}/2$). The width of the base of the saw tooth structure 53 considered in the Esteban article is slightly larger than one half the maximum wavelength of the incident light (i.e., $5\lambda_{max}/9$). The thickness of the light-absorbing layer 55 in Esteban's structure is $\lambda_{max}/10n_A$, where $n_A$ is the refractive index of the material comprising the light-absorbing layer 55. Esteban describes only a structure with a GaSb light-absorbing layer 55 and a SiC saw-tooth grating structures 53. The real part of the refractive index of GaSb (i.e., $n_A$) in the wavelength range they consider is between 4.0 and 5.0. The refractive index of SiC in that same wavelength range is between 2.6 and 2.7. In contrast to the structure of Esteban, the presently disclosed detector may comprise pyramids that are much taller, has a light-absorbing layer that is much thicker, and also may have the constraint that the real part of the refractive index are approximately the same for both the pyramids and the light-absorbing layer. Further, according to Esteban, their periodic structure 53 is beneficial "both as an antireflection mechanism and as a path to excite resonant modes". Esteban further states that "the excitation of the modes results in enhanced localized fields in the structure and therefore in an enhanced absorption in the film." However, those resonant modes of a detector result in an absorbance spectrum that has peaks and dips. Such peaks and dips are noticeable in the absorption spectra shown in the Esteban article. In contrast to Esteban, the presently disclosed detector is may reduce or eliminate these peaks and dips in its absorption spectrum.

The article by S. E. Han and G. Chen ("Toward the Lambertian limit of light trapping in thin nano-structured silicon solar cells," Nano Letters, vol. 10 (2010), pp. 4692-4696) also describes a light-absorbing structure that has an array of tilted or skewed pyramids 59, which absorb the light, located above a thick layer of light-absorbing material 61 (as shown in FIG. 4f). The article reports that the tilted pyramids 59 provide better absorbance than a structure that has non-tilted pyramids 59. The height of the pyramids 59 is 0.64 μm and the base width is 0.9 μm, so the width-to-height ratio is 1.4. The underlying light-absorbing layer 61 has a thickness of 2 μm, which is approximately 2× the longest wavelength light to be absorbed. But for this structure, the absorbance of the longer-wavelength light (>0.8 μm) is poor.

For both the light absorbing structure of Esteban, et al., whose smallest saw-tooth structure 53 width-to-height ratio is approximately 1.0 and the light-absorbing structure of Han and Chen, whose pyramid 59 width-to-height ratio is 1.4, the shape of those pyramids or saw-tooth structures results in degraded absorption of the longer-wavelength incident light. Also, the height of the pyramids 59 or saw-tooth structures 53 is much less than $\lambda_{max}$, which further degrades the absorbance of the longer-wavelength light.

A novel infrared detector (imager) with low reflection for incident light over a large bandwidth of multiple octaves and with reduced dark current is presently disclosed.

BRIEF DESCRIPTION OF THE FIGURES

FIG. 5b depicts pyramidal absorber that lines the walls of the anechoic chamber of FIG. 5a.

FIGS. 9a-9l depict a fabrication process for manufacturing optical imager shown in FIG. 6.

FIG. 14b depicts a single pyramid unit cell that was used to perform calculation for FIG. 14a.

FIGS. 27a-27f depicts fabrication process involving etched pillars according to the present disclosure.

FIGS. 28a-28g depicts fabrication process involving selective area growth of pillars according to the present disclosure.

FIG. 29b depicts calculations for absorption vs. wavelength for the detector in FIG. 29a.

FIGS. 32a-32l depict a fabrication process for manufacturing optical imager.

FIGS. 40a-e depict illustrations of simulation model of pyramidal absorbers that have curved sidewalls according to the present disclosure.

FIG. 40f depicts calculated front-side reflectance and single-pass absorption per unit absorber volume of pyramidal absorbers with curved sidewalls according to the present disclosure.

FIGS. 41a-c depict calculated absorbance for structures with pyramids of 6 μm height according to the present disclosure.

FIGS. 42a-c depict calculated absorbance for structures with pyramids of 4 μm height according to the present disclosure.

FIGS. 52a-c depict absorbance and absorption per volume of absorber material calculated for structures that have 8 pillars within a pyramid according to the present disclosure.

FIGS. 52d-f depict absorbance and absorption per volume of absorber material calculated for structures that have 4 pillars within a pyramid according to the present disclosure.

FIGS. 53a-b depict absorbance and absorbance per unit absorber volume calculated for structure that has the equivalent of 9 pillars in each pyramid according to the present disclosure.

FIGS. 53c-d depict absorbance and absorbance per unit absorber volume calculated for structures that have the equivalent of 1, 4 and 8 pillars in each pyramid according to the present disclosure.

FIGS. 54a-e depict top view of an exemplary embodiment according to the present disclosure.

FIGS. 57a-f depict simulation results for exemplary structures according to the present disclosure.

FIG. 60 depicts an exemplary embodiment of a detector according to the present disclosure.

FIGS. 61a-b depict energy-band diagrams for the absorber material, the material of the pyramids and the collector material and the band alignments at the interfaces between those materials according to the present disclosure.

FIGS. 66a-g depict an exemplary fabrication process according to the present disclosure.

Figure 1:
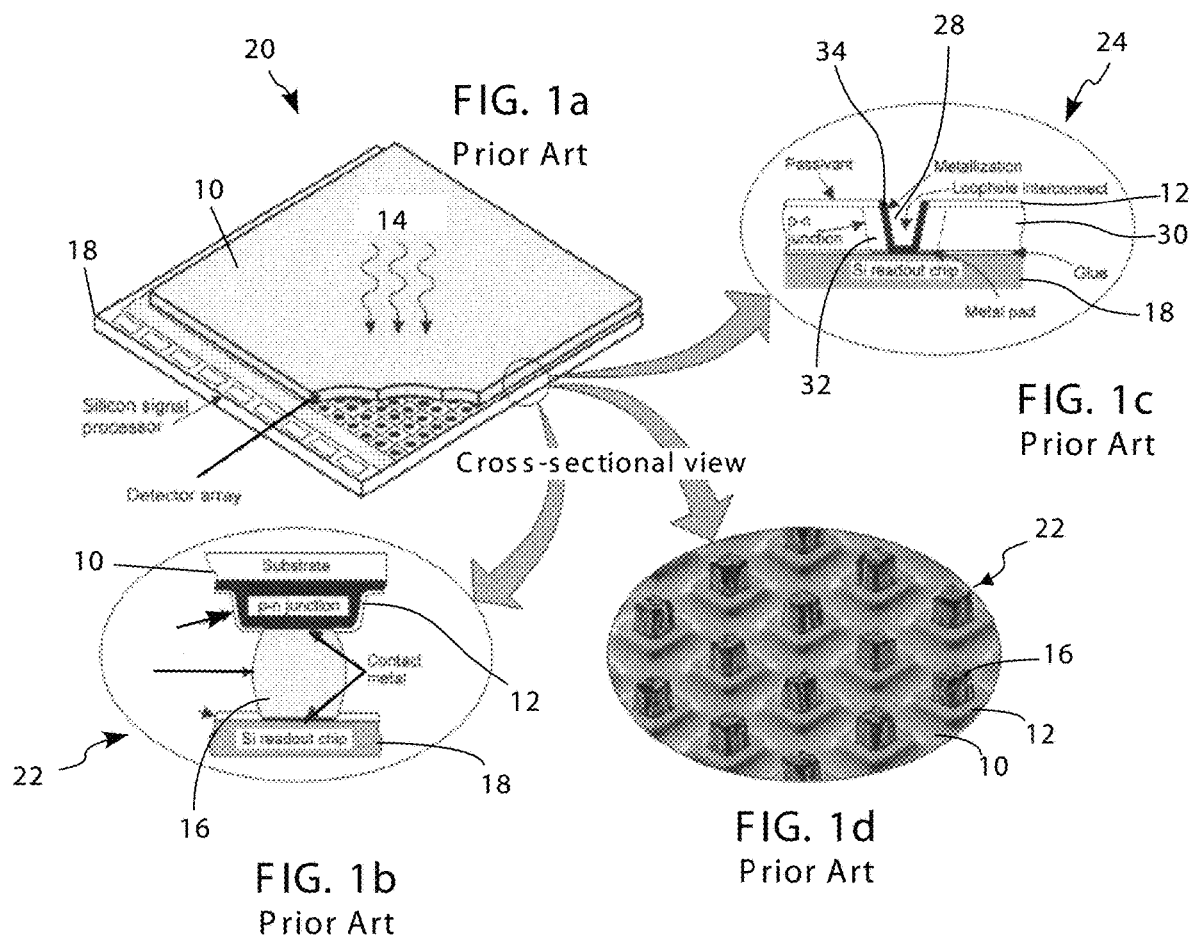
FIGS. 1a-1d depict Prior-Art optical imagers.
Figure 2:
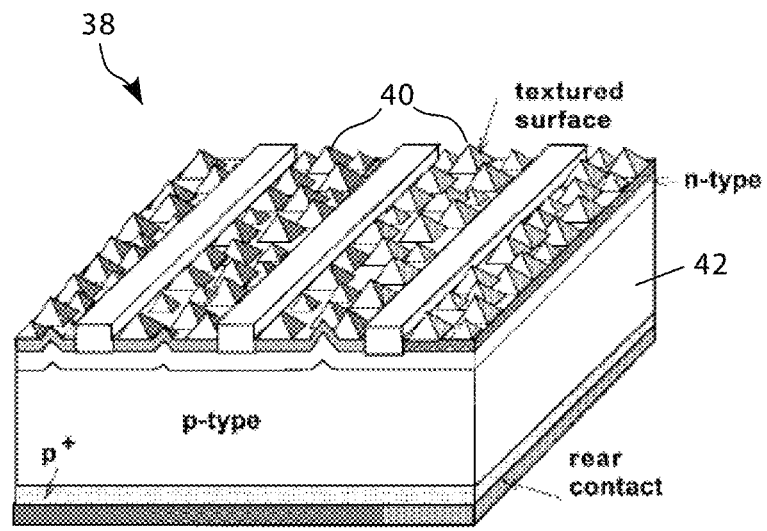
FIG. 2 depicts Prior-Art solar cell with pyramidally textured surface.
Figure 3:
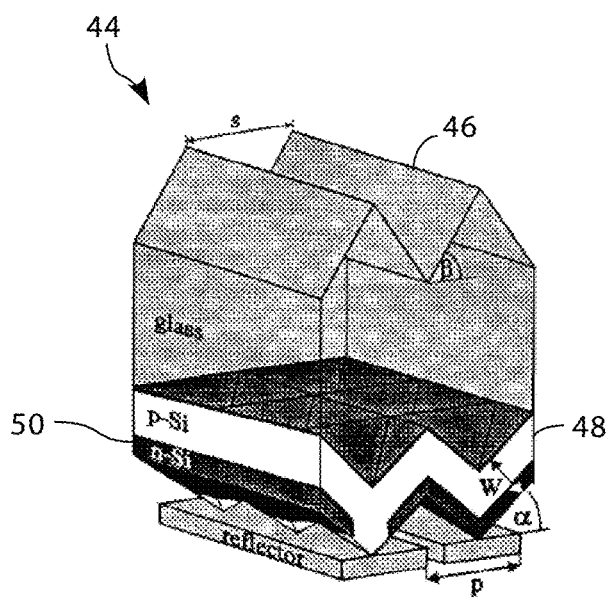
FIG. 3 depicts Prior-Art solar cell with sloped sidewalls.
Figure 4A:
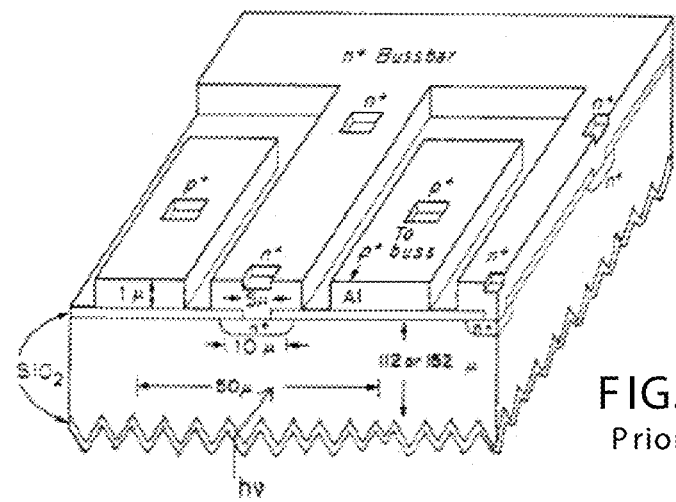
FIG. 4a depicts Prior-Art solar cell with back side contacts.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

Exemplary Detector with Absorbing Pyramids and an Absorbing Slab

The present disclosure relates to photon detectors that may be used in a focal-plane-array optical imager. The constraints for photon detectors are quite different from the constraints associated with most solar cells described above. The photon detector performance is given in terms of its signal to noise ratio. Although the detected signal is to be maximized, the noise (from thermal generation of electrical carriers rather than from carrier generation accompanying the photon absorption) must be kept low. In contrast, a solar cell is concerned with carrier generation but not with noise. Furthermore, the photon detector usually has an absorber material with a direct energy-band gap. Thus, the absorption efficiency is high. Usually the thickness of the absorber is no more than 2 times the longest wavelength of the light to be absorbed, especially when there is a back-side reflector for two-pass absorption. In contrast, most solar cells have an absorber material such as silicon with poor absorption efficiency. Thus, the thickness of a solar cell typically is many times larger (e.g., 10× to 50×) than the wavelength of the light to be absorbed.

The novel infrared detector (imager) presently disclosed contains novel quantum detectors having very broad bandwidth, for example, such as having sensitive detection ranging from visible to midwave infrared (MWIR) wavelengths (e.g., 0.4-4.0 μm). The imager may contain an array of multiple detectors, arranged as a collection of pixels, that are electrically coupled to a read-out integrated circuit. Also, the pixel array may lie on a focal plane of imaging optical elements, such as lenses. Each detector pixel comprises a pyramidal structure containing material that absorbs light of the desired broad wavelength range. The pyramidal structure may comprise a set of closely spaced pyramid shapes, with a pointed end of the pyramids facing the incident light. The pyramid shaped features have reduced reflection of the incident light over the broad bandwidth. The pyramid shaped absorbers also trap the light, for increased absorption efficiency. Although a 2-dimensional arrangement of pyramids having square or rectangular bases are preferred, arrangements of other pyramidal shapes such as ones having triangular, circular or hexagonal bases also may be used. Each detector preferably comprises a p-type region and an n-type region, with either one or both of these doped regions being capable of absorbing the incident light. Each detector pixel also includes at least one electrical contact, preferably ohmic, that is electrically connected to the p-type or the n-type region. This electrical contact permits photo-generated electrical carriers to be extracted from each pixel of the imager.

In one embodiment according to the present disclosure, the bases of the pyramids may have a metal backside electrical contact. The metal backside contact may then be bonded to an electrical contact pad of the read-out integrated circuit. In another embodiment according to the present disclosure, the metal surface of the backside contact may also serve to reflect light back into the absorbing material of the pyramids, further enhancing the absorption. In another embodiment, the bases of the pyramids merge together into an additional region of electrical-carrier transporting material. In this embodiment. a second electrical contact may be made to this electrical-carrier transporting material, to form the "common" contact for the imager. In one embodiment according to the present disclosure, the pointed ends of the pyramids are electrically connected to and contact a grid of electrically conducting material. This grid allows light to penetrate through the spaces between the conductors, so that the light can be absorbed by the pyramid regions underneath. In another embodiment, there may be two sets of pyramids. A first set may have a pointed end facing the incident light and a second set may have a pointed end directed away from the incident light. The bases of the first set and the bases of the second set abut each other. The sidewalls of the second set of pyramids may be coated with metal to further reflect the light back into the pyramidal absorbers.

The purpose of the imager presently disclosed is to achieve high-sensitivity detection of the incident light over a much broader band of optical wavelengths than is obtained with previously known optical imagers. The disclosed optical detectors are designed to have high sensitivity over several octaves of optical bandwidth, with that detection bandwidth possibly being greater than one decade. The high sensitivity may be achieved by reducing the reflection of the incident light by the detector for all of those wavelengths of the incident light. Also, the high sensitivity may be achieved by efficiently capturing and absorbing the incident light (photons) to produce electrical carriers (electrons and holes), with the amount of output electrical current extracted from the detector being related to the amount of light incident upon the detector pixel. And, the high sensitivity may be achieved by minimizing the dark current, by reducing the volume of light-absorbing material, which introduces noise from its thermal (dark) generation of electrical carriers.

Figure 5A:
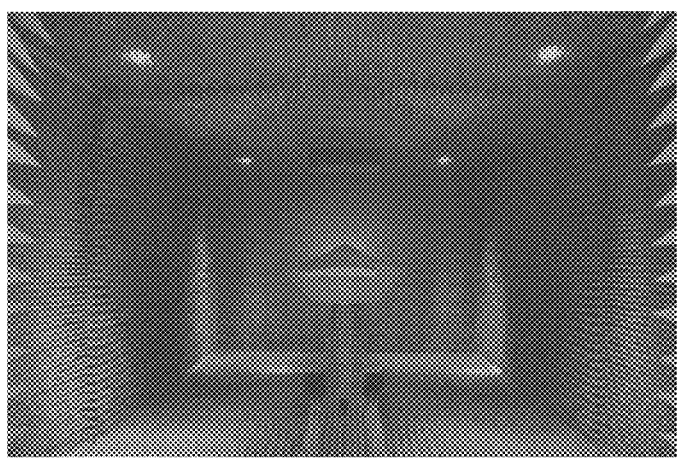
FIG. 5a depicts microwave anechoic chamber as know in the art.
Figure 5B:
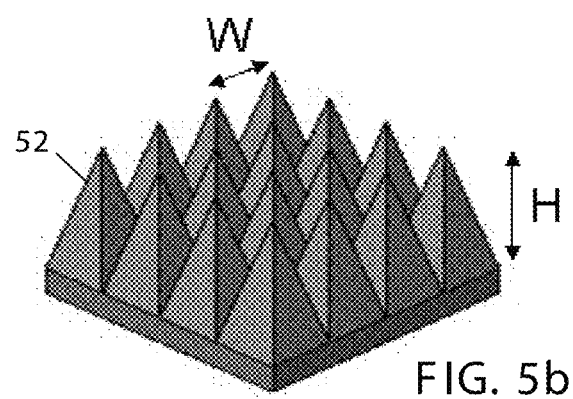

The presently disclosed optical detectors and optical imagers may comprise pyramid-shaped optical absorbers. Pyramid-shaped structures comprising material that absorb electromagnetic radiation are commonly used in anechoic chambers for radio-frequency, microwave and millimeter wave radiation. An example of such an anechoic chamber is shown in FIG. 5a. The walls of the anechoic chamber are covered with pyramidal absorbers 52 as shown in FIG. 5b. The pyramidal absorbers 52 prevent any of the incident radiation from being reflected by the walls back into the chamber. The pyramidal absorbers 52 can function effectively over a very broad range of wavelengths or frequencies of the incident radiation. In general, the width W of the base of the pyramids 52 should be at least one half of the wavelength of the lowest frequency of interest (longest wavelength of interest). Also, the height H of the pyramids 52 should be approximately equal to or greater than the wavelength of the lowest frequency of interest. The width of the tip of the pyramids should be smaller than the wavelength of the highest frequency of interest, preferably smaller than one-half of the shortest wavelength of interest. Pyramidal absorbers 52 are effective for all polarizations of the incident radiation.

Pyramidal absorbers have not been used for optical chambers that require negligible reflection from the walls of the chamber. For optical radiation, other means such a black absorbers comprising roughened surfaces of light absorbing material such as carbon, or even gold, are used effectively to prevent reflection. The carbon black films contain many fibers or spikes of the carbon. The gold black films typically contain many small spikes or balls of the gold. Unlike the absorbers of the anechoic chambers, the detectors presently disclosed also must efficiently generate electrical signal from the absorbed light. Thus, the absorbing material in a given detector pixel must be electrically contiguous, so that electrical current can be extracted with minimal loss. Also, to increase the detection sensitivity, it is desirable to reduce the overall volume of the absorber material without compromising the detection efficiency. According to the present disclosure, reduction of the absorber's volume may be achieved by using a light absorbing structure that comprises many pyramid-shaped absorbers that are electrically contiguous. A structure comprising a collection of pyramids whose tips all point in the same direction and whose bases touch each other has one-third the volume compared to a film having the same height as those pyramids.

Figure 6:
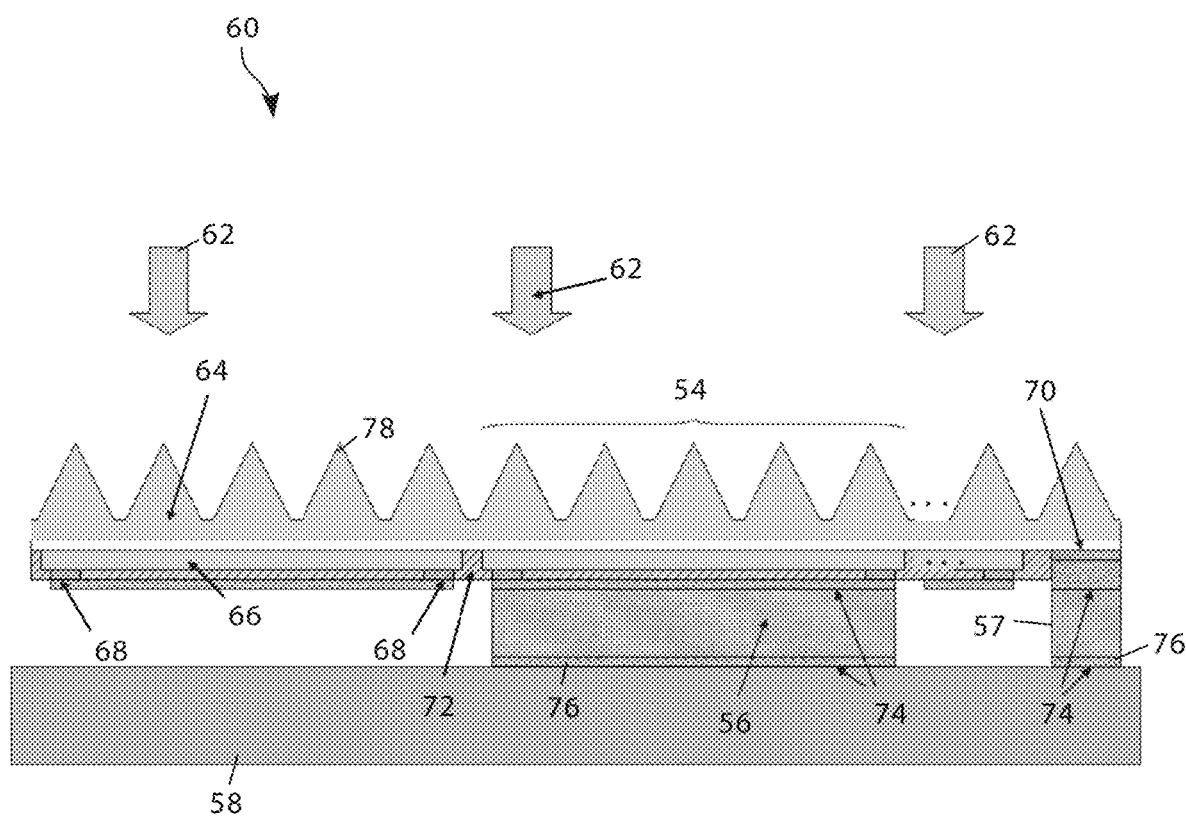
FIG. 6 depicts an exemplary embodiment of an optical imager according to the present disclosure.

FIG. 6 depicts one exemplary embodiment of a novel detector array 60 according to the present disclosure. The detector array 60 may comprise many detector pixels 54 that are bump bonded to a read-out integrated circuit (ROIC) 58. One or more detector pixel 54 may be electrically connected to the ROIC 58 by means of a solder bump 56. (For the sake of simplicity and enhanced clarity, only some of the solder bumps 56 are shown in the FIG. 6). Besides the solder bumps 56 connecting to the individual detector pixels 54, additional solder bumps 57 may provide electrical connection for the common contact of the imager. In one exemplary embodiment, electrical connections are made to the back side of the detector, which is the side facing away from the incident light 62.

As shown in FIG. 6, the detector array 60 comprises an absorber 64 that couples the incident light 62 into the volume of the absorber 64 and that generates electrons and holes from the absorbed photons of light. The absorber 64 may be either n-type semiconductor material or p-type semiconductor material whose energy band gap is sufficiently small to absorb the incident light 62 and generate the electron/hole pairs as a result of an interband process. Each detector of the array also contains at least one extractor 66. The extractor 66 may serve to extract the photo-generated minority carrier and couple that carrier to an ohmic contact 68. Another contact 70 may be coupled to the absorber 64.

In one exemplary embodiment, if the absorber 64 is n-type, the photo-generated electrons are the majority carriers in the absorber 64 and are extracted through the contact 70 coupled to the absorber 64. The photo-generated holes are the minority carriers in the absorber 64 and are coupled into the extractor 66 and then extracted through the contacts 68 coupled to the extractor 66. The extractor 66 may be either p-type or n-type. When both the absorber 64 and the extractor 66 are composed of the same semiconductor material, the extractor 66 may be p-type if the absorber 64 is n-type.

The detector array 60 may also contain dielectric passivation material 72 that surrounds the edges of the PN junction and that also covers much of the back side of the extractor 66. The back side of the extractor 66 may further be covered by a metal layer 74 that acts as an optical reflector for the incident light 62. This metal layer 74 may further serve as an electrical bonding pad for the detector pixel 54. Each detector pixel 54 may be connected to the read-out integrated circuit 58 of the imager 60 by means of this metal bonding pad 74, a solder bump 56 and another bonding pad 76. The bonding pads 74 and 76 may comprise several layers of metal (not shown). In one exemplary embodiment, bonding pads 74 and 76 comprise an electrically conductive layer composed of gold, a diffusion barrier to the solder composed of nickel, and a thin layer of non-oxidizing material also composed of gold.

Figure 7:
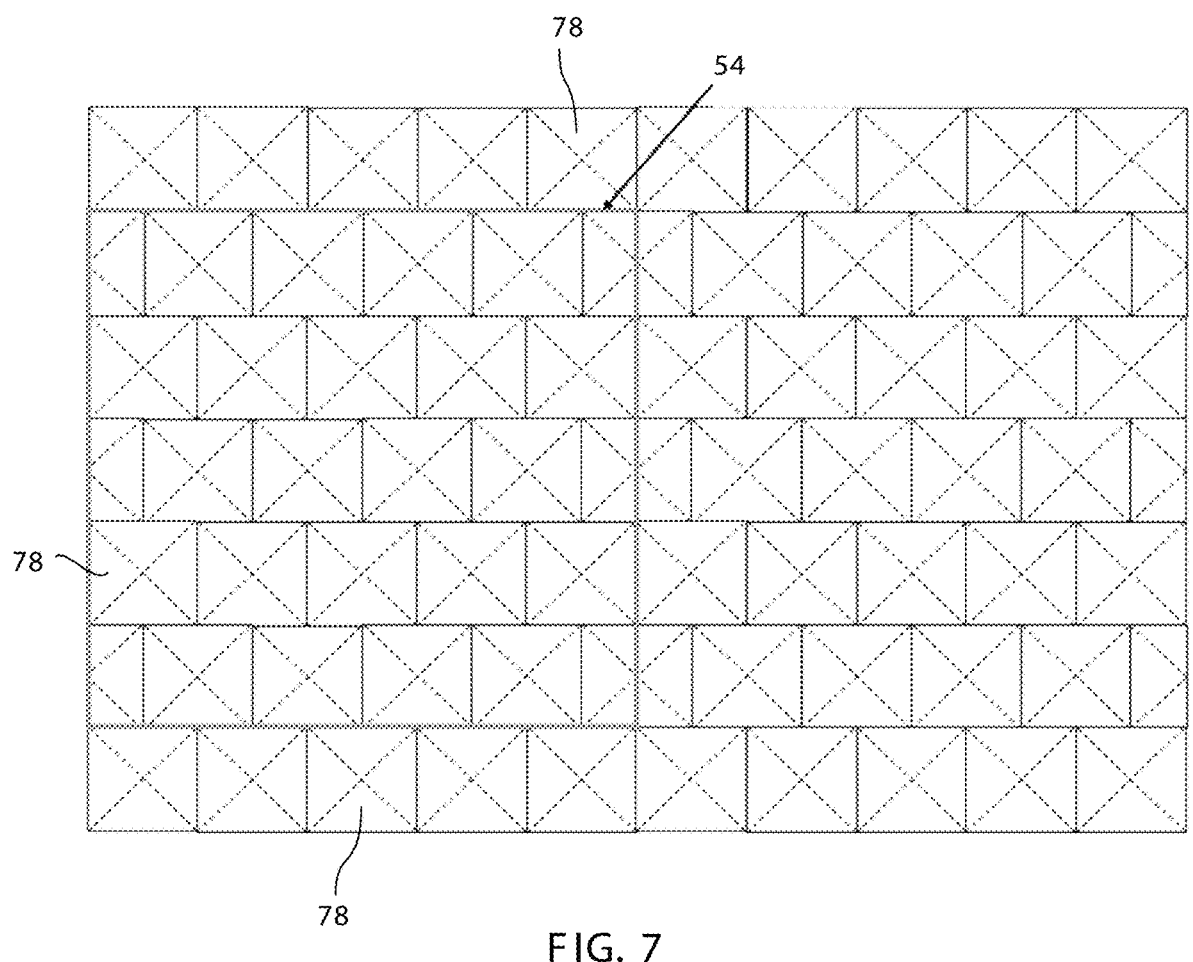
FIG. 7 depicts a top view of a pyramid pattern formed in an absorber shown in FIG. 6.
Figure 8:
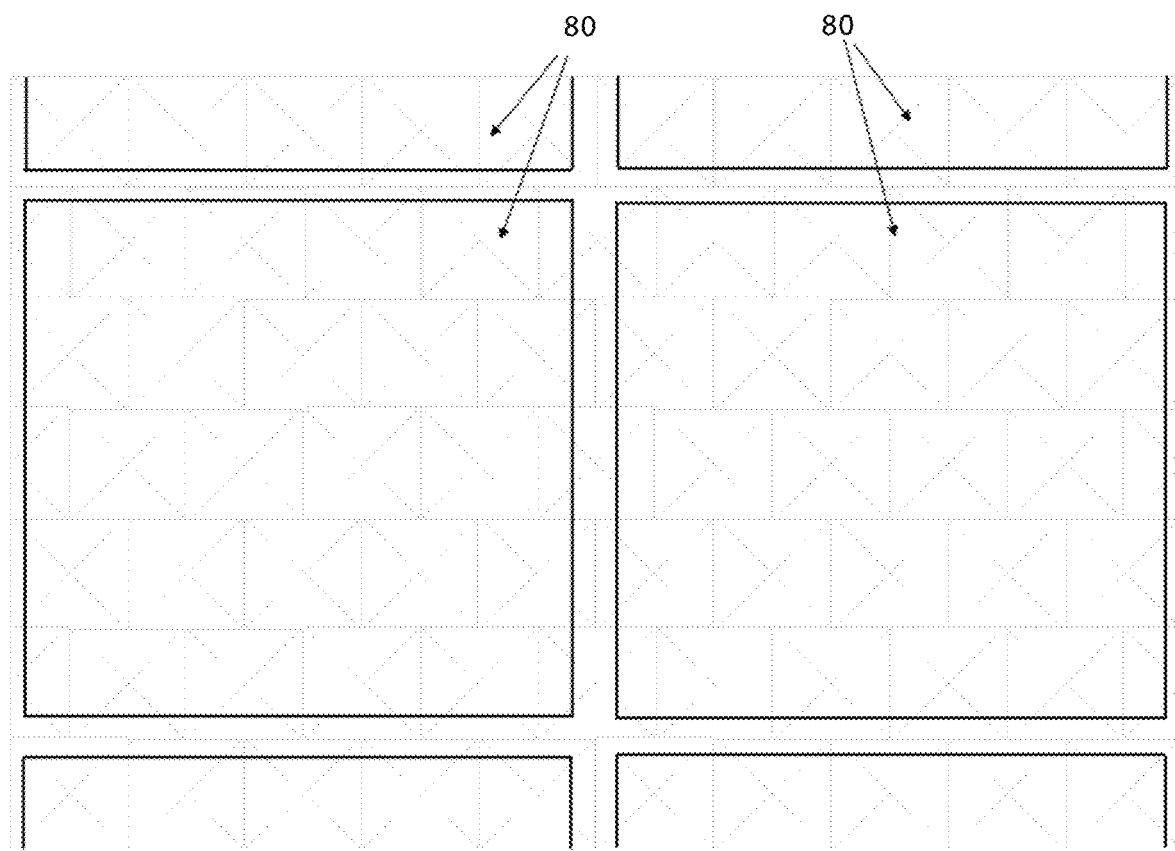
FIG. 8 depicts a bottom view of a pyramid pattern formed in an absorber shown in FIG. 6.

In one exemplary embodiment, the surface of the absorber 64 is shaped to have a set of pyramids 78, as illustrated in FIGS. 6 and 7. In an exemplary embodiment, there are multiple number of pyramids 78 within the area defined for each detector pixel 54 of the imager 60. The area of a detector pixel 54 is defined optically and electrically by the photo-generated minority carriers (e.g., holes) that diffuse through the absorber 64 and to the extractor 66 of that pixel. However, as viewed from the top side in FIG. 7, the pyramids 78 for one detector pixel 54 and the pyramids 78 for adjacent detector pixels 54 may abut together in a continuous manner such that there is no definite physical delineation between adjacent pixels. FIG. 7 illustrates pyramids 78 that have square shaped bases. These pyramids are placed in an offset configuration, with the apex of the pyramids 78 in one row being offset from the apex of the pyramids 78 in an adjacent row. Such a configuration may enhance the capture of incident light 62 into the absorber 64. However, other configurations, including ones with non-offset alignments, also may be used. Furthermore, other shapes of pyramids 78, such as ones having rectangular bases, triangular bases, circular bases and hexagonal bases, also may be used. The set of pyramids act to reduce the reflection of the incident light 62, as discussed above regarding the pyramidal absorbers 64. From the back side, the detector array looks like an array of bond pads 80, with a bond pad for each pixel, as shown in FIG. 8. The bond pads 80 may be separated by regions of dielectric 72. These dielectric regions 72 may also define the extent of the flow of the solder bumps, so that adjacent pixels are not electrically short-circuited together.

As mentioned above, the detector array 60 may also contain at least one contact 70 that is connected to the absorber 64. The contact 70 serves to extract the photo-generated majority carriers. The contact 70 may also serve as a common contact for the entire array of detector pixels (or for a subset of those detector pixels). Additional solder bumps and metal bond pads connect this contact 70 to the read-out integrated circuit 58.

FIGS. 9a-9l depict an exemplary fabrication process for fabricating the detector array and attaching that detector array to the read-out integrated circuit as described above. The following fabrication process is suitable for all of the embodiments disclosed herein of the detector array.

Figure 9A:
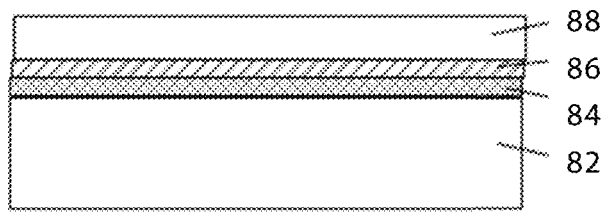

Referring to FIG. 9a, using epitaxial growth technique such as molecular beam epitaxy or metal-organic chemical vapor deposition, an optional stop etch layer 84, an extractor layer 86 and then the absorber layer 88 are formed on a substrate wafer 82. In one exemplary embodiment, for detection of optical wavelengths of 4-5 µm and shorter, the substrate wafer 82 may be composed of GaSb material, the optional stop etch layer 84 may be composed of AlGaSb material, the p-doped extractor layer 86 may be composed of InAsSb material, and an n-doped absorber layer 88 may be composed of InAsSb material. In another exemplary embodiment, the substrate wafer 82 may be composed of GaSb material, the optional stop etch layer 84 may be composed of AlGaSb material, the n-doped extractor layer 86 may be composed of InAsSb material, and the p-doped absorber layer 88 may be composed of InAsSb material. Lattice matched $InAs_{0.9}Sb_{0.1}$, for example, provides absorption of wavelengths of 4.7 µm and shorter when operated at 300K temperature and absorption of wavelengths of 4.3 µm and shorter when operated at 200K temperature.

For detection of wavelengths as long as 5.0 µm at 200K temperature, material such as $InAs_{0.8}Sb_{0.2}$, having substantial lattice mismatch (approximately +0.7%), could be used for the absorber layer 88. Another alternative to InAsSb is to use a Type II superlattice consisting of InAs/GaSb material for the absorber 88. Another example of a suitable substrate 82, for detection of >5.0 µm wavelength light, is InSb material. The optional stop etch layer 84 could be a thin layer of InAlSb material. The extractor 86 could be composed of doped InAsSb or InAlSb material.

Other examples of extractor 86 materials include extractors 86 composed of multiple layers of semiconductor material. In one exemplary embodiment, the extractor 86 for an n-type InAsSb absorber 88 could be composed of layers of n-type GaAlAsSb and p-type GaSb materials. Such a structure facilitates the flow of the photo-generated electrons away from the extractors 86 and to the ohmic contact of the absorber 88. Such a structure also is effective in reducing the dark current that arises from the depletion layer between the absorber 88 and extractor 86, as discussed in an article by P. Klipstein ("XBn barrier photodetector for high sensitivity and high operating temperature infrared sensors," Proceedings of SPIE, vol. 6940, paper 69402U-1), which is incorporated herein by reference. In another exemplary embodiment, the extractor 86 for n-type InAsSb absorber 88 could be composed of layers of n-type GaAlAsSb, p-type GaSb and then n-type InAs materials. The use of the additional n-type InAs layer, which forms a Type II energy-gap alignment with the GaSb, permits the ohmic contact for both the extractor 86 and the absorber 88 to be made to n-type, narrow bandgap materials.

Figure 9B:
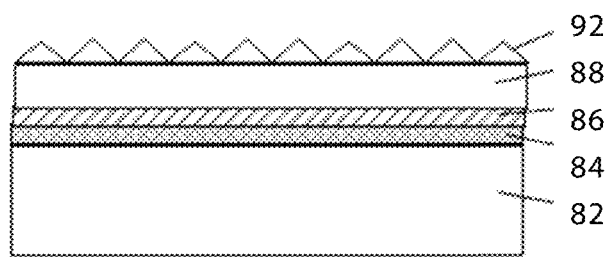
Figure 9C:
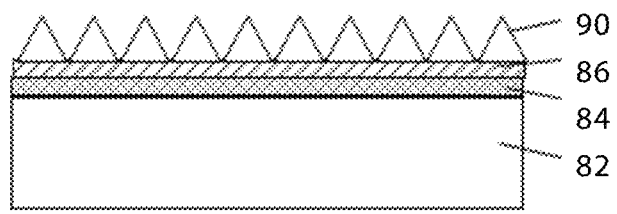

Referring to FIGS. 9b and 9c, pyramidal shapes 90 are formed in the absorber layer 88. An etching process may be used to form pyramidal shapes 90. In one exemplary embodiment, the pyramid shapes 90 are etched by depositing and forming an etch mask 92 that has a pyramid shape. The pyramid outline of the masking material 92 may then be transferred into the absorber 88 by dry etching techniques such as, for example, reactive ion etching or ion beam milling. The height of the masking layer 92 may depend on the dry-etch selectivity between the masking material 92 and the material of the absorber 88. Suitable etch masks 92 may include photoresist, polymers such as benzo-cyclo-butene, and silicon dioxide. A pyramid shape may be formed in photoresist by gray scale lithography. A pyramid shape may be formed in non-photo-definable polymers by means of imprint lithography using a mold that has an inverted pyramid shape. A pyramid shape may be formed in silicon dioxide by using an additional thin mask layer having a square shape and then etching the silicon dioxide with an isotropic wet etchant.

Figure 9D:
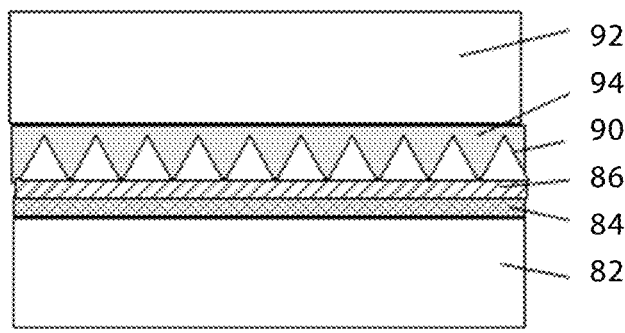

Referring to FIG. 9d, a material 94 is deposited in the spaces between the pyramids 90. In one exemplary embodiment, the material 94 may be composed of spin on glasses and various polymers. The material 94 may then be planarized. An optional adhesion layer (not shown) can be deposited on top of the planarized material 94. Then, a carrier substrate 96 is attached or bonded to the surface of the planarized material 94 or the adhesion layer (not shown). This process is used for wafer transfer.

Figure 9E:
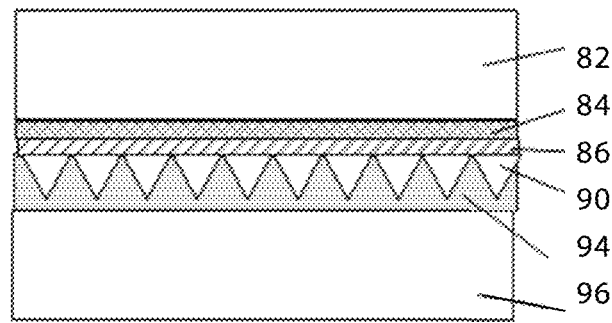
Figure 9F:
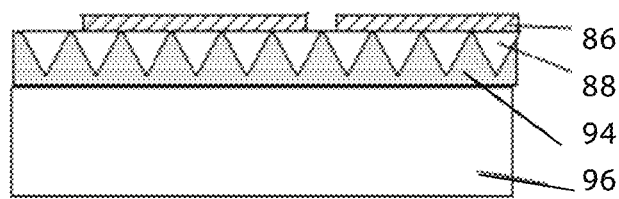

Referring to FIG. 9e, the structure shown in FIG. 9d is turned upside-down. Referring to FIG. 9f, the substrate 82 is removed or etched away as know in the art. The stop etch layer 84 facilitates this substrate 82's removal. The stop etch layer 84 is then also removed by known etching techniques, leaving the extractor layer 86 exposed. The extractor 86 may then be patterned by known photolithography and wet or dry etching methods. In fact, the exposed back side of the absorber layer 88 also can be etched. One exemplary embodiment that makes use of etching the absorber 88 from its back side is discussed below. The back surface of the back-side etched extractor 86 and absorber 88 could have various shapes, including pyramid shapes, as discussed in detail below.

Figure 9G:
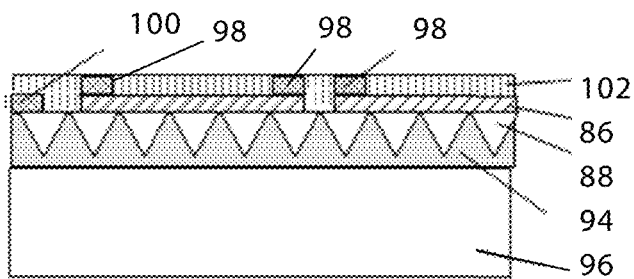

Referring to FIG. 9g, regions of ohmic-contact metals 98 and 100 are then deposited and patterned using exemplary techniques such as evaporation and lift-off or sputtering and etching. Both the ohmic-contact metals 98 for the extractor 86 and the ohmic-contact metal 100 for the absorber 88 may be deposited and patterned at the same time. Following the formation of the ohmic-contact metals 98 and 100, or in some cases before their formation, a film of dielectric passivation material 102 composed of, for example, silicon dioxide, polyimide or benzo-cyclo-butene material is deposited on top of the structure. This passivation material 102 may serve to reduce the amount of surface recombination that occurs in the semiconductor material, and especially at the outer edges of PN junctions.

Figure 9H:
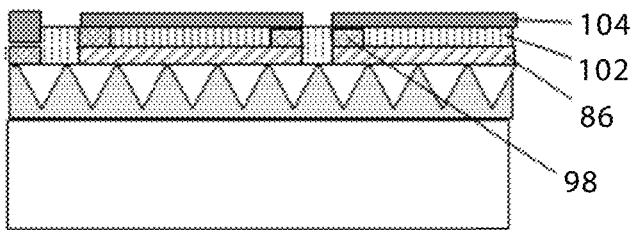

Referring to FIG. 9h, vias may be patterned and etched through the dielectric passivation material 102 to expose certain regions of or for the ohmic-contact metals 98 and 100. Metal bonding pads 104 may then be deposited and patterned. These metal bonding pads 104 can then be used for solder bump 106 bonding of the detector array to the read-out integrated circuit 110, as illustrated in FIGS. 9i-9l.

Referring to FIGS. 9i-9j, once the detector array, held on the carrier substrate 96, is bonded to the read-out integrated circuit 110, the carrier substrate 96 can then be removed. In one exemplary embodiment, a protective layer of material (not shown) such as photoresist may be used to cover and protect the read-out integrated circuit 110, the solder bumps 106 and the bond pads 104 and 108 from the etchant used to remove the carrier substrate 96. Referring to FIG. 9k, after the carrier substrate 96 is removed, the adhesion material (not shown) over the pyramids 90 may also be removed, and the planarization/fill material 94 may be optionally removed as well. Referring to FIG. 9l, in one exemplary embodiment, ohmic contacts (not shown) may be formed on the tips of the pyramids 90 and additional metal interconnects 112 can be deposited on patterned onto the now exposed top side of the detector array. These top-side metal interconnects are further discussed below.

Figure 10:
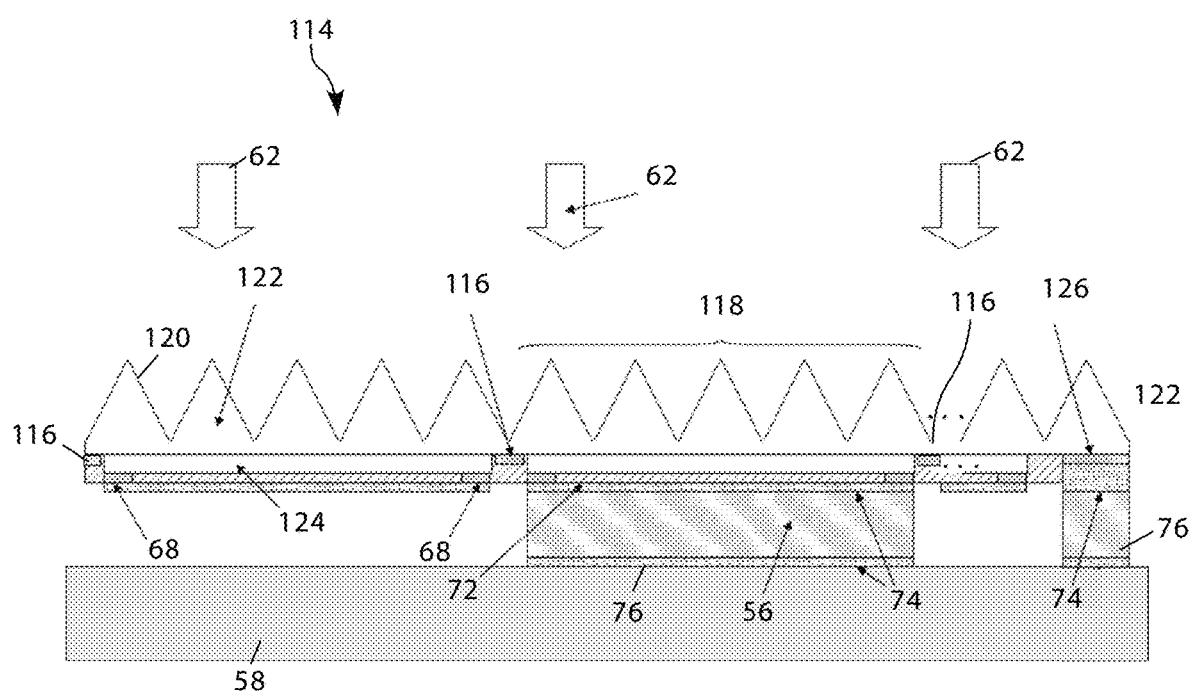
FIG. 10 depicts another exemplary embodiment of an optical imager according to the present disclosure.

FIG. 10 depicts another exemplary embodiment of a novel detector array 114 according to the present disclosure. This detector array has ohmic contacts 116 formed near each detector pixel 118 rather than only having a single ohmic contact 70 shared between multiple detector pixels 54 of the detector array 60 as shown in FIG. 6. By forming the ohmic contacts 116 at the periphery of each detector pixel 118, the pyramids 120 can be etched deeper into the absorber layer 122, thereby further reducing the total volume of absorber material. However within a given detector, there may be some laterally contiguous thickness of absorber material between the bottom of the etched pyramids 120 and the top of the depletion region formed between absorber 122 and extractor 124, in order to permit the photo-generated majority carriers to flow to the ohmic contacts 116 without incurring unacceptable ohmic (resistive) voltage drops.

Figure 11:
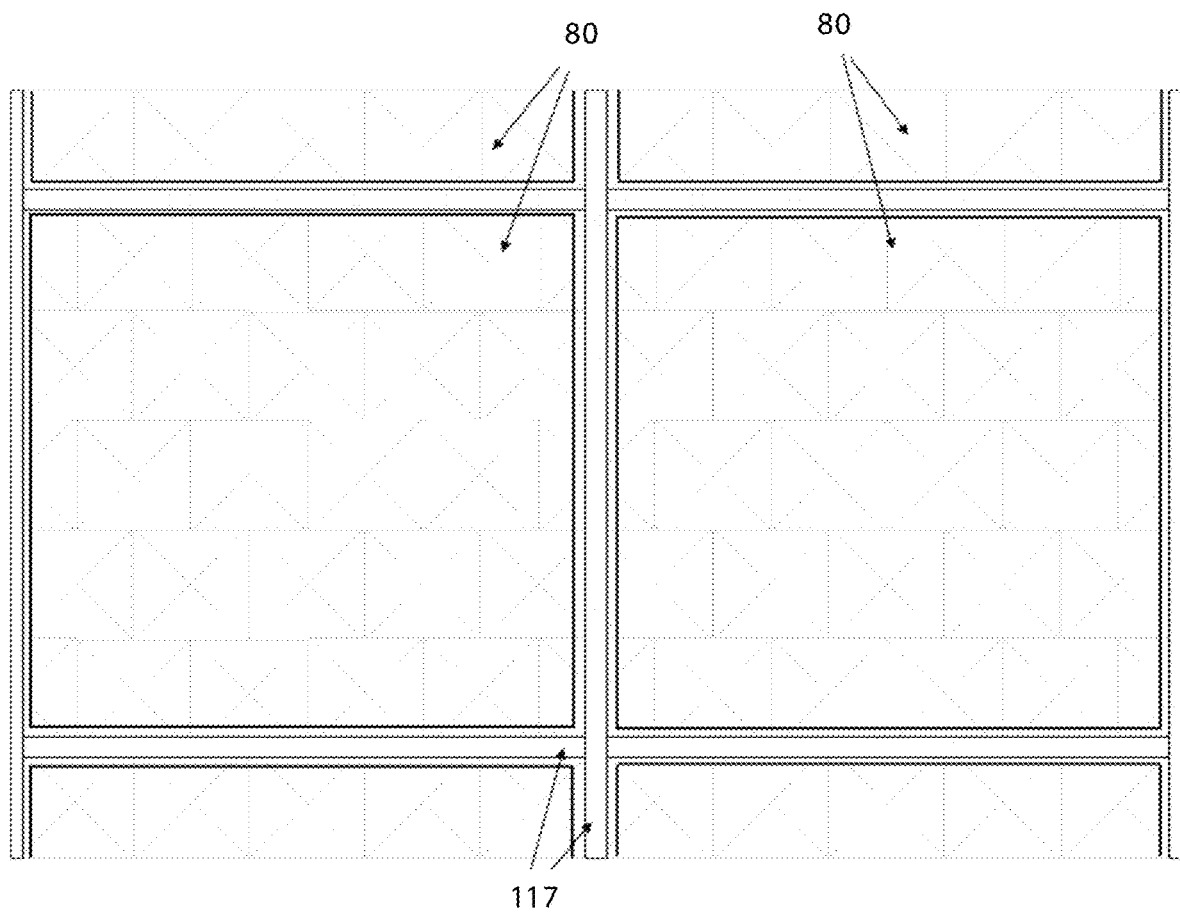
FIG. 11 depicts a bottom view of a detector array shown in FIG. 10.

The pattern of ohmic contact metal 116, and the optional metal interconnect lines 117 that contact to and interconnect the ohmic contacts 116, forms a low-resistance path for the photo-generated electrical current to flow from each pixel 118 to the "common" bond pads 126 that are located at the periphery of the detector array 114. An example of a configuration of the metal interconnect lines 117 is shown in FIG. 11. By using the low-resistance metal paths to carry the current instead of requiring the photo-generated majority carriers to flow through the absorber 122, the thickness of absorber material between the base of the pyramids 120 and the depletion layer can be reduced to further reduce the dark-current generation volume of the detector array, thereby improving its detectivity.

The embodiments illustrated in FIGS. 6 and 10 require the incident light 62 to pass through the absorbers 64 and 122, respectively, and the extractors 66 and 124 before the not yet absorbed photons of that incident light 62 are reflected from the metal reflector surface 74 at the back side of the detector pixel. For some material structures, photons absorbed in the extractors 66 and 124 do not contribute to the desired output current of the detectors 60 and 114. Thus, it is preferable to reduce the volume of the extractors 66 and 124 and to have more of the back side of the absorbers 64 and 122 in proximity to the metal reflector 74.

Figure 12A:
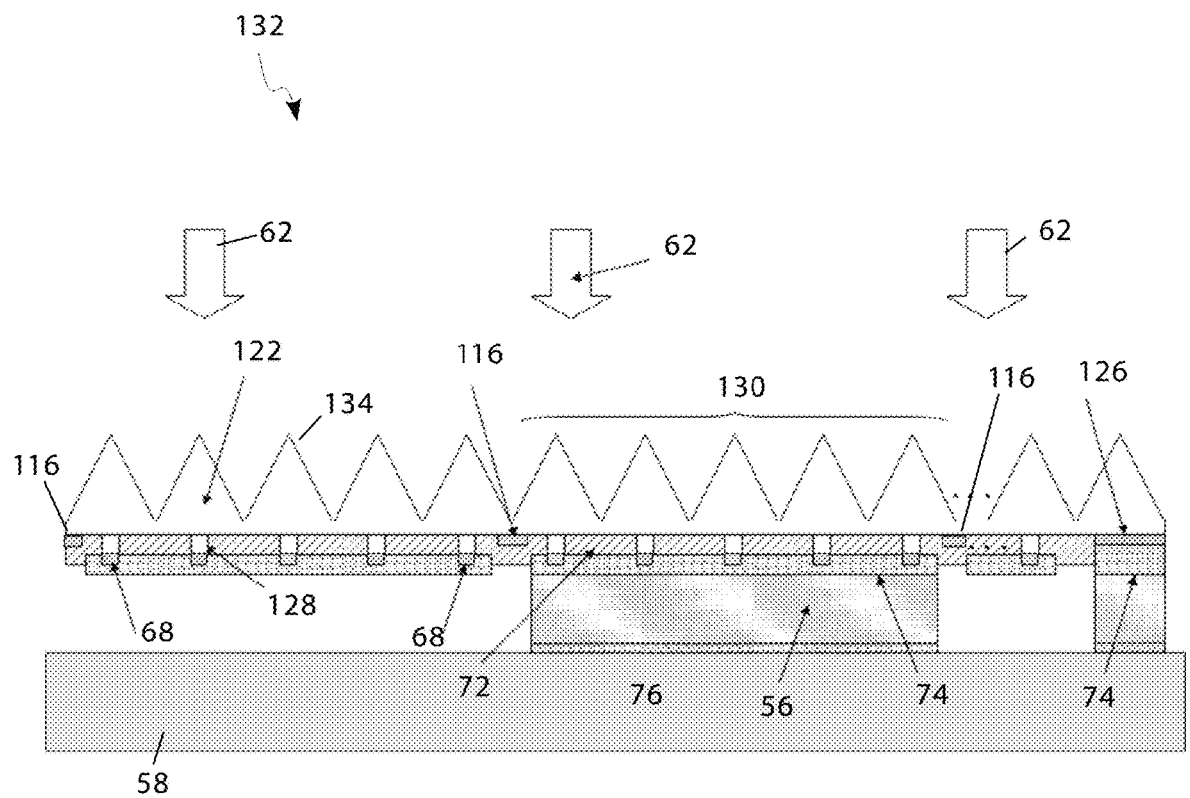
FIGS. 12a-12b depict another exemplary embodiment of an optical imager according to the present disclosure.
Figure 12B:
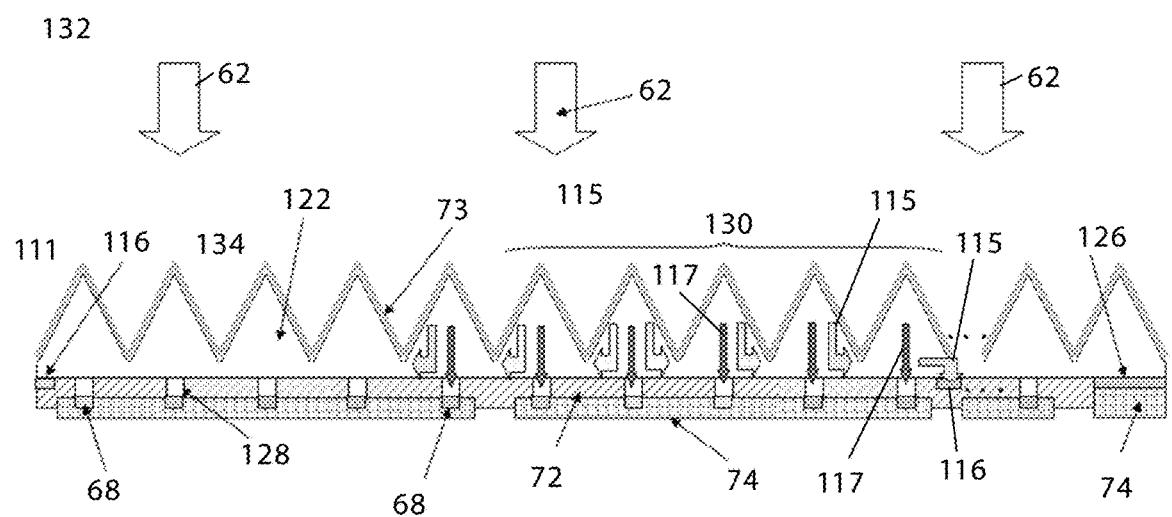

FIGS. 12a-12b depict another exemplary embodiment of a novel detector array 132 according to the present disclosure in which multiple, small regions of extractor 128 are formed in each detector pixel 130. As shown in the FIGS. 12a-12b, the regions of extractor 128 are located underneath each pyramid 134. However, other arrangements of the extractor regions also could be used. The detector array 132 comprises an absorber 122 that couples the incident light 62 into the volume of the absorber 122 and that generates electrons and holes from the absorbed photons of light. The absorber 122 may be either n-type semiconductor material or p-type semiconductor material whose energy band gap is sufficiently small to absorb the incident light 62 and generate the electron/hole pairs as a result of an interband process. Each detector of the array also contains small regions of extractor 128. The extractors 128 may serve to extract the photo-generated minority carriers and couple those carriers to an ohmic contact 68. Other contacts 116 and 126 may be coupled to the absorber 122. In one exemplary embodiment, if the absorber 122 is n-type, the photo-generated electrons are the majority carriers in the absorber 122 and are extracted through the contacts 116 as shown by arrows 115 in FIG. 12b. The photo-generated holes are the minority carriers in the absorber 122 and are coupled into the extractors 128 and then extracted through the contacts 68 as shown by arrows 117 in FIG. 12b. The extractors 128 may be either p-type or n-type. When both the absorber 122 and the extractors 128 are composed of the same semiconductor material, the extractors 128 may be p-type if the absorber 122 is n-type. As shown in FIG. 12b, the slopes of the pyramids 134 may also be covered by a surface-passivation layer 73 to prevent dark current due to surface states and carrier recombination at those surface states. The surface passivation layer 73 may also be used with other embodiments described in the present disclosure.

Figure 13:
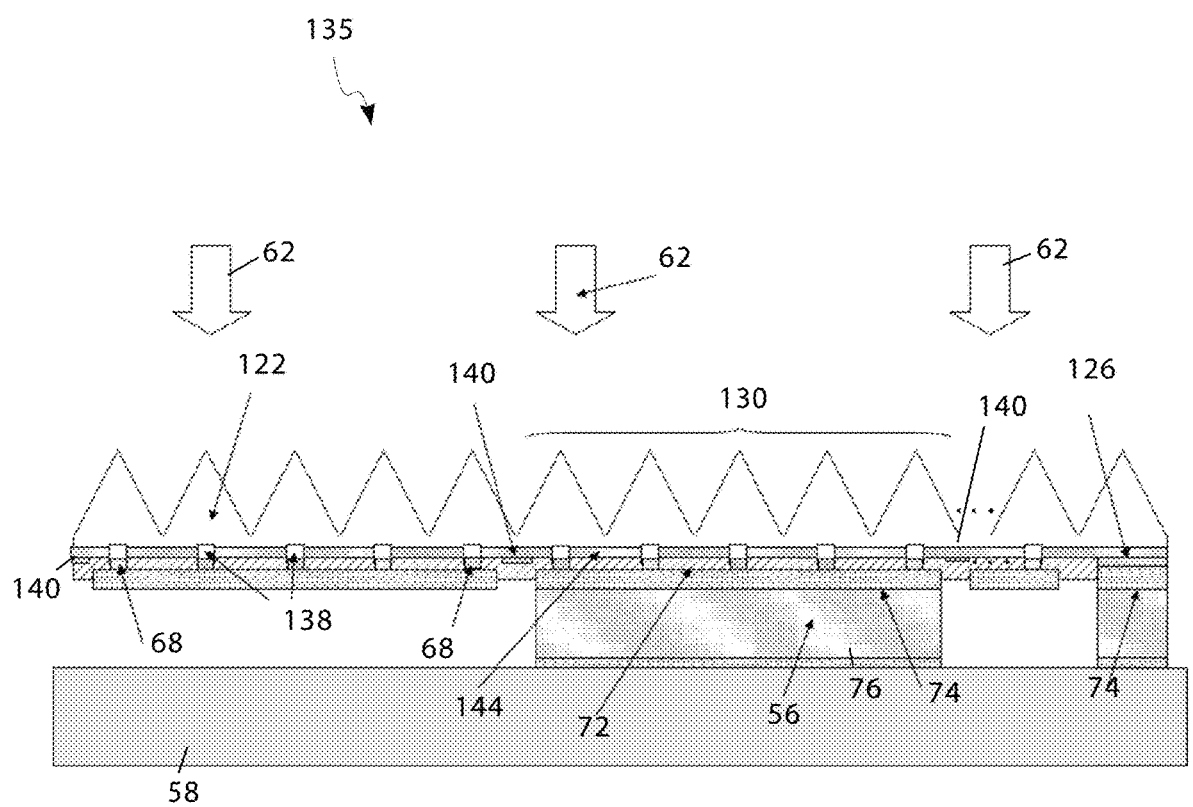
FIG. 13 depicts another exemplary embodiment of an optical imager according to the present disclosure.

FIG. 13 depicts another exemplary embodiment of a novel detector array 136 according to the present disclosure that contains multiple extractor regions 138 in each detector pixel 130. In this exemplary embodiment, the extractor regions 138 may be formed by diffusion or implantation of a dopant. The detector array 136 may also contain an optional barrier layer 144 that is located beneath the absorber 122 and above the ROIC 58. The barrier layer 144 may be of the same doping type as the absorber 122 whereas the extractor regions 138 have the opposite doping type. The barrier layer 144 may be composed of a material that has a wider bandgap than the material of the absorber 122. The energy bands of the barrier layer 144 and absorber 122 materials may form a Type I alignment or a Type II alignment. With a Type I alignment, both the conduction band edge and the valence band edge of the barrier layer 144 are larger than the conduction and valence band edges of the absorber 122. For a Type II alignment, the band edge of one band in the barrier layer 144 is larger than the band edge of that same band in the absorber 122. However, the band edge of the other band in the barrier layer 144 is lower than or at the same level as the band edge of that same band in the absorber 122. Thus, one carrier type can flow from the absorber 122 into the barrier layer 144 but the other carrier type tends to remain in the absorber 122. If flow of the majority carrier type is blocked by the barrier layer 144, the PN junction is preferably located within the barrier layer 144. However, if the minority carrier type is blocked by the barrier layer 144, the PN junction is preferably located within the absorber 122.

Figure 14A:
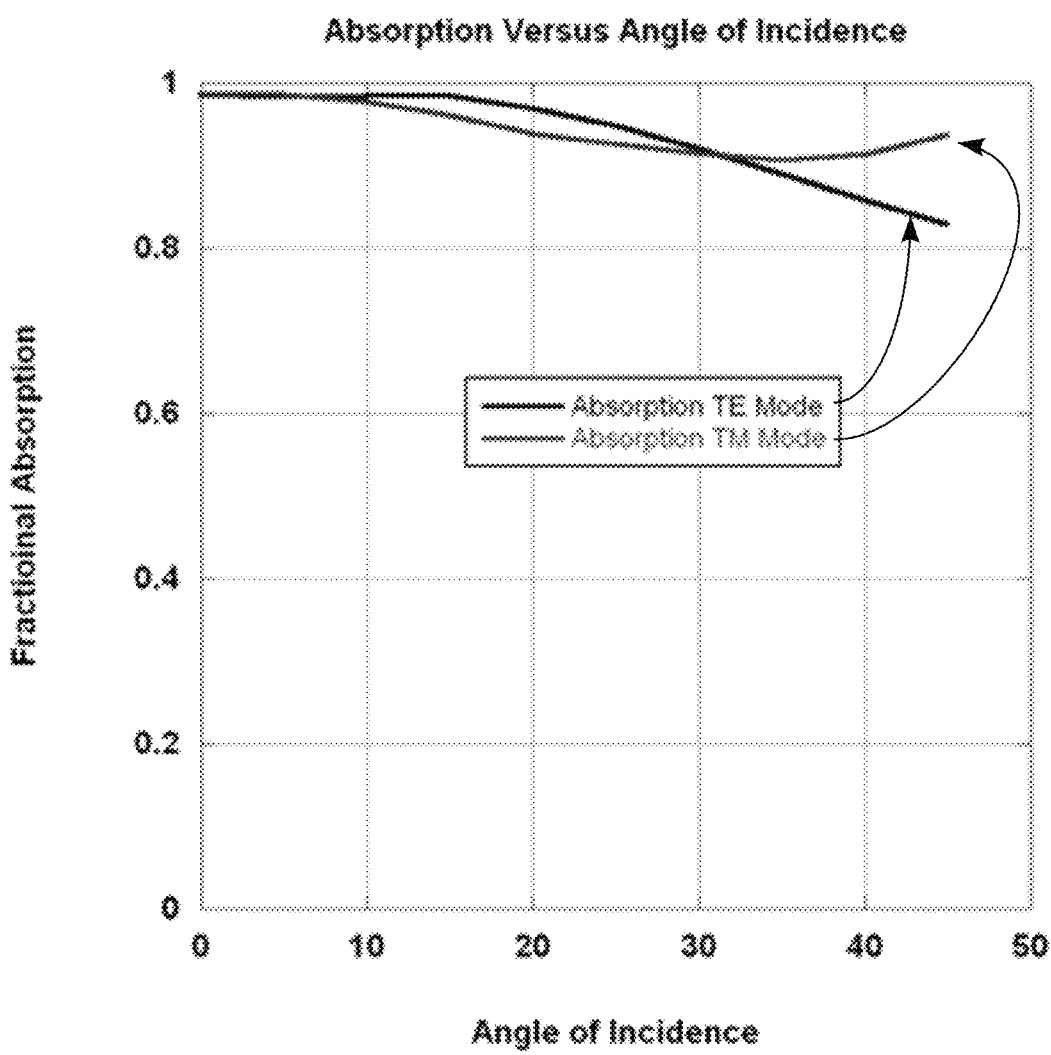
FIG. 14a depicts calculated absorbance of pyramid array for various angles of incidence of the light and for polarization of the light parallel to (TE mode) or perpendicular to (TM mode) the plane of incidence.
Figure 14B:
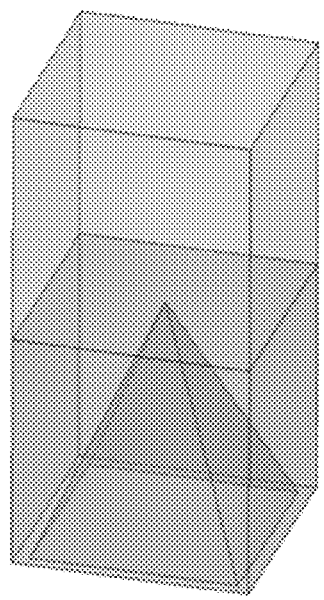

An absorber comprising a collection of pyramids is effective in absorbing the incident light. An absorber may absorb light that is incident over a large range of angles. FIGS. 14a-14b depict the results of calculations made using a high-frequency electromagnetic structures simulator (HFSS by Ansoft) of a periodic array of pyramidal absorbers. The simulation results indicate that the absorption is strong for both polarizations of the incident light. Also, the simulation results indicate that the absorption is strong even when the angle of incidence is greater than 30 degrees, which corresponds to an imager that has f/1 optics. The results shown in the FIG. 14a were made for 5 µm wavelength light and assumed the array of pyramids has pitch of 5 µm and each pyramid has a height of 5 µm and base of 4.4 µm as shown in FIG. 14b. In general, the height of the pyramids may be at least as large as the longest wavelength of the incident light to be detected. The pyramids of the arrays need not have their bases touch each other. Instead, there can be small gaps between the edges of adjacent pyramids. The width of these gaps depends on the minimum wavelength of the incident light that should be detected efficiently by the imager, with low reflection. An optical resonant cavity may be constructed for the short-wavelength incident light to reduce the reflection of the short wavelength light from the regions of the gaps. Use of gaps between the pyramids can further reduce the total volume of absorber material that contributes to the dark current.

Figure 15:
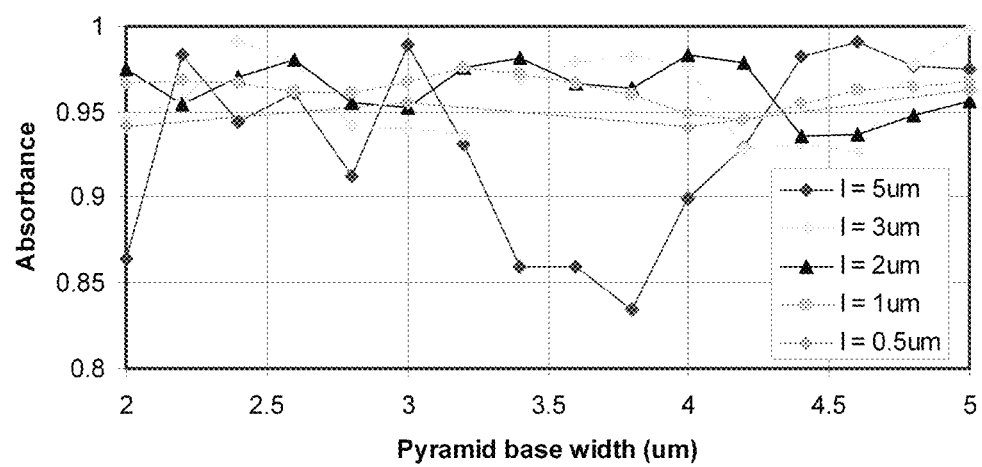
FIG. 15 depicts calculated absorbance of pyramid array for various widths of the pyramid base.

Efficient absorption of the incident light over a broad band of wavelengths is achieved by using the pyramidal absorber. FIG. 15, obtained by HFSS simulations, shows that more than 90% of the incident light is absorbed for incident wavelengths between 0.5 and 4.0 µm by a pyramidal absorber whose maximum height is only 5 µm. In an exemplary embodiment, a uniform thickness layer of the same absorber material (InSb was assumed for these calculations), that does not have the etched pyramids, would absorb only 55-70% of the incident light, with the amount of absorption depending on the wavelength of that light and the Fabry Perot cavity effects that occur at those wavelengths. Although the volume of the pyramidal absorber is less than one-third the volume of the uniform-thickness absorber, the efficiency of absorption is much higher. Only when the thickness of the uniform-thickness absorber is more than twice as great as the height of the pyramids (so that the absorber volume is more than 7 times greater) is the light almost fully absorbed in that uniform-thickness absorber. The bandwidth over which efficient absorption is obtained with a pyramidal absorber represents a great improvement compared to prior detectors that make use of "quarter-wave thickness" anti-reflection coatings as discussed above.

With a pyramidal absorber, efficient absorption of the incident light also is achieved for many values of the width of the pyramid base, as shown in FIG. 15. The angle of the pyramid sidewall becomes shallower as the width of the base increases.

Figure 16:
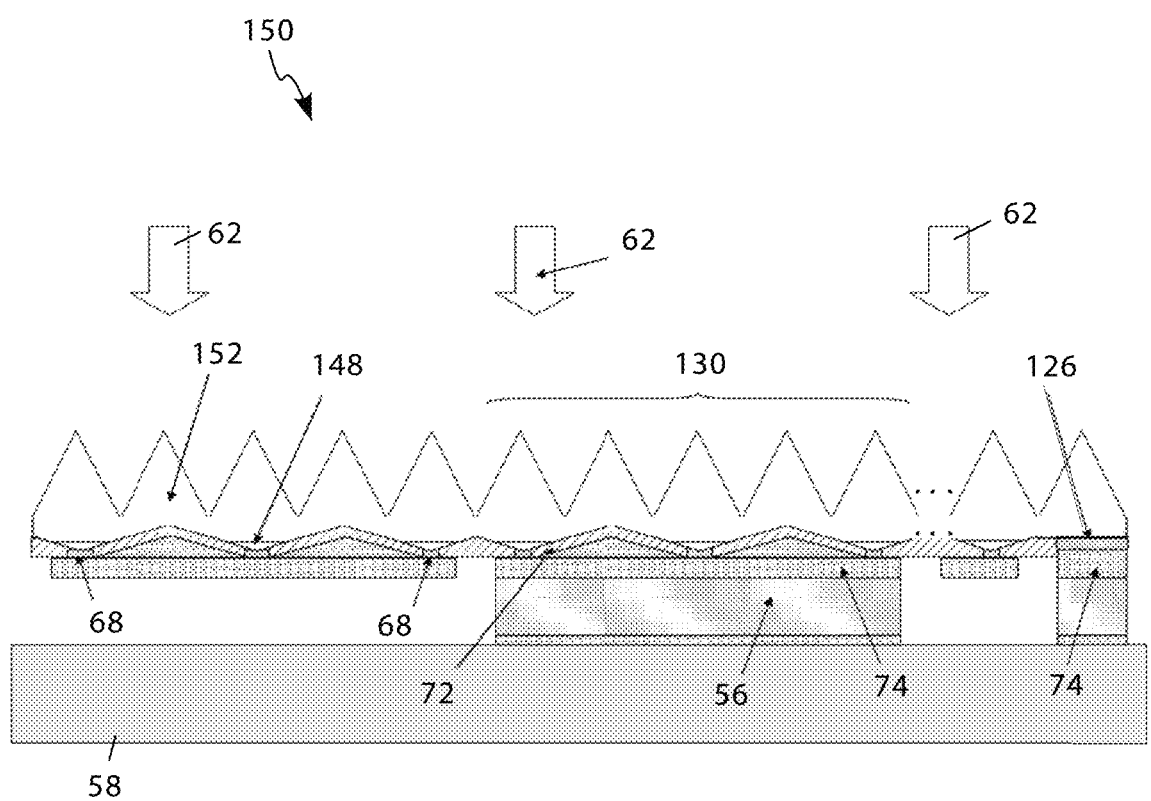
FIG. 16 depicts another exemplary embodiment of an optical imager according to the present disclosure.

FIG. 16 depicts another exemplary embodiment of a novel detector array 150 according to the present disclosure that has an absorber 152 with pyramids etched into both its top side and its bottom side. By forming pyramids on both sides of the absorber 152, the effectiveness of the light or photon trapping can be further improved, albeit with a somewhat more complicated fabrication process. As shown in the FIG. 16, the pyramids on the bottom side need not have the same pitch as the pyramids on the top side of the absorber 152. The extractor regions 148 may be located at the bottom tips of the pyramid shapes formed on the bottom side of the absorber 152. The extractor regions 148 may be formed by epitaxial growth, by diffusion or implantation. The sidewalls of the pyramid shapes at the bottom side may be coated with a passivation material 72 and also with metal reflectors 74.

Figure 17:
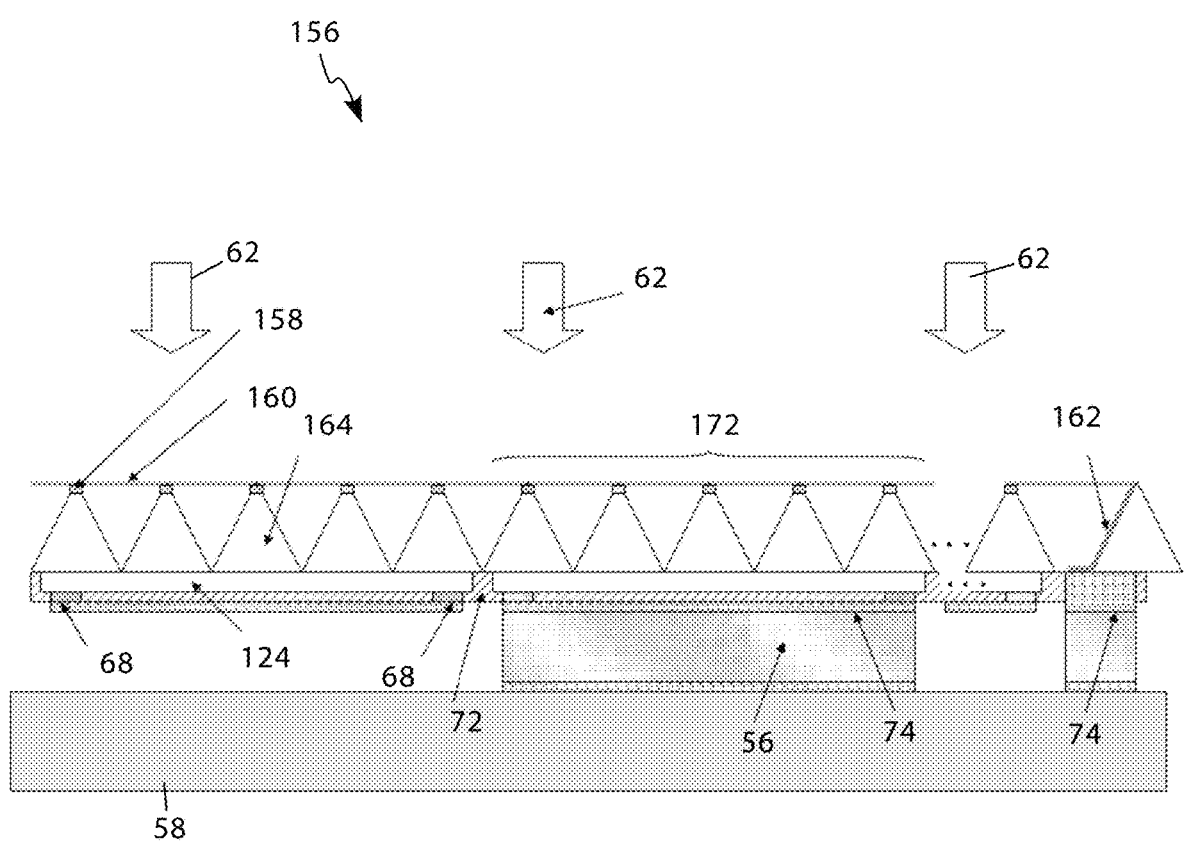
FIG. 17 depicts another exemplary embodiment of an optical imager according to the present disclosure.
Figure 18:
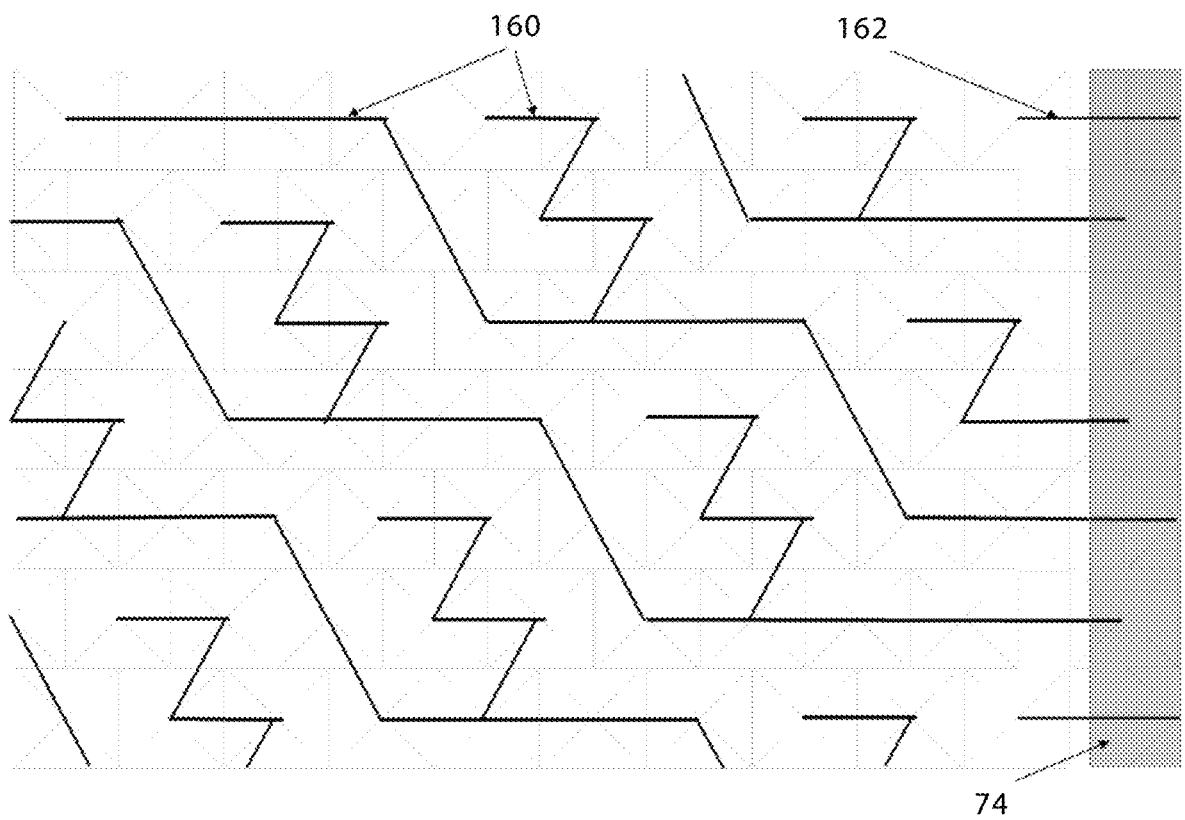
FIG. 18 depicts a top view of the optical imager shown in FIG. 17.

FIG. 17 depicts another exemplary embodiment of a novel detector array 156 according to the present disclosure that has its common electrical contacts 158 formed on the tops of the pyramids instead of on the back side of the detector array as discussed above. The fabrication process for this detector array is similar to the fabrication process for the other detector arrays. However, after the carrier substrate is removed, the planarization/fill material is etched to expose the tops of the pyramids. Metal ohmic contacts are then deposited and patterned over those exposed tops. Then, strips of metal interconnects 160 are deposited and patterned to interconnect the tips of the pyramids to the periphery of the detector array through the metal 162. Finally, the planarization/fill material can be removed, if desired, and a thin layer of a dielectric passivation can be deposited to cover the pyramids. Because the metal interconnect strips cover only a small portion of the top surface, most of the incident light 62 can reach the absorbers 164 and become absorbed. In one exemplary embodiment, the strips of top-side metal interconnect 160 do not form a rectangular grid as the rectangular grid may make the detector array 156 sensitive to the polarization of the incident light 62. In another exemplary embodiment, pattern of short strips of metal interconnects 160 is applied as shown in FIG. 18.

Figure 19:
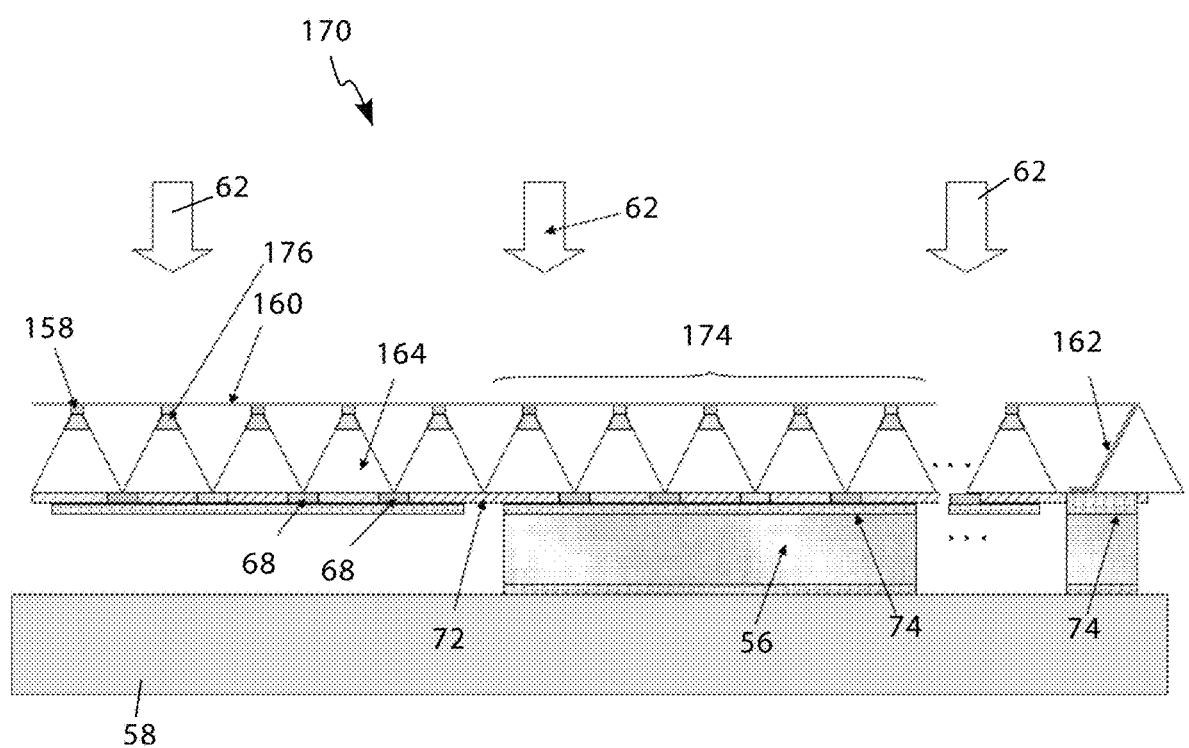
FIG. 19 depicts another exemplary embodiment of an optical imager according to the present disclosure.

FIG. 19 depicts another exemplary embodiment of a novel detector array 170 according to the present disclosure that has its common electrical contacts 158 and extractors 176 formed on the tops of the pyramids instead of on the back side of the detector array as discussed above. The strips of metal interconnects 160 are deposited and patterned to interconnect the tips of the pyramids to the periphery of the detector array through the metal 162. Because the metal interconnect strips 160 cover only a small portion of the top surface, most of the incident light 62 can reach the absorbers 164 and become absorbed. In one exemplary embodiment, the strips of top-side metal interconnect 160 do not form a rectangular grid as the rectangular grid may make the detector array 170 sensitive to the polarization of the incident light 62. As discussed above and shown in FIG. 12b, the slopes of the pyramids of the detector array 170 may also be covered by a surface-passivation layer 73 (not shown in FIG. 19) to prevent dark current due to surface states and carrier recombination at those surface states. Although fabrication process discussed above with reference to FIGS. 9a-9l is suitable for fabricating the detector array 170, it is to be understood that, when fabricating the detector array 170, the absorbing layer 88 is to be grown before the extractor layer 86.

Exemplary Detector with Absorbing Pillars Embedded within Otherwise Transparent Pyramids and an Absorbing Slab The detector presently disclosed may also contain an array of light detecting regions further comprising an ensemble of light absorbing pillars of varying height. The outline of these pillars may form a set of pyramids. The pillars can have rod-like shapes, cone-like shapes or other shapes of tall aspect ratio. The pillars may be covered by a layer of surface-passivating material. The detector may also contain a base layer located beneath the pillar. This base layer may be continuous in the lateral direction (in the plane of the substrate). The base layer may absorb the incident light but also could be transparent to that light. The detector may also contain one or more extractor regions for extracting the photo-generated minority carriers from the absorber and, in combination with ohmic contacts coupled to the extractors, producing an electrical current output of the detector. The extractor regions may be located toward the back side of the detector. The detector may also contain at least one ohmic contact located on its back side that serves to extract the photo-generated majority carriers.

In one exemplary embodiment, the pillars may be surrounded by a fill material that has a low refractive index and is transparent to the incident light. In another exemplary embodiment, each semiconductor pillar may be surrounded by a semiconductor material, having similarly high refractive index as the pillars, that may not absorb the light. The high-index semiconductor material has a wider bandgap than the bandgap of the absorber material. Also, the conduction and valence band edges of the high-index fill material and of the absorber material may be aligned such that photo-generated majority carriers are conducted through the heterojunction between those materials. Thus, there is a continuous path for the lateral flow of the majority carriers through a pyramid and from one pyramid to another in the detector according to the present disclosure.

In one exemplary embodiment, the electrical common contacts may be used to extract the photogenerated majority carriers for groups of multiple detectors in to an array rather the entire array of detectors. Thus, the photo-generated majority carriers can flow laterally among multiple detectors in the array.

Presently The presently disclosed quantum detector may be used in a broadband imager, having sensitivity over near infrared (NIR) to midwave-infrared (MWIR) wavelengths, or even extending to longwave-infrared (LWIR) wavelengths. This detector has high detectivity, D*, because it has lower dark current but still high quantum efficiency even though its bandwidth is so broad. The lower dark current is achieved by reducing the volume of its light absorbing material, compared to detectors with planar absorber regions. For the narrow bandgap absorbers of MWIR detectors, the main contribution to the dark current at temperatures of 130K and higher is due to thermal generation in the absorber. Thus, the dark current can be reduced by reducing the volume of that absorber material.

According to the present disclosure, pillared absorber with low-index filler has low reflectance of the incident light, because of the low net refractive index of that structure. By properly selecting the width and spacing of the pillars, the absorption can be kept relatively high and the front-side reflectance low. This keeps the quantum efficiency of the detector high. The pillared absorber with high-index filler resembles a solid pyramidal absorber, which also has low front-side reflectance. An advantage of this pillared absorber with high-index filler over the solid pyramidal absorber is that the volume of its absorber material is smaller, so its dark current can be even lower. In the pillared absorber with low-index filler, the lateral conduction of the photo-generated carriers is provided by the base layer and, in some embodiments, by the extractor. In the pillared absorber with the high-index, wide-bandgap filler, the lateral conduction of the majority carriers can be provided by the filler while the lateral conduction of minority carriers is provided by the base layer and/or the extractor. Thus, by using the wide-bandgap filler, the thickness of the base layer can be made much smaller compared to the thickness required for the low-index filler.

The purpose of the imager presently disclosed is to achieve high-sensitivity detection of the incident light over a much broader band of optical wavelengths than is obtained with previously known optical imagers. The disclosed optical detectors are designed to have high sensitivity over several octaves of optical bandwidth, with that detection bandwidth possibly being greater than one decade. The high sensitivity may be achieved by reducing the reflection of the incident light by the detector for all of those wavelengths of the incident light. Also, the high sensitivity may be achieved by efficiently capturing and absorbing the incident light (photons) to produce electrical carriers (electrons and holes), with the amount of output electrical current extracted from the detector being related to the amount of light incident upon the detector pixel. And, the high sensitivity may be achieved by minimizing the dark current, by reducing the volume of light-absorbing material, which introduces noise from its thermal (dark) generation of electrical carriers.

Figure 20:
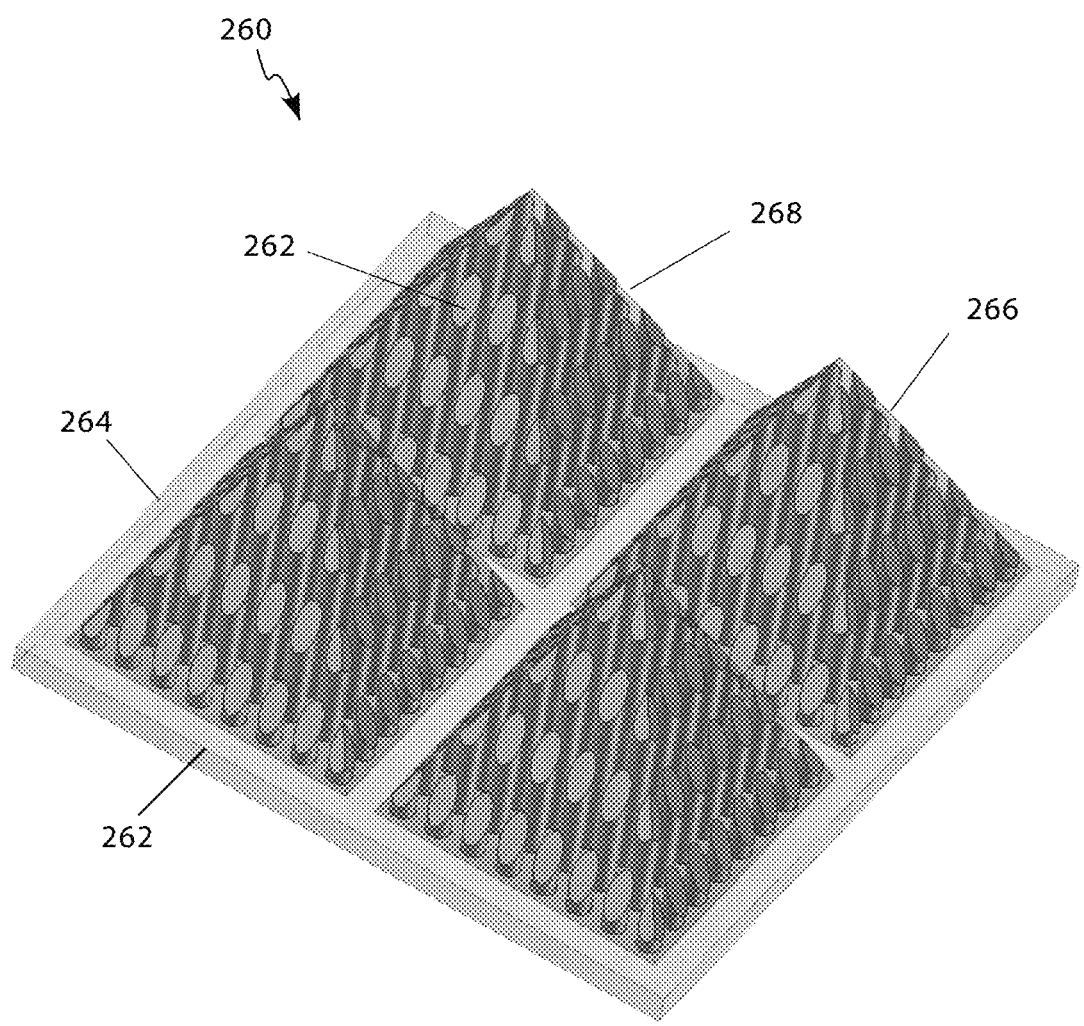
FIG. 20 depicts an exemplary embodiment of a detector pixel according to the present disclosure.

FIG. 20 depicts a detector pixel 260 of an infrared detector array that comprises ensembles of pillar-shaped absorbers 262 of the incident light (not shown). The heights of the pillars 262 in each ensemble may be adjusted to match a pyramidal outline 268. The pyramids formed by the pillars 262 can have small gaps between the bases of adjacent pyramids (as illustrated in the FIG. 20) or they can have their bases touching (not shown). The pillars 262 are located directly above, and may be in contact with, a base layer 264. The base layer 264 may contain additional absorber material similar to the material of the pillars 262. Even when adjacent pyramids do not abut, the base layer 264 may provide electrical interconnection between adjacent detectors of the array. The base layer 264 material may be of the same dopant type (n-type or p-type) as the absorber material. The pillars 262 may have rod-like shapes, cone-like shapes or other high-aspect-ratio shapes.

The detector pixel 260 may also contain fill-in material 266 that covers the sidewalls of the pillars 262. The fill-in material 266 that surrounds a pillar 262 may be in contact with at least a portion of the fill-in material 266 that surrounds an adjacent pillar 262. However, the fill-in materials 266 do not necessarily need to completely fill the space between the pillars 262. The combination of the fill-in regions 266 and the absorber pillars 262 has a pyramidal shape 268, as shown in FIG. 20. The fill-in material 266 may also serve to passivate the sidewalls of the pillars 262, controlling the electronic surface states at the sidewalls of the pillars 262. Also, the top side of the pyramids 268 may be covered with a surface-passivation layer (not shown) that does not absorb the incident light of interest. The exposed portion of the base layer 264 also may be covered with that surface-passivation layer (not shown) if the pyramids 268 do not abut each other. In an exemplary embodiment, the passivation material may be composed of silicon dioxide, polymers such as benzo-cyclo-butene, ammonium sulfide further covered by a material such as silicon dioxide, and a wide-bandgap semiconductor such as GaAlAsSb. If the fill-in layer 266 does not act as a suitable surface passivant, the sidewalls of the pillars 262 may further be covered with a suitable surface passivant, such as the materials listed above, which is sandwiched between the absorber pillar 262 and the fill-in material 266.

The absorber pillars 262 absorb the incident light to be detected by the detector array. This detected incident light can comprise a wide range of wavelengths, such as ranging from near infrared (NIR) wavelengths greater than 0.7 micrometers to midwave infrared (MWIR) wavelengths as great as 5.0 micrometers. The detected incident light also could comprise other ranges of wavelengths, such as visible wavelengths or far infrared (FIR) wavelengths. The detector array may also have additional portions that act to extract or collect the photo-generated electronic carriers (the electrons and holes) and generated an electrical current, the output signal, from each detector pixel of the array.

Figure 21:
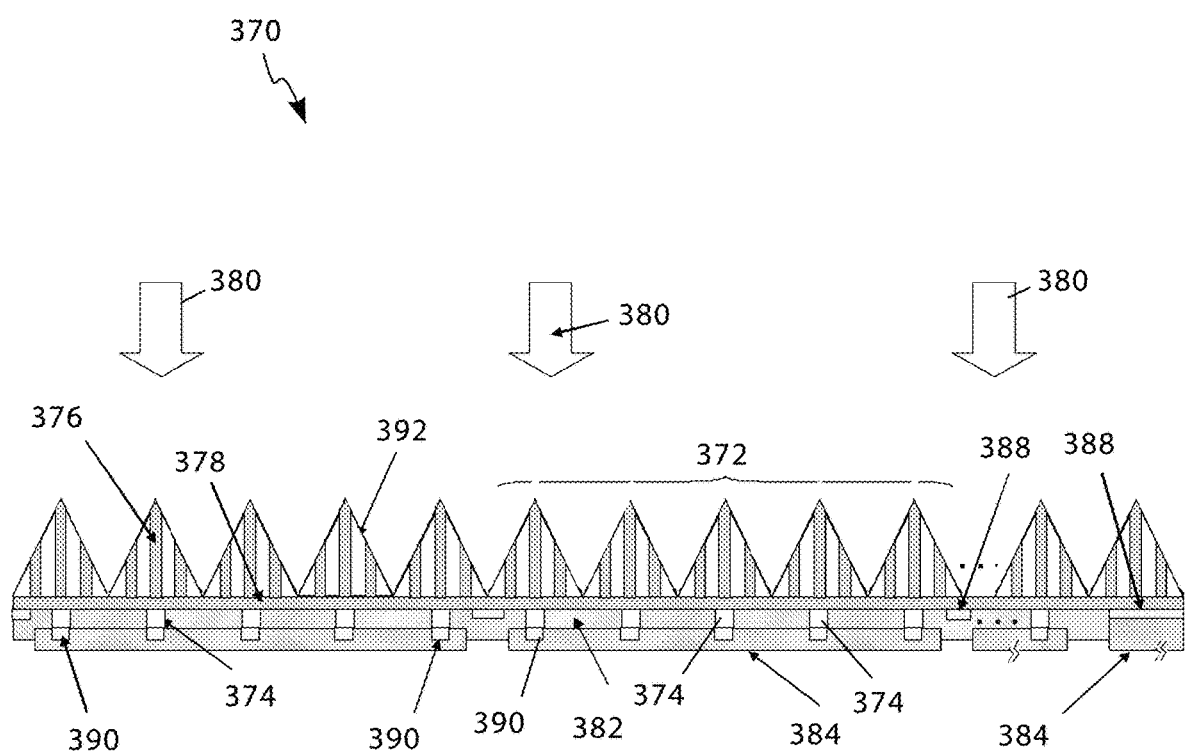
FIG. 21 depicts an exemplary embodiment of a photodetector array according to the present disclosure.

FIG. 21 depicts a novel detector array 370 according to the present disclosure. Each detector pixel 372 contains extractor regions 374 that serve to extract or collect the minority carriers from the absorber pillars 376. The extractor regions 374 lie on the back side of the base layer 378, the side away from the incident light 380. The extractor regions 374 of the detector array 370 may have an area that is smaller than the area of the base layer 378. In an exemplary embodiment, the ratio of total area of the extractor regions 374 in a detector pixel 372 to the area of the base layer 378 may be as small as 1:10 or 1:100. The portions of the back side of the base layer 378 that are not covered by the extractor regions 374 may be covered by a surface passivant 382 and then a metallic reflector/metal bond pad 384 of the incident light 380 to be detected. This allows the detector array 370 to have a mirror located at its back side that facilitates multiple passes of the light through the pyramids and the base layer 378. Thus, the overall height of the pyramids and base layer 378 may be reduced and yet provide high absorption of the incident light 380. The top surface of the detector array 370 may also contain a passivation material 392 that is optically transparent at the wavelengths of interest.

The detector array 370 may also contain metal-to-semiconductor contacts 388 and 390. In one exemplary embodiment, the contacts 388 and 390 are Ohmic contacts. The contacts 390 may be formed at the back side of the extractor regions 374. The contacts 390 of a detector pixel 372 may be electrically interconnected by a metal bond pad 384 that covers most of the back side surface of the detector array 370. The metal bond pad 384 may be used to bond the pixel to a read-out integrated circuit (not shown) when the detector array 370 is part of a focal-plane array imager (not shown). The detected signal current from a detector pixel 372 is, thereby, obtained through the metal bond pad 384. The contacts 388 serve to extract the majority carrier photocurrent from the detector array 370 and can be a common collector of current for a group of multiple detector pixels 372 or possibly even for the entire detector array 370. Thus, the current for each pixel is obtained through the contacts 374 of that pixel 372 and the common current for the detector array 370 is obtained through the contacts 388. The contacts 388 may be located beneath some of the valleys between pyramids. The area of the contacts 388 associated with a pixel 372 or group of pixels may be much smaller than the area of the base layer 378 associated with the same pixel 372 or group of pixels.

The absorber pillars 262, 376 can be arranged with a pillar located directly at the tip of a pyramid, as illustrated in FIG. 21 or the absorber pillars 262, 376 can be arranged such that a space between pillars is located where the tip of a pyramid would be, as illustrated in FIG. 20. The space may be filled with a fill-in material 266, 392. The dimensions of the pyramids may be constrained by the wavelengths of the incident radiation to be detected by the detector. In general, the width of the pyramids is approximately equal to or is smaller than the wavelength $\lambda_{max}$ of the longest-wavelength (lowest frequency) radiation to be detected. In general, the width of a pillar is greater than one-half the wavelength $\lambda_{min}$ of the shortest-wavelength (highest frequency) radiation to be detected. In general, the spacing between pillars is smaller than the wavelength $\lambda_{min}$ of the shortest-wavelength radiation to be detected. The height of the tallest pillar depends on the desired absorption efficiency of the detector and on whether there is an optical reflector at the back side of the detector. In general, the height of the tallest pillar is on the order of the wavelength $\lambda_{max}$ of the longest-wavelength radiation to be detected. Although the preceding discussion provides general guidelines for selecting the dimensions of the pillars, the spacing between pillars and the size and spacing of the pyramids, the detectors also can have other arrangements and dimensions for the pillars and pyramids therein.

Figure 22:
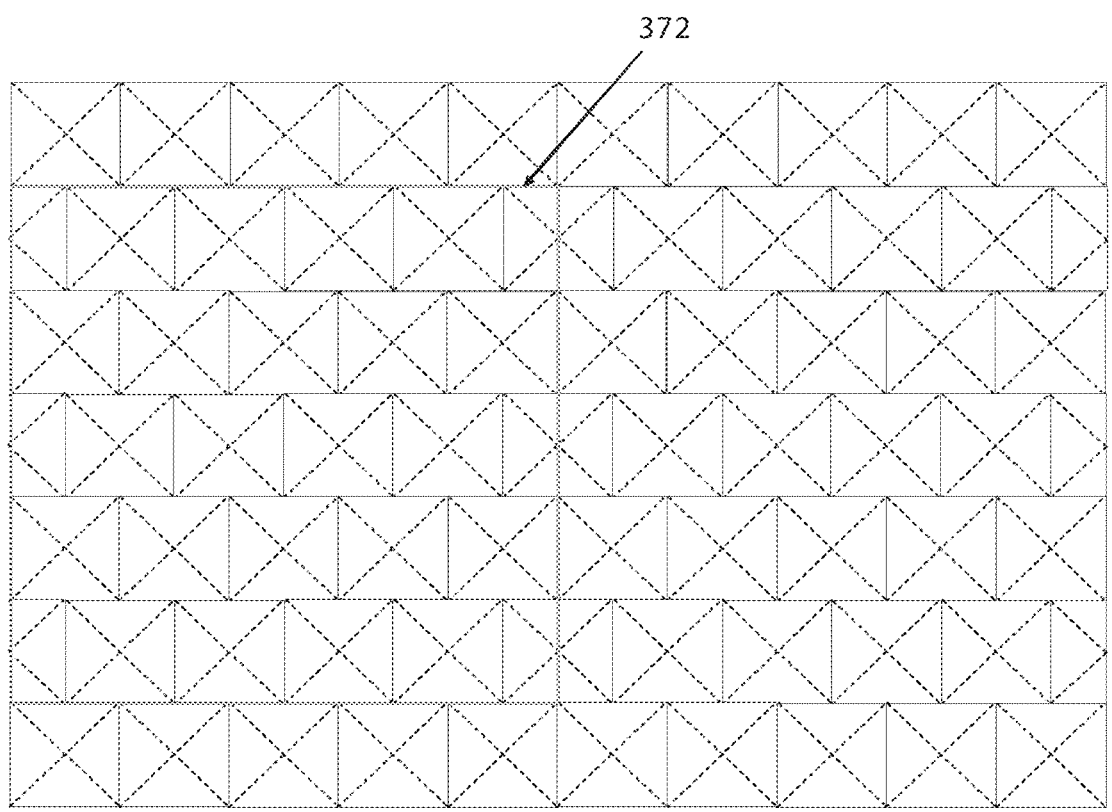
FIG. 22 depicts a top view of the photodetector array shown in FIG. 21.
Figure 23:
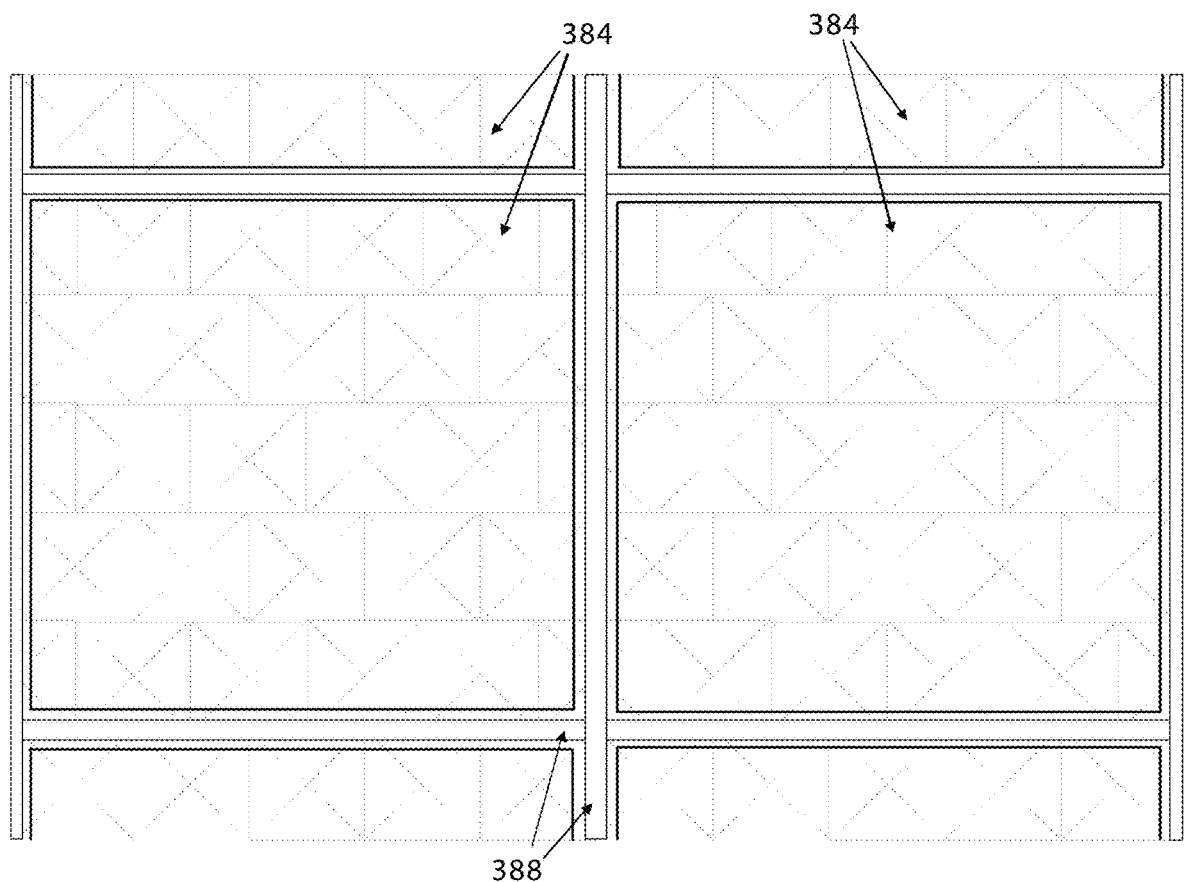
FIG. 23 depicts a bottom view of the photodetector array shown in FIG. 21.

The contacts 388 may comprise small-area regions that are electrically interconnected by metal lines, as shown in FIGS. 22 and 23. These metal lines are preferably located near the periphery of a detector pixel. The metal interconnect lines connect the contacts 388 to one or more bond pads 384 for the electrical common, with those common bond pads 384 preferably located near the periphery of the array. FIG. 22 depicts a top-side view of the detector array 370, whereas FIG. 23 depicts a bottom-side view of the detector array 370. When viewed from the top side (FIG. 22), the detector array 370 looks like a collection of multiple pyramids with each pyramid further containing many pillars. None of the contacts or the metal interconnects are visible from the top side in this embodiment. Thus, there is no obstruction to the incident light 380 that could potentially prevent the incident light 380 from being absorbed by the absorber pillars 376. Also, since the top-side surface passivation material 392 is optically transparent at the wavelengths of interest, there is minimal attenuation of that incident light 380 before that light reaches the absorber pillars 376.

Figure 24A:
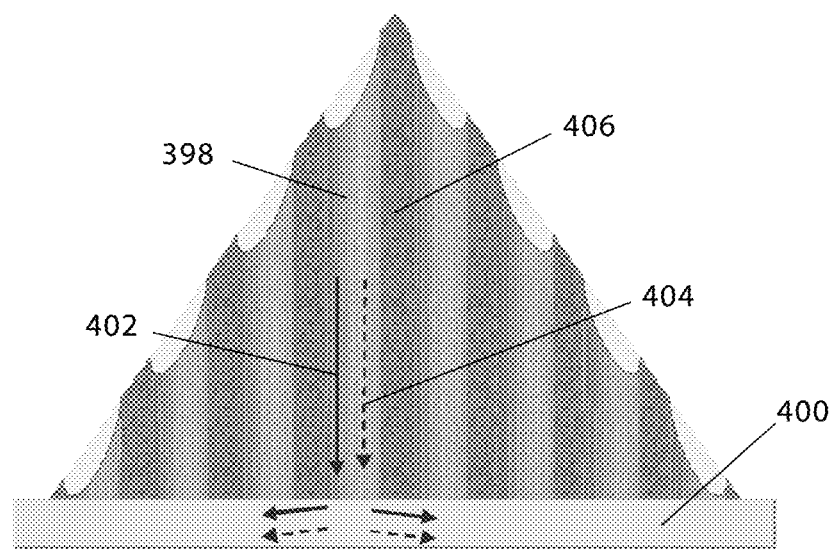
FIG. 24a depicts flow of electrical carriers with low-index dielectric fill-in according to the present disclosure.

The fill-in regions between the absorber pillars 376 may contain a material 392 with low refractive index or air (un-filled). Alternatively, the fill-in regions may contain material 392 with high refractive index, with an index value close to that of the absorber pillars 376. Referring to FIG. 24a, the low-index material 406 is a dielectric that does not conduct electrical current. Thus the photo-generated minority carriers 402 and majority carriers 404 flow vertically through a pillar 398 downward to the base layer 400. The carriers 402 and 404 may then flow laterally in the base layer 400 to the various extractor regions (not shown), through which the photo-generated minority carriers 402 are collected. The need to provide sufficiently low resistance paths for the electrical current constrains the diameter of the pillars 398 and the thickness of the base layer 400 to be sufficiently large. In an exemplary embodiment, a pillar diameter of 1 micrometer with a maximum pillar height of 5 micrometers may be sufficient. Also, a base-layer thickness of 0.5 micrometers for a pixel size of 20 micrometers may also be sufficient.

Figure 24B:
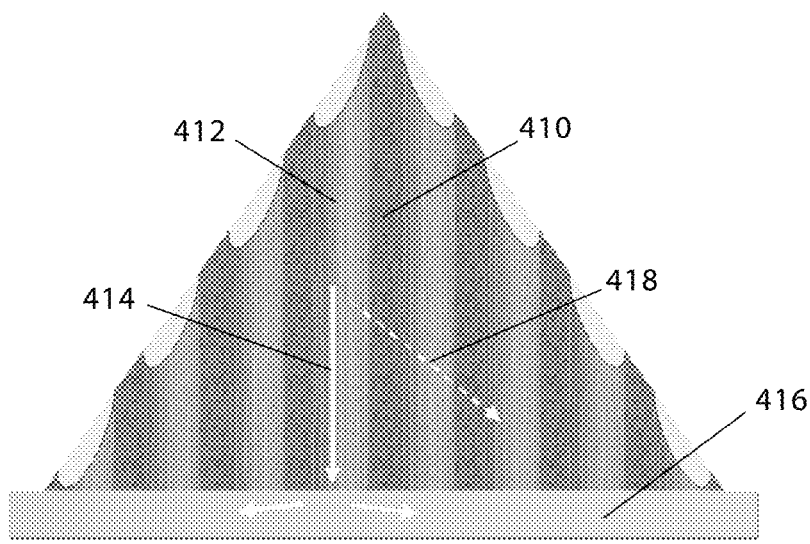
FIG. 24b depicts flow of electrical carriers with high-index dielectric fill-in according to the present disclosure.

FIG. 24b depicts an alternative construction of a pillared pyramid. In this exemplary embodiment, the fill-in regions between the pillars 412 contain a semiconductor material 410 that is transparent to the incident light to be detected. This fill-in material 410 has a large band gap so that light is not absorbed by the typical inter-band processes. As shown in the FIG. 24b, the photo-generated minority carriers 414 flow downward through the pillars 412 to the base layer 416. Those minority carriers 414 can then flow laterally in the base layer 416 to the extractor regions (not shown). The photo-generated majority carriers 418, are able to flow laterally through the pillars and through the fill-in regions 410. The fill-in regions 410 need not completely fill all of the space between the pillars 412 but at least should form a physically contiguous path for the flow of the majority carriers 418. By providing this lateral majority-carrier 418 flow in the pyramidal structure, the thickness of the base layer 416 can be made much thinner since those majority carriers 418 do not flow entirely in the base layer 416 to their contacts (not shown).

The semiconductor material of the pillars 412, 398, the fill-in 410 and the base 400, 416 should efficiently conduct or transport the photo-generated majority and minority carriers without having those carriers recombine while in those regions. For example, consider the illustration in FIG. 24b of the photo-generated minority carriers 414 flowing through pillars 412 and base 416 to the extractor regions (not shown) that are located on the back side of the base 416. A metric that can be used to describe this efficiency of carrier transport is the diffusion length, which depends on the carrier mobility and carrier lifetime. In general it is desirable to have the diffusion length for the minority carrier be substantially greater than the height of the pillars, the thickness of the base layer and the width of the pyramid. High-quality crystalline materials of semiconductors such as InAs, InAsSb and GaAlAsSb can have minority-carrier diffusion length greater than micrometers or even tens of micrometers. The light-absorbing pillars 412, 398 may comprise lightly doped material so that the minority-carrier lifetime in such material may be longer, to increase the minority-carrier diffusion length. A doping level such as $10^{15}$ cm$^{-3}$ to $10^{17}$ cm$^{-3}$ generally may be suitable. The electrical transport by the majority carriers in a region generally is quite effective because of the much higher carrier concentration of those majority carriers.

Figure 25A:
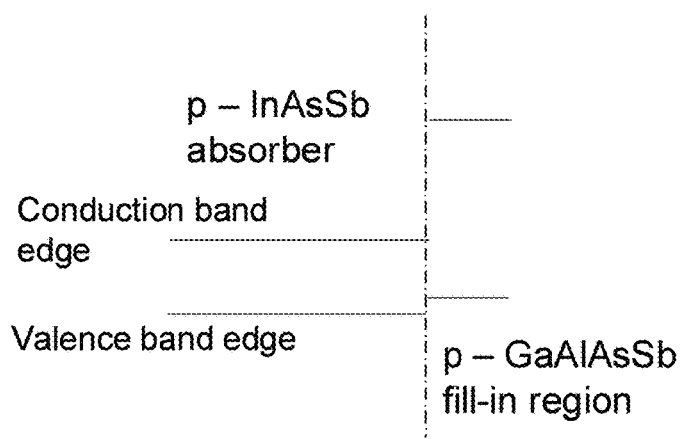
FIG. 25a depicts electronic energy band alignment in detector with high-index semiconductor fill-in with "flat band" condition according to the present disclosure.
Figure 25B:
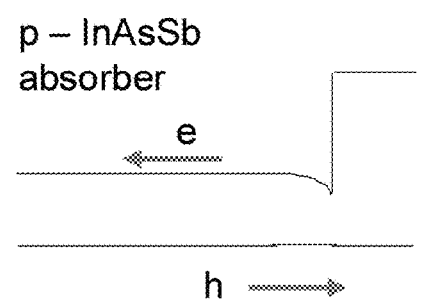
FIG. 25b depicts electronic energy band alignment in detector with high-index semiconductor fill-in with band bending when absorber and fill-in are at the same Fermi level according to the present disclosure.

The electronic energy-band structures of the high-index fill-in material and the absorber material preferably have a staggered alignment such as the ones depicted in FIG. 25a. In one exemplary embodiment, the absorber may be p-type and comprise InAsSb material that is lattice matched to GaSb material. The fill-in may be also p-type and comprise GaAlAsSb material that is lattice matched to GaSb material. These materials form a Type II energy band alignment, as illustrated in the FIG. 25a. When those two materials are in contact with each other, the energy band in at least one of those materials will bend near their interface. FIG. 25b depicts an exemplary design in which the band bending occurs primarily in the absorber material and there is slight accumulation rather than depletion of carriers at the interface. This suppresses the contribution to the dark current by generation-recombination processes that could otherwise occur in a junction depletion region. Since the overall area of the interface between the absorber pillars and the fill-in regions is so large, this aspect of the dark current could be significant, if not suppressed.

Figure 26:
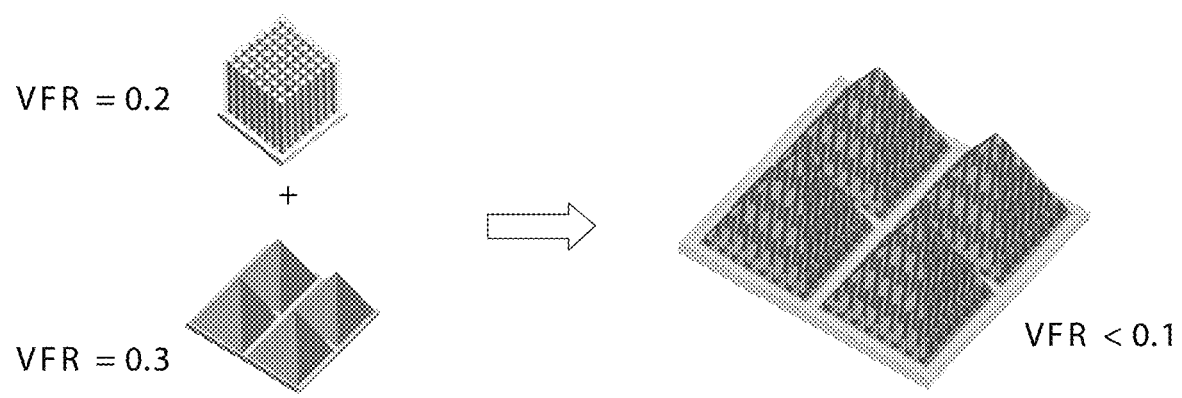
FIG. 26 depicts an outline of detector fabrication approach involving definition of pillars and fill-in followed by definition of pyramidal outline.

The fabrication of the detector array 370 involves first the formation of an ensemble of pillars and then the filling in of the regions between those pillars. Then, the pyramidal outline is etched into the structure, as illustrated in FIG. 26. The ensemble of pillars can have a reduced volume of absorber material, with the volume-fill-ratio (VFR) of the pillar ensemble in general being 0.5 to 0.2. The VFR is the relative amount of the equivalent planar structure that is occupied by absorber material. The VFR of a pyramidal structure is generally 0.25-0.4, depending on the thickness of the base layer. A pyramidal structure with pyramids whose bases abut and which does not have an additional base layer has a VFR of 0.33. By imposing a pyramidal outline onto the ensemble of pillars, the VFR can be further reduced to being less than 0.2 or even less than 0.1. At temperatures of 130 K and above, the main contribution to the dark current, which determines the signal-to-noise behavior of an infrared detector, is the thermally generated carriers from the absorber material. Thus, the dark current can be reduced by reducing the volume of the absorber. Since the dark current is due mainly to thermal generation (or SRH generation) in the narrow-bandgap absorber material, reduction of the absorber volume can serve to reduce the dark current and, thereby, improve the detectivity, D*, of the infrared detector.

FIGS. 27a-27f depicts an exemplary fabrication process for constructing the detector array 370 according to the present disclosure. FIG. 27a depicts epitaxial growth of the extractor material 430 and the absorber material 426. In one exemplary embodiment, the extractor material 430 may be a p-type material such as InAlSb material that is grown on InSb substrate wafer 428 or GaSb material or InAsSb material grown on GaSb substrate wafer 428. The absorber material 426 may be an n-type material such as InAlSb material grown on InSb substrate wafer or InAsSb grown on GaSb substrate wafer. An optional stop-etch layer (not shown) may be grown between the extractor 430 and the substrate 428. In an exemplary embodiment, the stop etch material may be InAsSb, for GaSb substrates. Further, an optional separate base layer (not shown) may also be grown between the layers of absorber 426 and the extractor 430 materials. After growing these planar layers, the pillars 432 may be patterned, by such an exemplary means as photolithography, and the pillars may also be etched, by such exemplary means as reactive ion etching, into the absorber layer 426, as shown in FIG. 27b. If there is a separately grown base layer, the pillar etching stops when that base layer is reached. If there is no separately grown base layer, the pillar etching is stopped before the extractor layer 430 is reached so as to leave a portion of the grown absorber material 426 to act as a base layer. The regions between the pillars 432 are then filled in with the fill-in material 434, as shown in FIG. 27c. The deposition of the fill-in material 434 can be done by means such as sputter deposition processes, spinning on and then hardening of viscous liquids, or growth by methods such as metal organic chemical vapor deposition. The fill-in material 434 may then be planarized to be approximately level with the tops of the pillars. Referring to FIG. 27d, the pyramids are etched into the top side of the wafer, etching through portions of the absorber pillars 432 and the fill-in material 434 using methods described below with reference to FIGS. 32a-32l.

In one exemplary embodiment, a surface-passivation film may be deposited onto the sidewalls of the pillars (not shown) before they are covered by the fill-in. In another exemplary embodiment, a surface-passivation film 436 may be deposited onto the sloped sidewalls of the etched and filled-in pyramidal structures as shown in FIG. 27d. This passivation film 436 passivates the surface states of the exposed absorber pillars 432. After the surface passivation 436 is deposited, a layer of removable planarization material (not shown) such as a spin-on glass or polymer may be deposited over the pyramids and then it may be planarized. The top side of the wafer may then be attached to a handle wafer 438 using known methods. The handle wafer 438 serves as a temporary surrogate substrate for the detector array since the substrate 428 on which the epitaxial layers were grown is removed next by a combination of lapping and/or polishing plus etching process, as shown in FIG. 27e. After the original substrate 428 is removed, the backside of the detector is exposed for the backside processing. The backside processing may include patterning and etching the extractor regions, patterning and depositing the ohmic contacts to the extractor and the absorber (not shown). The backside processing may also include depositing and patterning the dielectric surface-passivation film and depositing and patterning the bond pads and the metal interconnect lines (not shown). The detector array, with backside bond pads exposed, is now ready for bonding to the read-out electronic circuit (not shown). After that bonding is completed, the handle wafer 438 may be removed. In one exemplary embodiment, the planarization material 436 covering the pyramids may also be removed. The results is a thin detector array structure whose back side is bonded to the read-out circuit and whose front side is exposed, available for capturing and detecting the incident light. This process is further described below with reference to FIGS. 32a-32l.

FIGS. 28a-28g depict another exemplary process for fabricating the detector arrays 370 according to the present disclosure. Referring to FIG. 28a, a layer of extractor material 454 and the base layer 452 are grown epitaxially onto the substrate wafer 450. A film of a growth-masking material 456 such as silicon dioxide may then be deposited and patterned, as shown in FIG. 28b. Using a process such as, for example, selective-area growth by metal-organic chemical vapor deposition, additional epitaxial material can be grown in the areas where the growth-mask has been removed but there is not material grown over the areas where the growth-mask is present. If the growth mask has a set of holes, the selective-area growth produces a set of pillars 458 aligned over those holes, as shown in FIG. 28c. By adjusting the pressure of the growth chamber and the partial pressures, flow rates and compositions of the reactants for the growth, tall pillars with high aspect ratio may be formed. After the pillars 458 are formed, the sides, and also the tops, of the pillars may be covered with another material 460, as shown in FIG. 28d. By using a different set of deposition conditions such as pressures and flow rates, the covering and fill-in material 460 can be made to grow laterally, over the regions covered by the growth-mask 456. The sides of the pillars 458 serve as the seed regions for this lateral overgrowth. The covering material may have a larger bandgap than the absorber. Also, the covering material may have an energy band alignment that facilitates the flow of the majority carriers, as discussed above. The laterally overgrown material surrounding each pillar 458 may touch and merge with the laterally overgrown material 460 of at least one adjacent pillar. In this way, a continuous path is provided for flow of carriers.

The remaining steps for the fabrication process are similar to the steps discussed above in relation to FIGS. 27d-27f. In an exemplary embodiment, if the handle wafer and the planarization layer above the pyramids both are transparent to the light to be detected, the detector array may be tested while it still is mounted onto the handle wafer. The light can be shone onto and through the handle wafer and the bond pads on the back side of the array are available for probing of the output currents.

Figure 29A:
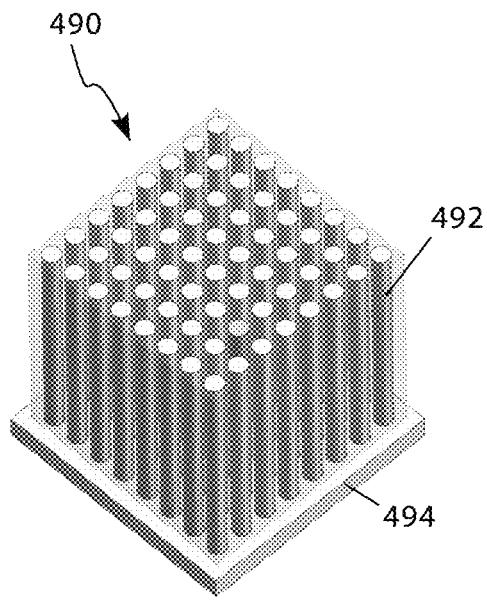
FIG. 29a depicts a detector with rod-shaped absorber pillars according to the present disclosure.

Instead of shaping the heights of the pillars according to a pyramidal outline as discussed above, it may also be possible to just use an ensemble of pillars that have substantially the same height. In an exemplary embodiment, an ensemble of rod-shaped pillars 490 is illustrated in FIG. 29a. The fill-in material could have a low refractive index, as discussed above in relation to the pyramidal pillars. The rods 492 lie on a base layer 494 such as the ones described above for the pillar ensembles with pyramidal outline. The backside of the base layer can have the extractor regions and Ohmic contacts formed on them (not shown). Also, a metal reflector covers the back side of the base layer so that the incident light can make several passes through the rod-like absorbers (not shown).

Figure 29B:
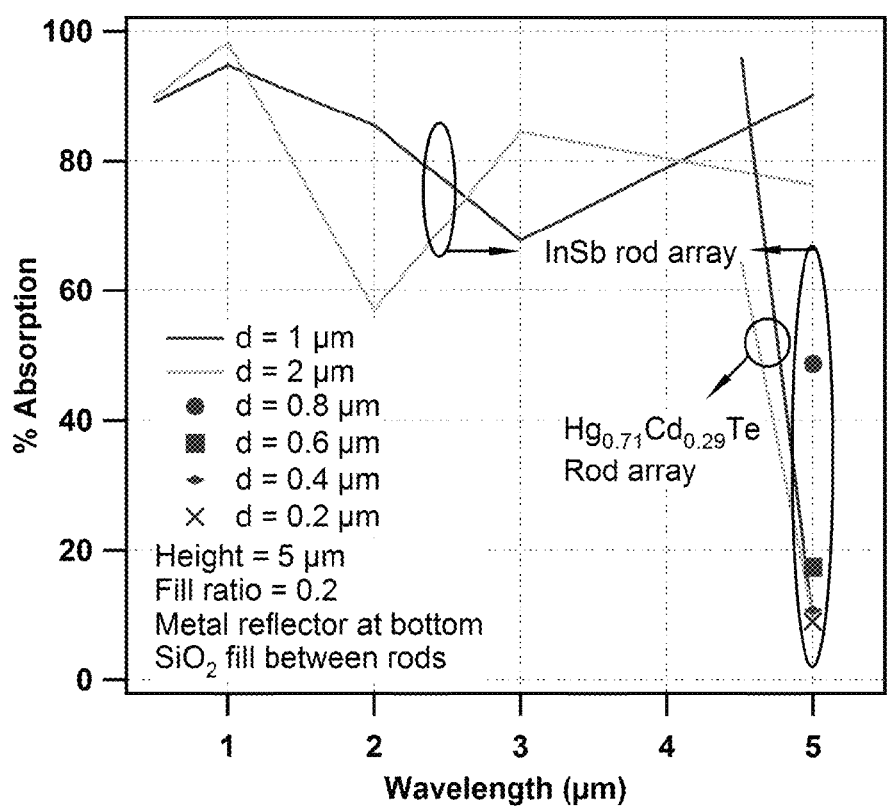

FIG. 29b shows results of simulations done using HFSS, an electromagnetic field simulation tool from Ansoft Corporation. The simulations considered various diameters of rods, ranging from 0.2 micrometers to 2.0 micrometers. The center-to-center spacing between rods is twice the diameter. Thus, the rods occupy approximately 20% of the total volume of the equivalent slab containing those absorber pillars (i.e., the volume fill ratio is 0.2). For incident light of 5 micrometer wavelength, the amount of light that is absorbed by the structure 490 increases as the diameter of the rod 492 is increased, up to a diameter of 1 micrometer. FIG. 29b also shows simulation results for rods of 1 or 2 micrometer diameter. The absorbance for incident light of wavelengths between 0.5 and 5.0 micrometers is calculated, assuming rod formed from InSb or HgCdTe absorber materials. The absorbance is quite high, generally >70%, for these larger diameter rods. Note that the bandgap of the HgCdTe material considered in these simulations allows that absorber to absorb light of 4.5 micrometer wavelength but be nearly transparent to 5.0 micrometer light. Thus, the calculations for this HgCdTe illustrate the effects of absorber bandgap.

Figure 30:
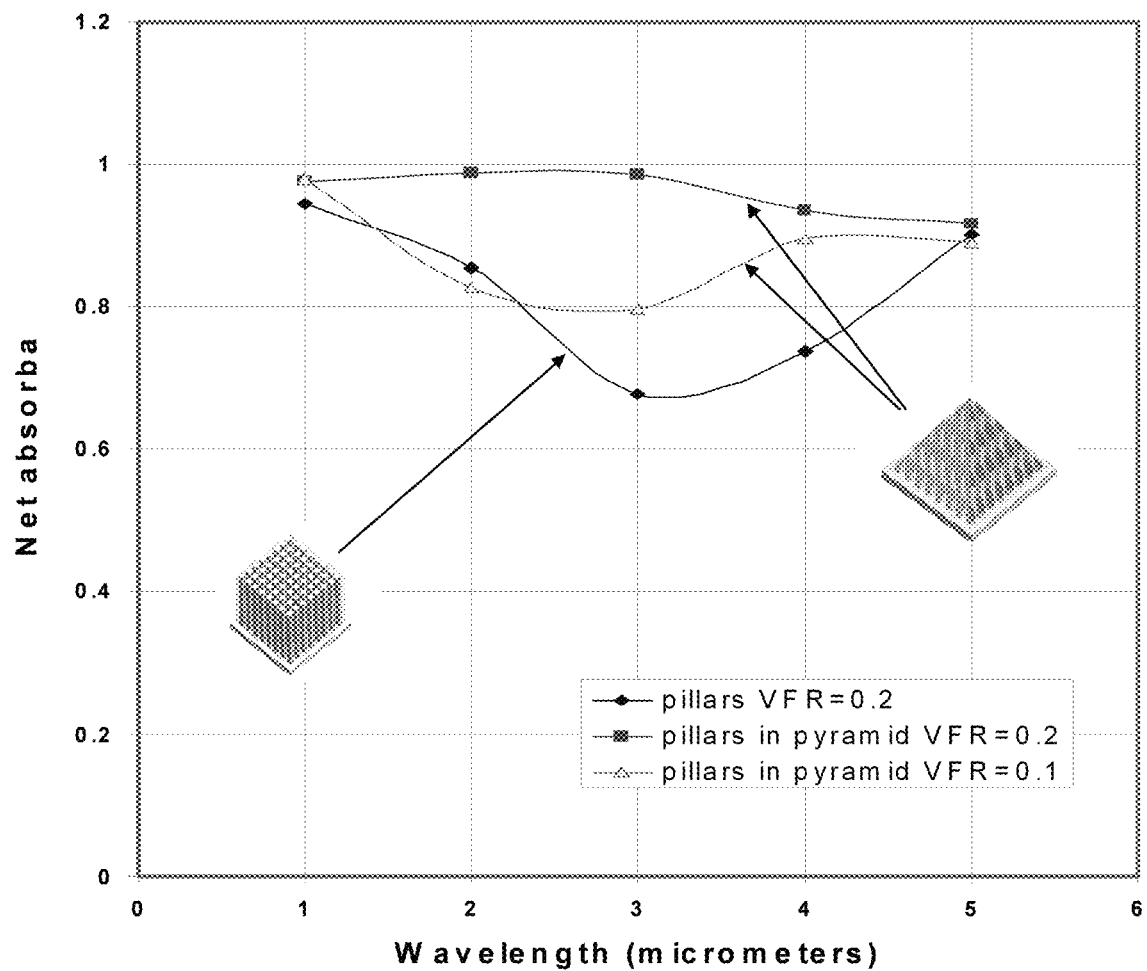
FIG. 30 depicts simulation results illustrating effect of absorber volume fill ration on detector absorbance.

FIG. 30 compares the absorbance of a detector with pillars having the same height 500 and the absorbance of detectors with pillars whose heights follow a pyramidal outline 510. The pyramidal outline reduces the volume fill ratio by approximately another 33%. Thus, in order to achieve a comparable volume fill ratio with pyramidal pillars 510, the spacing between those pillars can be reduced, compared to the spacing used when the pillars have uniform height 500. The HFSS results in FIG. 30 show that for a given volume fill ratio of 0.2, a pillar ensemble with a pyramidal outline 510 has greater net absorbance, and over a larger range of incident wavelengths, than an ensemble of uniform height pillars 500. In fact, the volume fill ratio of the pyramidal pillars 510 can be reduced even further to 0.1 and still achieve higher absorption (and thus high detection efficiency) than the uniform-height pillars 500.

Figure 31:
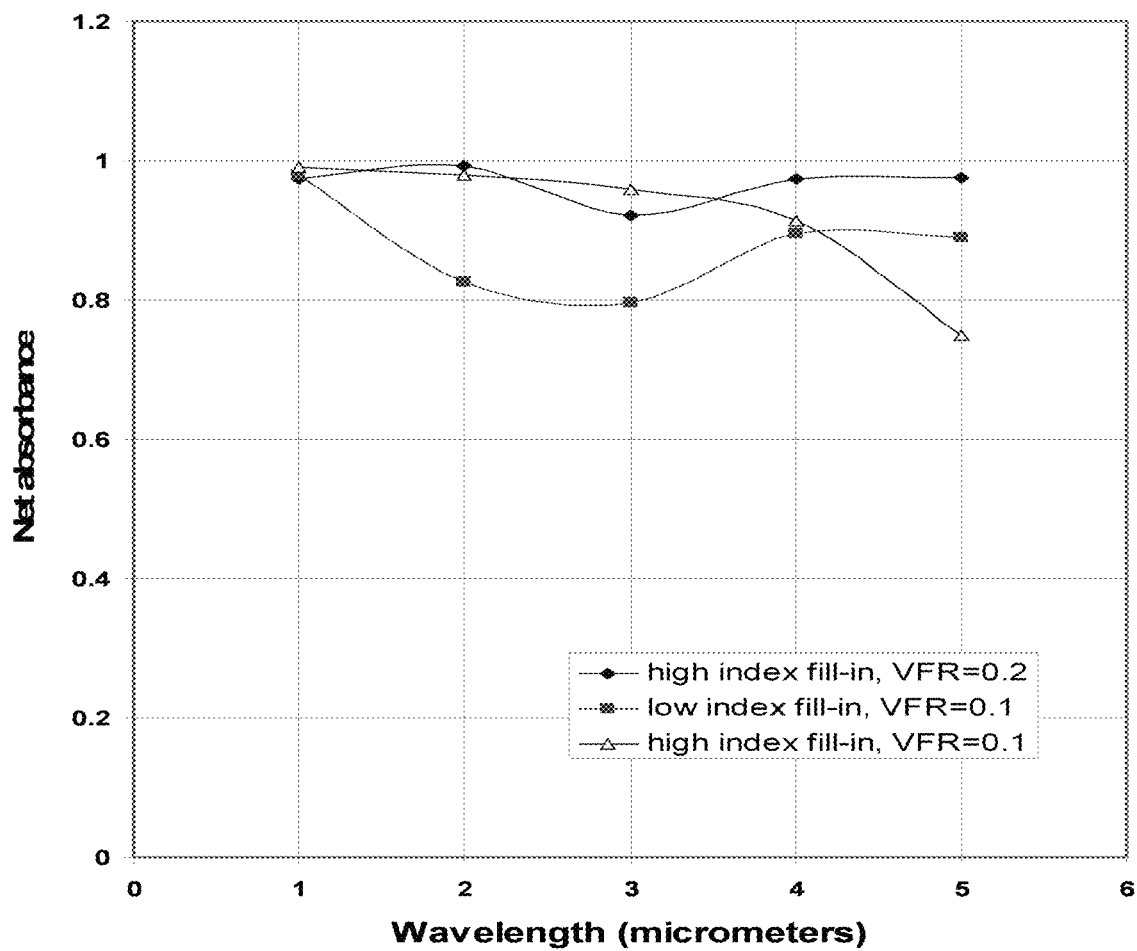
FIG. 31 depicts simulation results illustrating effect of fill-in refractive index on detector absorbance.

FIG. 31 depicts HFSS simulation results for pyramidal pillars that have a high-index fill-in material. As can be seen, when the volume fill ratio is 0.2, the absorbance of the structure can be greater than 90% over a large range of incident wavelengths. The absorbance for some wavelengths in that range degrades, to 80% or lower, when the volume fill ratio is further reduced to 0.1. These calculations, and the calculations of FIG. 30, assume an InSb absorber material and do not include an absorbing base layer. Instead, a metal reflector is placed directly at the base of the pyramidal pillars 510.

As shown by the simulation results presented in FIGS. 29b-31, a detector with an ensemble of absorber pillars can achieve high absorption of the incident light having a large range of wavelengths (e.g., between 1 and 5 micrometers). A conventional detector with a slab of absorber material of the same overall thickness has absorption between 58% and 68% over this same range of wavelengths. The pillared absorbers achieve more efficient absorption and yet have much smaller volume of absorber material. Thus, a detector with the pillared absorbers should have much lower dark current than a conventional detector. The detectivity of an infrared detector is proportional to the square root of the absorption efficiency and is inversely proportional to its dark current. Thus, the disclosed detectors and detector arrays with absorber pillars can achieve detectivity that is several times greater than obtainable with conventional detectors having planar absorber regions. Also, that high detectivity is achieved over a much larger span of wavelengths for the incident light.

FIGS. 32a-32l depict additional exemplary steps in an exemplary fabrication process for fabricating the detector array and attaching that detector array to the read-out integrated circuit as described above. The following fabrication process is suitable for all of the embodiments disclosed herein of the pillared detector array. For clarity, FIGS. 32a-32l depict pyramids as being solid instead of having pillars. However, this is done for clarity purposes only and this process applies to pillars of different heights that form a pyramidal outlines.

Figure 32A:
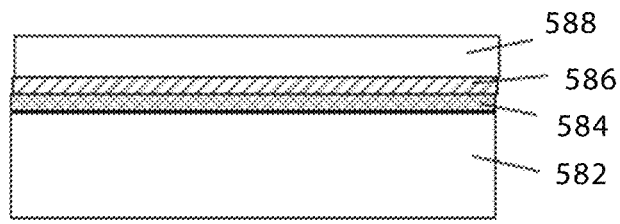

Referring to FIG. 32a, using epitaxial growth technique such as molecular beam epitaxy or metal-organic chemical vapor deposition, an optional stop etch layer 584, an extractor layer 586 and then the absorber layer 588 are formed on a substrate wafer 582. In one exemplary embodiment, for detection of optical wavelengths of 4-5 μm and shorter, the substrate wafer 582 may be composed of GaSb material, the optional stop etch layer 584 may be composed of AlGaSb material, the p-doped extractor layer 586 may be composed of InAsSb material, and an n-doped absorber layer 588 may be composed of InAsSb material. In another exemplary embodiment, the substrate wafer 582 may be composed of GaSb material, the optional stop etch layer 584 may be composed of AlGaSb material, the n-doped extractor layer 586 may be composed of InAsSb material, and the p-doped absorber layer 588 may be composed of InAsSb material. Lattice matched $InAs_{0.9}Sb_{0.1}$, for example, provides absorption of wavelengths of 4.7 μm and shorter when operated at 300K temperature and absorption of wavelengths of 4.3 μm and shorter when operated at 200K temperature.

For detection of wavelengths as long as 5.0 μm at 200K temperature, material such as $InAs_{0.8}Sb_{0.2}$, having substantial lattice mismatch (approximately +0.7%), could be used. Another alternative to InAsSb is to use a Type II superlattice consisting of InAs/GaSb material for the absorber 588. Another example of a suitable substrate 582, for detection of >5.0 μm wavelength light, is InSb material. The optional stop etch layer 584 could be a thin layer of InAlSb material. The extractor 586 and absorber 588 could be composed of doped InSb or InAlSb material.

Other examples of extractor 586 materials include extractors 586 composed of multiple layers of semiconductor material. In one exemplary embodiment, the extractor 586 for an n-type InAsSb absorber 588 could be composed of layers of n-type GaAlAsSb and p-type GaSb materials. Such a structure facilitates the flow of the photo-generated electrons away from the extractors 586 and to the ohmic contact of the absorber 588. Such a structure also is effective in reducing the dark current that arises from the depletion layer between the absorber 288 and extractor 586, as discussed in an article by P. Klipstein ("XBn barrier photodetector for high sensitivity and high operating temperature infrared sensors," Proceedings of SPIE, vol. 6940, paper 69402U-1), which is incorporated herein by reference. In another exemplary embodiment, the extractor 586 for n-type InAsSb absorber 588 could be composed of layers of n-type GaAlAsSb, p-type GaSb and then n-type InAs materials. The use of the additional n-type InAs layer, which forms a Type II energy-gap alignment with the GaSb, permits the ohmic contact for both the extractor 586 and the absorber 588 to be made to n-type, narrow bandgap materials.

Figure 32B:
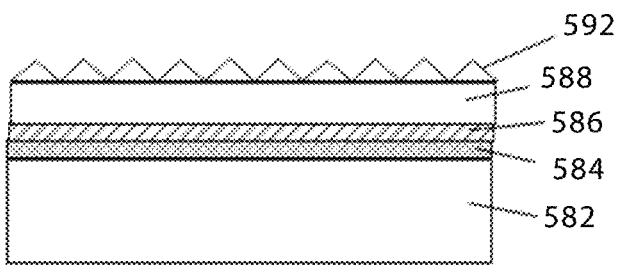
Figure 32C:
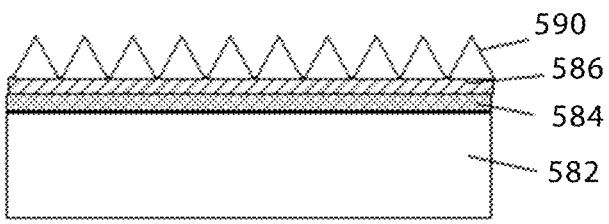

Referring to FIGS. 32b and 32c, pyramidal shapes 590 are formed in the absorber layer 588. An etching process may be used to form pyramidal shapes 590. In one exemplary embodiment, the pyramid shapes 590 are etched by depositing and forming an etch mask 592 that has a pyramid shape. The pyramid outline of the masking material 592 may then be transferred into the absorber 588 by dry etching techniques such as, for example, reactive ion etching or ion beam milling. The height of the masking layer 292 may depend on the dry-etch selectivity between the masking material 592 and the material of the absorber 388. Suitable etch masks 592 may include photoresist, polymers such as benzo-cyclo-butene, and silicon dioxide. A pyramid shape may be formed in photoresist by gray scale lithography. A pyramid shape may be formed in non-photo-definable polymers by means of imprint lithography using a mold that has an inverted pyramid shape. A pyramid shape may be formed in silicon dioxide by using an additional thin mask layer having a square shape and then etching the silicon dioxide with an isotropic wet etchant.

Figure 32D:
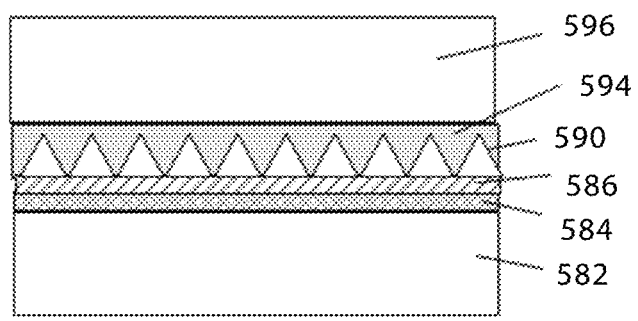

Referring to FIG. 32d, a material 594 is deposited in the spaces between the pyramids 590. In one exemplary embodiment, the material 594 may be composed of spin on glasses or various polymers. The material 594 may then be planarized. An optional adhesion layer (not shown) can be deposited on top of the planarized material 594. Then, a carrier substrate 596 is attached or bonded to the surface of the planarized material 594 or the adhesion layer (not shown). This process is used for wafer transfer.

Figure 32E:
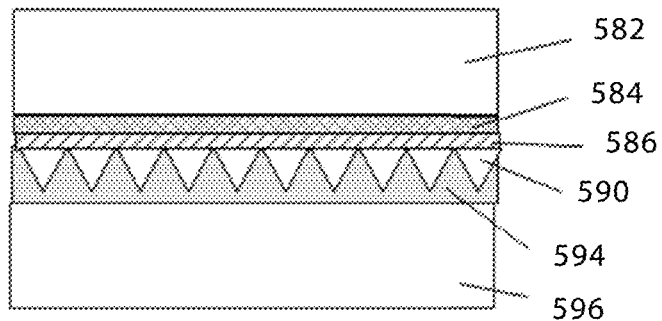
Figure 32F:
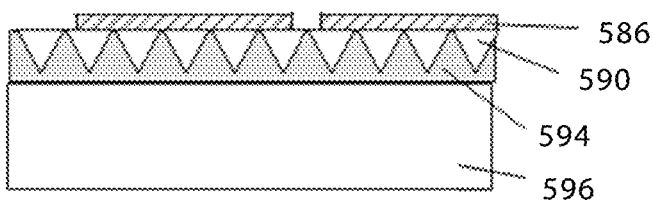

Referring to FIG. 32e, the structure shown in FIG. 32d is turned upside-down. Referring to FIG. 32f, the substrate 582 is removed or etched away as know in the art. The stop etch layer 584 facilitates this substrate 582's removal. The stop etch layer 584 is then also removed by known etching techniques, leaving the extractor layer 586 exposed. The extractor 586 may then be patterned by known photolithography and wet or dry etching methods. In fact, the exposed back side of the absorber layer 588 also can be etched. One exemplary embodiment that makes use of etching the absorber 588 from its back side is discussed below. The back surface of the back-side etched extractor 586 and absorber 588 could have various shapes, including pyramid shapes, as discussed in detail below.

Figure 32G:
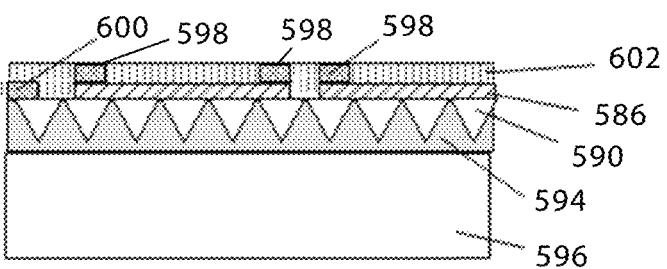

Referring to FIG. 32g, regions of ohmic-contact metals 598 and 500 are then deposited and patterned using exemplary techniques such as evaporation and lift-off or sputtering and etching. Both the ohmic-contact metals 598 for the extractor 586 and the ohmic-contact metal 600 for the absorber 588 may be deposited and patterned at the same time. Following the formation of the ohmic-contact metals 598 and 600, or in some cases before their formation, a film of dielectric passivation material 602 composed of, for example, silicon dioxide, polyimide or benzo-cyclo-butene material is deposited on top of the structure. This passivation material 602 may serve to reduce the amount of surface recombination that occurs in the semiconductor material, and especially at the outer edges of PN junctions.

Figure 32H:
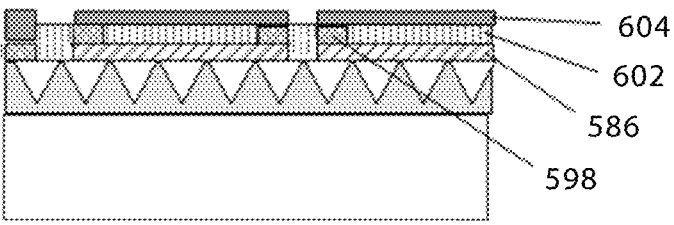

Referring to FIG. 32h, vias may be patterned and etched through the dielectric passivation material 602 to expose certain regions of or for the ohmic-contact metals 598 and 600. Metal bonding pads 604 may then be deposited and patterned. These metal bonding pads 604 can then be used for solder bump 606 bonding of the detector array to the read-out integrated circuit 610, as illustrated in FIGS. 32i-32l.

Referring to FIGS. 32i-32j, once the detector array, held on the carrier substrate 596, is bonded to the read-out integrated circuit 610, the carrier substrate 596 can then be removed. In one exemplary embodiment, a protective layer of material (not shown) such as photoresist may be used to cover and protect the read-out integrated circuit 610, the solder bumps 606 and the bond pads 604 and 608 from the etchant used to remove the carrier substrate 596. Referring to FIG. 32k, after the carrier substrate 596 is removed, the adhesion material (not shown) over the pyramids 590 may also be removed, and the planarization/fill material 594 may be optionally removed as well. Referring to FIG. 32l, in one exemplary embodiment, ohmic contacts (not shown) may be formed on the tips of the pyramids 590 and additional metal interconnects 612 may be deposited on patterned onto the now exposed top side of the detector array.

Exemplary Dimensions for Structures with Pyramids, Pillars and Slab

Optical simulations of the above described devices have shown that certain constraints on the dimensions of the pyramids, the laterally contiguous light-absorbing base portion or slab and the dielectric layer underneath the slab may provide negligible front-side reflection and well as enhanced photon trapping capability. The simulations show that for certain designs, it may be possible, to reduce the front-side reflection to <1% of the incident light. Also, it may be possible to obtain an overall detector absorption efficiency of >90-95%. Exemplary design rules for the dimensions of the pyramids and for the laterally continuous light absorbing slab as well as for the dielectric layer will be described below.

The following description will show that the presently disclosed optical absorber with pyramids whose height (h) is equal to or greater than $\lambda_{max}$ may provide greater wideband absorbance compared to the shallower pyramids whose height (h) is less than $\lambda_{max}/2$ as disclosed in Esteban et al. or of Han and Chen. Also, the following description will show that the preferred width-to-height ratio of 0.3 to 0.5 for the pyramids of the disclosed absorber likewise may provide better wideband absorbance compared to the prior structures of Dutta et al., of Esteban et al., and of Han and Chen, which have a width-to-height ratio of 1.0-1.4. The following description will further show that the pyramids (w~$\lambda_{max}/2$) of the presently disclosed optical absorber provide better wideband absorbance compared to the prior narrow pillars (w~$\lambda_{min}$) of Hu and Chen, of Garnett and Yang, and of Dutta et al. Finally, the following description will show that it may be possible to achieve absorbance (normalized with respect to the amount of incident light) of over 0.90 over a large, decade wavelength range even though the overall thickness of the structure is less than $2\lambda_{max}$, which is much thinner than the overall thickness of $5\lambda_{max}$ to $7.5\lambda_{max}$ characteristic of the prior art solar cells and detectors.

In one exemplary embodiment, the objective of the presently disclosed light-absorbing and light-detecting structures is to achieve a wideband detector response and to greatly reduce the front-side reflection of the incident light. In another exemplary embodiment, the objective of the presently disclosed absorber and detector is to have a small volume of absorber material as well as a small overall thickness of the light-absorbing structure. At the same time, the overall absorbance should be very high, and thus the absorbance per unit volume of absorber material is large.

In one exemplary embodiment, absorbers for light covering the range of visible, near infrared (NIR), short-wave infrared (SWIR) and mid-wave infrared (MWIR) wavelengths, spanning from 0.5 µm to 5.0 µm were considered. In this exemplary embodiment, the real part of the absorber material's dielectric constant is approximately 12.24 over the entire wavelength range. The imaginary part of the absorber material's dielectric constant, which characterizes the absorption by the absorber material, varies from a value of 0.8 for a wavelength of 0.5 µm to a value of approximately 0.5 for a wavelength of 5.0 µm. The refractive index is approximately equal to the square root of the real part of the absorber material's dielectric constant. Three different software simulation tools were used to simulate the disclosed wideband absorber. One tool is the commercially available HFSS™ from Ansoft, which utilizes a 3-dimensional, full-wave finite element method to compute and visualize the electromagnetic fields (both near-field and far-field). Although HFSS is typically used to analyze microwave and millimeter-wave antennas and electronic circuits, it was adapted for use in the optical domain. The HFSS was used to calculate the amount of light reflected from the detector structure and also the amount of light absorbed by the structure. Another tool is the commercially available Comsol Multiphysics finite-element-method simulator. This tool may be used to calculate the absorbance (electromagnetic energy loss) for and the energy storage in specific regions of the simulation space, as well as the flux of the electromagnetic field through specific surfaces of that simulation space. A third tool is MEEP (MIT Electromagnetic Equation Propagation), which is a finite-difference time-domain simulation software package developed by MIT to model electromagnetic (EM) systems. MEEP obtains EM-field scattering amplitudes over a wide spectrum of optical wavelengths by Fourier-transforming the calculated time response to a short input pulse. For the MEEP simulations, the entire 0.5 µm to 5.0 µm wavelength spectrum is divided into 14 parts; for each part, a Gaussian-shaped time-pulse is used as the input light source. The MEEP and Comsol simulations were performed by Dr. Weitao Dai of MIT under the direction of Dr. Yap of HRL. The HFSS simulations were done y Dr. Mehta and Dr. Yap of HRL.

Figure 33A:
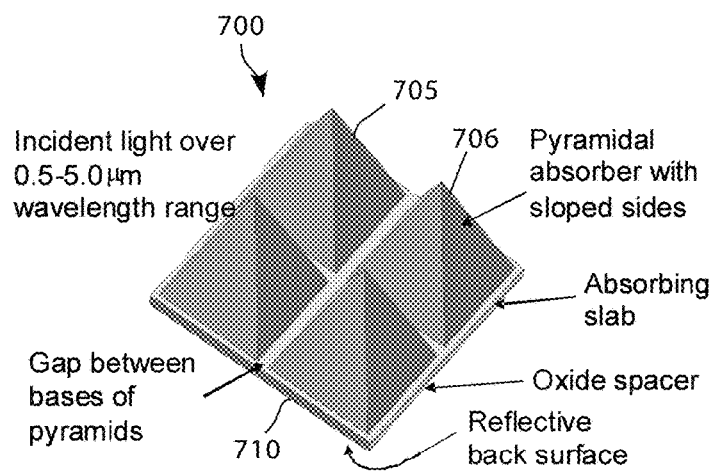
FIGS. 33a-b depict an exemplary embedment of a detector according to the present disclosure.
Figure 33B:
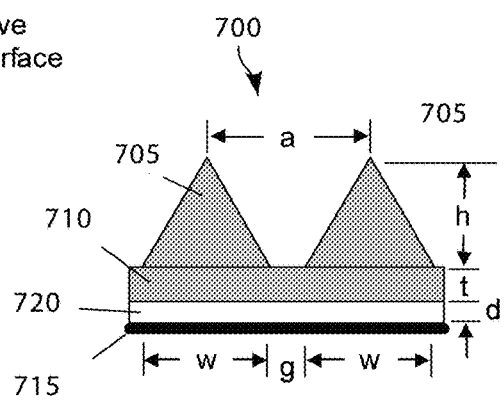

FIGS. 33a-b depict an exemplary basic optical absorber and detector structure 700 that was simulated using the above described tools. The absorber and detector structure 700 comprise an array of light-absorbing solid pyramids 705 disposed above a light-absorbing laterally continuous base or slab layer 710. Light is incident from the direction of the tips of the pyramids 705. The bases of adjacent pyramids 705 may touch each other or there could be some gap g between the bases of those adjacent pyramids 705 as shown in FIGS. 33a-b. The backside of the detector structure, i.e., the side facing away from the incident light, may be covered with a metal layer 715 that may reflect any un-absorbed light back into the light-absorbing slab layer 710 of the absorber and detector structure 700. There may also be an optional non-absorbing, low-refractive-index spacer layer 720 located between the light-absorbing slab layer 710 and the metal layer 715. The metal layer 715 together with the sloped sidewalls of the pyramids 705 can result in the occurrence of multiple passes of the light through the pyramids 705 and the light-absorbing slab layer 710. When there are more than two passes of that light, the absorber and detector structure 700 may be considered as exhibiting enhanced photon trapping behavior.

FIG. 33b also shows the key geometric parameters of the absorber and detector structure 700. These parameters are the center-to-center spacing a of the pyramids 705, the base width w and height h of a pyramid 705, the thickness t of the light-absorbing slab layer 710, the thickness d of the spacer layer 720, which for the simulations was assumed to comprise silicon dioxide, and the gap g between adjacent pyramids 705. The values of these parameters were varied systematically during simulations.

A detector model called a "bottomless" structure (not shown) configured for determining the single-pass absorption as well as the front-side reflection was also simulated and results were compared to the results obtained for the absorber and detector structure 700.

Figure 34A:
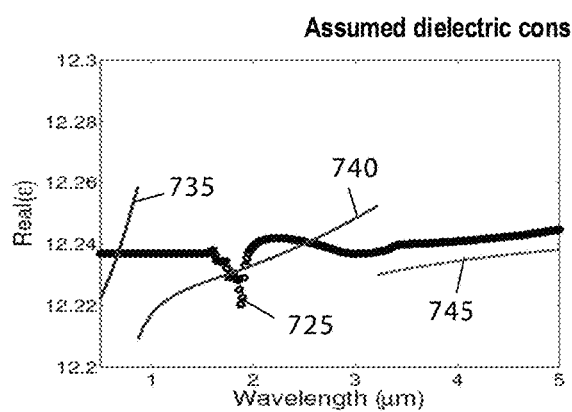
FIGS. 34a-b depict a model for complex dielectric constant of the light-absorbing material according to the present disclosure.
Figure 34B:
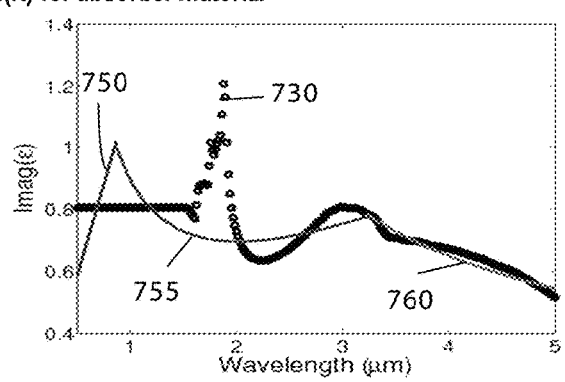

FIG. 34a depicts the real and FIG. 34b depicts the imaginary components of the complex dielectric constant that was assumed for the simulations. For the Comsol simulations, the values indicated by the dotted curves 725, 730 were used to represent the light-absorbing slab layer 710. For the Meep simulations, the complex dielectric constants $\varepsilon(\lambda)$ for the various materials in the disclosed light-absorbing slab layer 710 were approximated as summations of three Lorentz functions. The thin solid lines 735, 740, 745, 750, 755, 760 in the plots of FIGS. 34a-b show the functions assumed for the material of light-absorbing pyramids 705 and slab layer 710. The high-index material for the transparent regions of the pyramid and for the "bottomless" structure is represented by the curves for Real $\varepsilon(\lambda)$ shown in the FIG. 34a and by setting Imag $\varepsilon(\lambda)=0$.

Figure 35A:
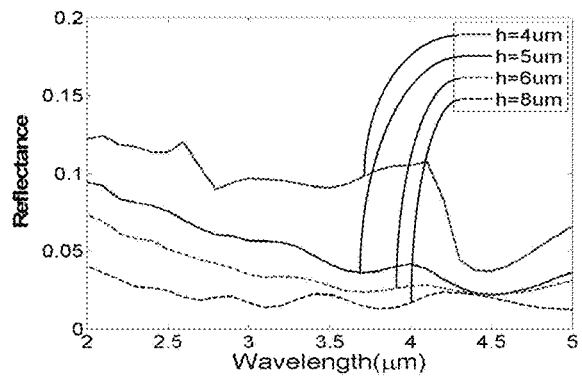
FIG. 35a depicts calculated reflectance of "bottomless" structure in which the pyramid height is varied according to the present disclosure.
Figure 35B:
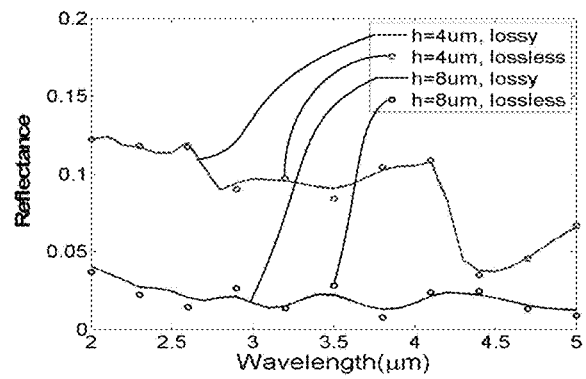
FIG. 35b depicts comparison of structures with absorbing or "lossy" material and structures with non-absorbing or "lossless" material according to the present disclosure.

FIG. 35a depicts the reflectance calculated using Comsol for a "bottomless" structure for which the height h of the pyramid was varied. The results demonstrate that the front-side reflectance decreases as the pyramid's height is increased. The reduced reflectance results from the steeper slope of the pyramid sidewall. FIG. 35b depicts results calculated for the "lossless" case, when the value of the imaginary part of the dielectric constant was set to zero. The results for the "lossy" case (when the material absorption is non-zero) and for the "lossless" case are almost identical.

Figure 36A:
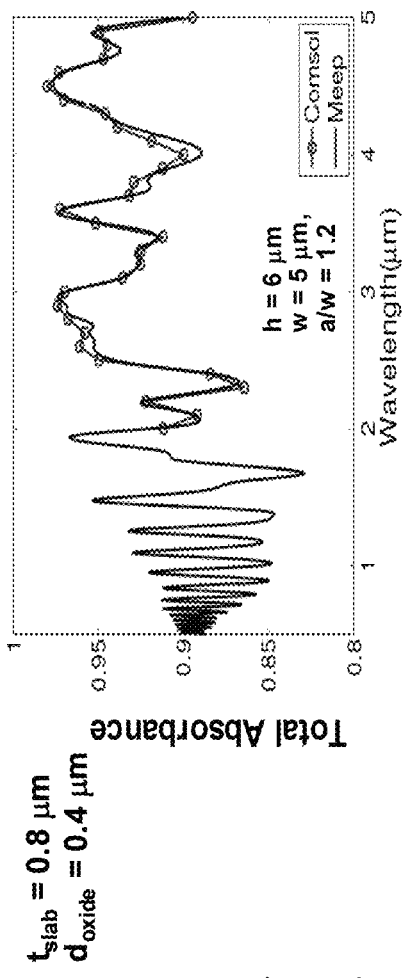
FIGS. 36a-b depict front-side reflectance and total absorbance of detector structure having w pyramids according to the present disclosure.
Figure 36C:
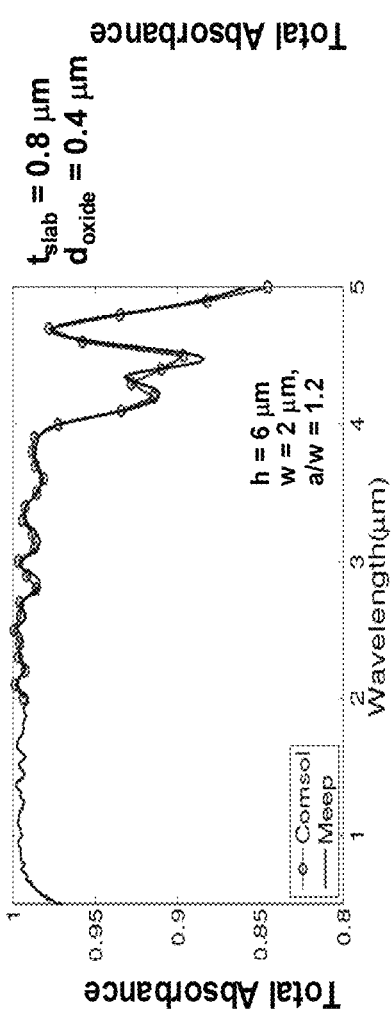
FIGS. 36c-d depict front-side reflectance and total absorbance of detector structure having wide pyramids according to the present disclosure.
Figure 36B:
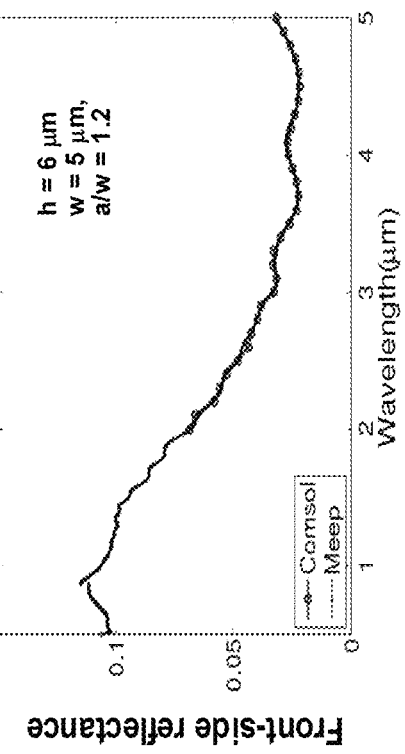
Figure 36D:
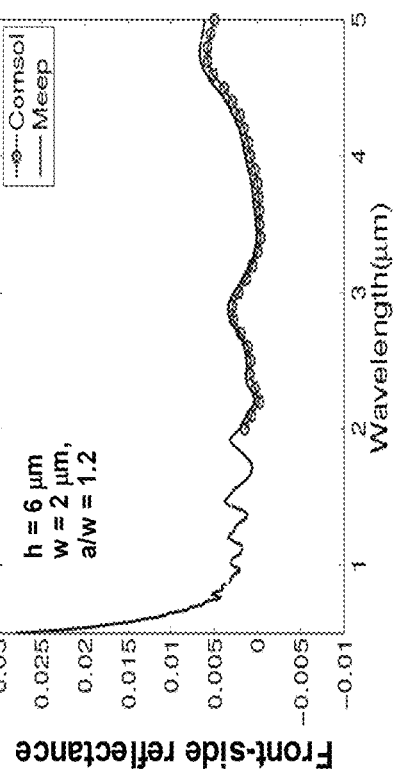

FIGS. 36a-b depict examples of the total absorbance and front-side reflectance calculated for the absorber and detector structure 700 with narrow pyramids (w=2 µm). FIGS. 36c-d depict examples of the total absorbance and front-side reflectance calculated for the absorber and detector structure 700 with wide pyramids (w=5 µm). A comparison of the plots in FIGS. 36a-d indicates that the results obtained using Meep and the results obtained using Comsol are similar. Results for the wavelength range of 2.0-5.0 µm were obtained using Comsol and results for the entire 0.5 to 5.0 µm range were obtained using Meep.

The structure with 2 µm wide pyramids as shown in FIGS. 36a-b, has a gap g that is 0.4 µm and the width-to-height ratio is 0.33. The Meep results show that the front-side reflectance for this structure becomes significant (>>0.5%) only for wavelengths of the incident light shorter than 0.8 µm. In contrast, the structure with 5 µm wide pyramids as shown in FIGS. 36c-d has a gap of 1 µm and also a width-to-height ratio of 0.83. The Meep results show that the front-side reflectance of this structure exceeds 2.5% for all wavelengths and exceeds 5% for wavelengths shorter than 2 µm. Thus, these results suggest that the gap between adjacent pyramids should be about $\lambda_{min}/2$ or smaller. The absorbance of the structure with backside reflector shows strong wavelength-dependent oscillations in the spectral response for those wavelengths at which the front-side reflectance is significant (e.g., >0.01). These oscillations arise from the optical cavity resonances, because this detector has both significant front-side reflection, for these wavelengths, as well as nearly total reflection from the back-side mirror.

Figure 37D:
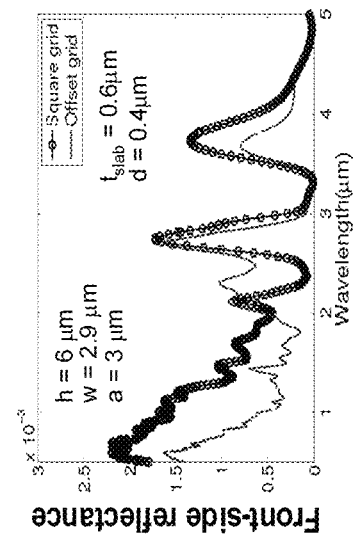
FIGS. 37a-d depict Meep simulation results comparing two different arrangements of the pyramids—a square-grid arrangement and an offset-grid arrangement according to the present disclosure.
Figure 37C:
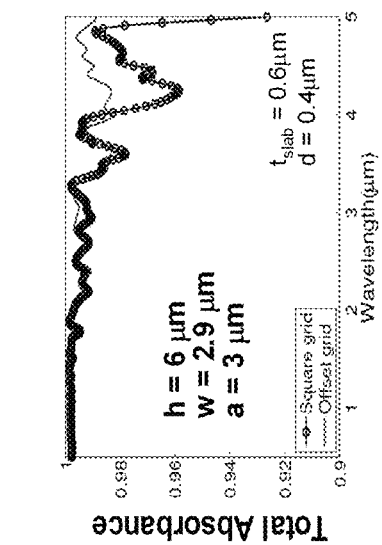

When the pyramid width is too narrow, the absorption of the longer-wavelength light is reduced, as shown in FIG. 36a. A high absorption over the entire 0.5-5.0 µm wavelength range may be achieved by using somewhat wider pyramids and further reducing the gap, as illustrated by the MEEP calculated results shown in FIGS. 37a-d. As shown in FIG. 37d, the front-side reflectance may be made essentially negligible, much smaller than 0.5% of the incident light level, over the entire 0.5-5.0 µm wavelength range. For this structure, the pyramid width to height ratio is 0.48 and the gap between adjacent pyramids is only 0.1 µm. FIG. 37c shows that this structure may absorb >90% of the incident light over the entire 0.5 µm to 5.0 µm wavelength range.

Figures 37A, 37B:
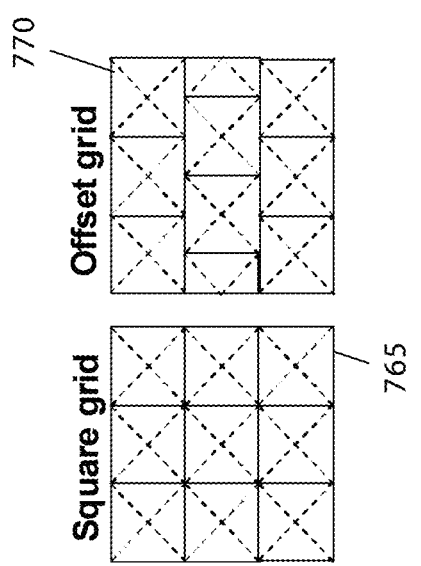

The data in FIGS. 37a-d also provide a comparison between two different arrangements of the array of pyramids in a detector. In the square-grid arrangement, the pyramids 765, which have square bases, are placed side-to-side on a square grid such that the corners of all four adjacent pyramid-bases meet as shown in FIG. 37a. In the offset-grid arrangement (see FIG. 37b), the pyramids 770 in one row (or column) are offset by one-half the pyramid spacing relative to the pyramids 770 in the next adjacent row (or column). In this way, the corners of only two adjacent pyramid-bases meet. The actual volume of the absorber material remains the same, regardless of the arrangement of the pyramids. However, the pyramid arrangement may have a pronounced effect on both the front-side reflectance and the total absorbance of the structure. FIG. 37d shows that the front-side reflectance can be reduced by using the offset-grid arrangement, especially for the shorter-wavelength light. FIG. 37c shows that the total absorbance also can be improved, especially for the longer-wavelength light. For the offset-grid arrangement, the dips in the front-side reflectance spectrum are less pronounced. The removal of those dips occurs because with the offset-grid arrangement, the relative amount of slab that is not covered by a fairly tall portion of a pyramid is much less. Thus, the photon trapping is utilized more effectively. The absorbance of the structure is greater than 0.98 over the entire 0.5-5.0 µm wavelength range. FIGS. 7 and 22 also illustrate the offset-grid arrangement of pyramids.

Figures 38A, 38B:
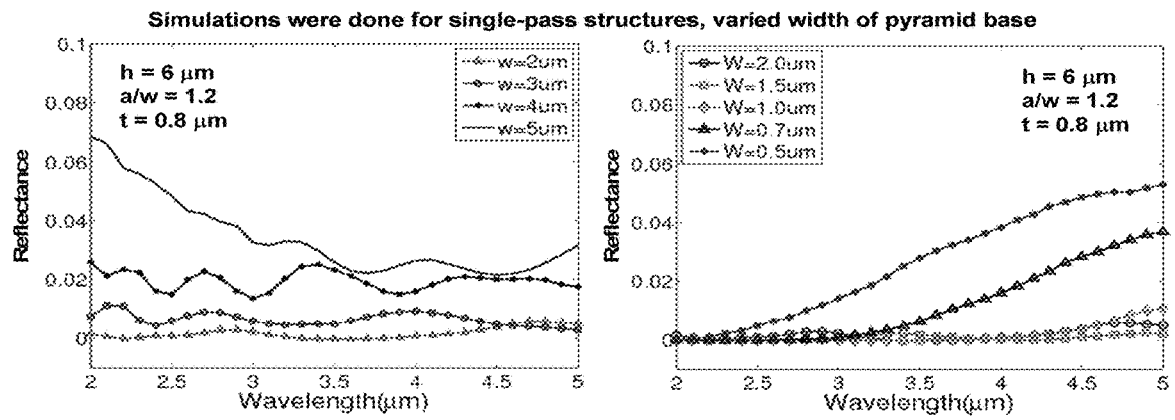
FIGS. 38a-b depict calculated reflectance of "bottomless" structure in which the base width w is varied while the ratio a/w is held constant at a value of 1.2 according to the present disclosure.

FIGS. 38a-b show results, obtained using Comsol, for pyramids with height h=6 µm and slab thickness t=0.8 µm. The pyramid sidewalls are steeper when the base width is smaller. These results show that up to a point, the reflectance is reduced by making the sidewall steeper. The improvement in reflectance is more pronounced for the shorter wavelengths of incident light. However, when the pyramid is very steep, resembling a needle shape (with base-width to height ratio of 0.17 or smaller), the reflectance at the longer wavelengths increases again. This occurs because the longer-wavelength light encounters the average refractive index of the array of closely spaced needles, instead. Thus, when we want to minimize the front-side reflectance, there is an optimal range of pyramid sidewall slopes (i.e., w/h may be between 0.2 and 0.5).

Figures 39A, 39B:
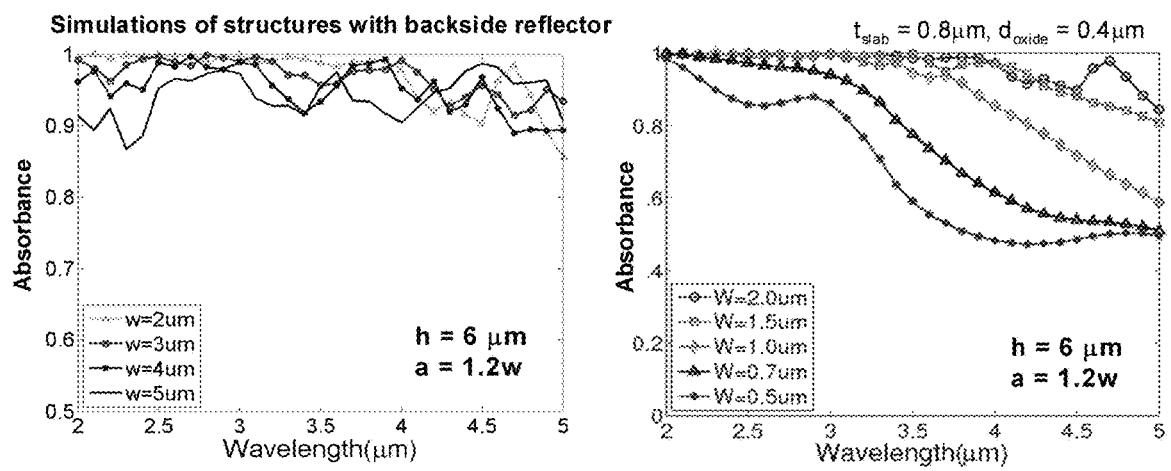
FIGS. 39a-b depict calculated absorbance for structure with bottom reflector in which the base width w is varied while the ratio a/w is held constant at a value of 1.2 according to the present disclosure.

FIGS. 39a-b plot the Comsol calculated absorbance of a structure with bottom reflector. For shorter wavelengths of incident light, the absorbance may be improved by making the pyramid steeper. However, for the longer wavelengths, the improvement does not always occur. Instead, when the pyramid is very steep, the absorbance at the longer wavelengths actually becomes substantially worse. Thus, to achieve both minimal front-side reflectance as well as high absorbance, the preferred pyramid base-width to height ratio may be a value between 0.3 and 0.5.

Curvature of the sloped sidewalls of the pyramids may also effect the front-side reflection of the light. Such curved sidewalls could result from the particular processes used for fabricating the pyramids. Pyramids that have flat sidewalls and pyramids that have curved sidewalls have been considered as shown in FIGS. 40a-e. The sidewalls may have inward curved surfaces as shown in FIGS. 40b-c or outward curved surfaces as shown in FIGS. 40d-e. The effects of the pyramid shape on the front-side reflection and the single-pass absorption of the pyramidal structure were investigated. For this simulation, performed using HFSS, arrays of pyramids whose nominal height is 6 µm and which have a center-to-center spacing of 5 µm were considered. The width of each pyramid is 4.5 µm at its base. FIGS. 40a-e show the unit cells that were used in the HFSS simulations.

As shown in FIGS. 40a-e, the variously shaped pyramids do not have the same volume. The volume fill ratio (VFR) of the detector is defined as being the ratio of the volume of the absorber material in this detector compared to the absorber volume of an equivalent detector that has an absorber layer of uniform thickness with the same maximum height. The total absorber volume of the simulated detector may be given by the volume of the pyramid-shaped absorber plus the volume of the portion of the thin absorbing slab underneath that pyramidal shape. For these simulations, the continuous slab is 0.25 µm thick and the absorbing slab comprises the same material as the pyramid-shaped absorber.

The simulations by HFSS were performed at various values of the optical frequency—between 60 and 600 THz—which corresponds to values of the optical wavelength between 5 µm and 0.5 µm. Results of these calculations are shown in FIG. 40f. FIG. 40f shows that for the pyramids with curved-in or flat sidewalls, the reflection of the incident light is greater for light at the shorter wavelengths than it is for light at the longer wavelengths. FIG. 40*f* also shows that the front-side reflection is smallest for those pyramids that have curved-out sidewalls, which remain more angled in shape near the base of the pyramid. The steeply sloped base areas of these pyramids are especially effective for reducing the reflection of light at the shorter wavelengths. In contrast, for the pyramid shapes with the curve-in sidewalls, the regions near the base look fairly flat and thus those regions can have substantial reflection. For light at the longer wavelengths, of 3-5 µm that is comparable to the gross dimensions of the pyramidal structures, the shape of the pyramid does not have as significant an effect on the front-side reflection. Nevertheless, even at these longer wavelengths, the front-side reflection obtained with the curved-out shape or with the flat sidewalls is a factor of 2 lower than the reflection obtained with the curved-in shape.

The total single-pass absorption is weighted by the effective volume of the absorber material. The shapes that have a larger VFR have greater absorption. FIG. 40*f* also plots the values of the absorption per unit volume obtained with the various pyramid shapes. FIG. 40*f* shows that the shape with the curved-out sidewalls has the lowest absorption per unit volume, although it has the lowest top-surface reflection. Thus, it appears that the pyramid shape with flat sidewalls represents an attractive compromise.

FIGS. 41*a-c* and 42*a-c* compare the absorbance calculated using MEEP for a structure that has shorter pyramids, which are 4 µm high (as shown in FIGS. 42*a-c*) to the absorbance of a structure with 6 µm high pyramids (as shown in FIGS. 41*a-c*). For the structure with 4 µm high pyramids, the pyramid width-to-height ratio is 0.725 and the sidewall angles of those pyramids are less steep. For this structure, the front-side reflectance is somewhat higher such that the maximum detector absorbance is reduced to approximately 0.98. Given its shorter pyramids, the overall volume of absorber material in this detector structure is smaller. Even though the photon trapping is still quite effective, there is not enough absorber material to fully absorb the longer-wavelength light. Thus, the absorbance is reduced to 0.87-0.90 for some of the longer wavelengths of the incident light and the peaks and dips in the absorbance spectrum are more pronounced. FIGS. 41*b-c* and 42*b-c* show the contributions of absorption in the pyramid portion of the detector structure (FIGS. 41*b* and 42*b*) and in the slab portion (FIGS. 41*c* and 42*c*) of the structure. For the detector with 4 µm tall pyramids, the relative absorbance attributed to the pyramids is less, compared to the detector with 6 µm tall pyramids. Conversely, the slab portion of the structure makes a relatively greater contribution to the overall absorbance. For either pyramid height, the offset grid arrangement of the pyramids provides higher absorbance compared to the square grid arrangement.

Figure 43A:
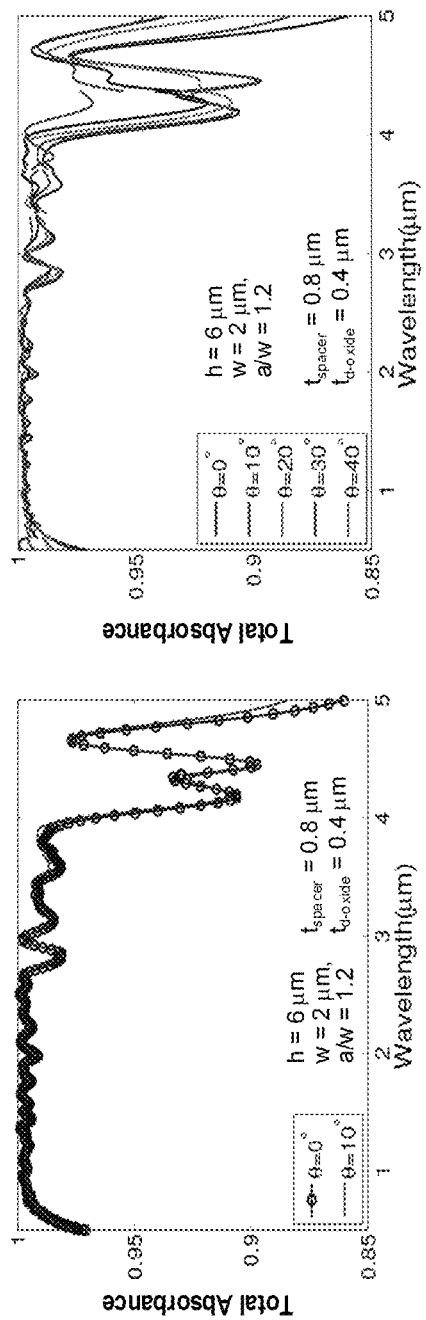
FIGS. 43a-b depict absorbance calculated for various incidence angles of the light, with θ=0° corresponding to normal incidence according to the present disclosure.
Figure 43B:
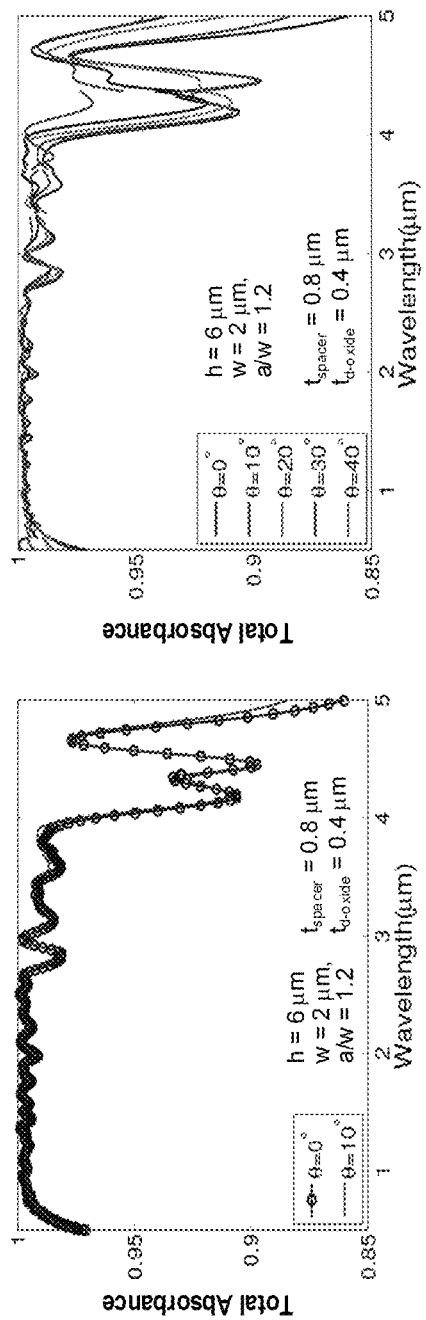

The wideband absorber may absorb light that has a wide range of incidence angles. FIGS. 43*a-b* show that the MEEP calculated detector absorbance for an absorber structure with a square-grid arrangement of 6 µm tall pyramids may maintain high absorbance over a large range of incidence angles. To make the angular dependence more noticeable, the structure considered in this particular simulation has pyramids with a relatively narrow base width of 2 µm. Thus, the absorbance of the longer-wavelength light is somewhat poorer for this structure with w/h=0.33 compared to the structure of FIGS. 37*a-d* for which w/h=0.48. The results in FIGS. 43*a-b* show that the absorbance at the longer wavelengths actually is increased for light at larger incidence angles (away from the normal). For the off-normal incident light, the pyramids appear tilted and thus are not symmetric. A beneficial effect of this asymmetry is that the dips in the absorbance spectra become shallower. Note that for the shorter-wavelength light, the absorbance already is close to 100%, thus the effect of the incidence angle is less noticeable. Nevertheless, the data shows that those dips in the absorbance spectra also become even shallower. Incidentally, an artifact of these MEEP simulations is that for the larger incidence angles of the input light, the actual incidence angles used in each of the 14 different parts of a MEEP simulation are slightly different from the assumed angle (the actual angles can differ by as much as 9° when θ=40°). Thus, the curves plotted in FIGS. 43*a-b* for each of those larger incidence angles are discontinuous.

When the incidence angle of the light is mainly approximately perpendicular to the plane of the light-absorbing slab, it is preferable for the pyramids to be tilted and thereby asymmetric. The tilt angle can be 20-40 degrees or larger. Benefits of tilted pyramidal structures are described in an article by P. Campbell, S. R. Wenham and M. A. Green, "Light trapping and reflection control with tilted pyramids and grooves," Conference Record of the Twentieth IEEE Photovoltaic Specialists Conference, 1988, pp. 713-716.

Figure 44C:
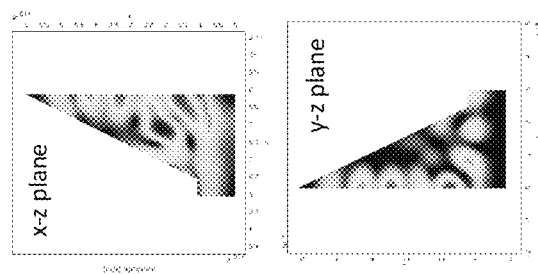
FIGS. 44c-d depict optical-field intensity distribution of a structure with combination of absorbing slab, oxide spacer and metal backside reflector according to the present disclosure.
Figure 44D:
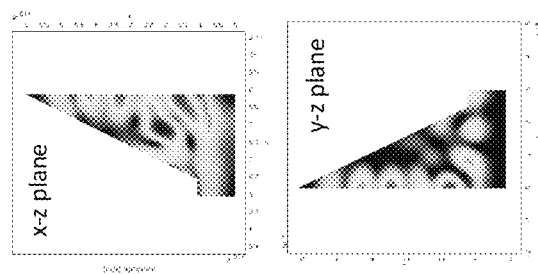
Figure 44B:
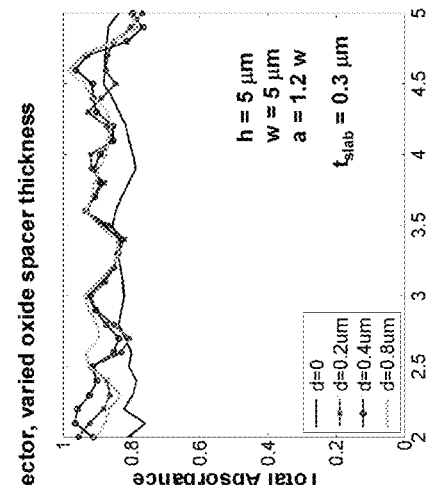
FIG. 44b depicts total absorbance, calculated for various values of the oxide layer in a structure with combination of absorbing slab, oxide spacer and metal backside according to the present disclosure.
Figure 44A:
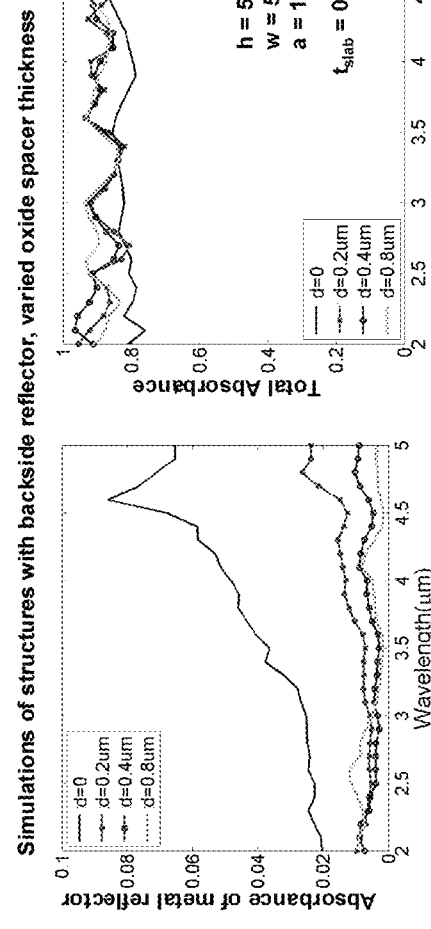
FIG. 44a depicts absorbance of a metal reflector in a structure with combination of absorbing slab, oxide spacer and metal backside reflector according to the present disclosure.

The effects of the thickness of the optional low-refractive-index dielectric or oxide spacer layer was also simulated and will be described next. FIG. 44*a* plots the absorbance of the underlying metal layer in a structure with a metal backside reflector. When the oxide layer is absent, there is significant absorption of the light by the metal reflector. However, when the thickness d of the oxide layer is 0.4 µm or larger, the absorption by the metal reflector is nearly negligible. This result may be significant if the wideband absorber is used as a light detector and it is desirable to maximize the detected signal. FIG. 44*b* plots the absorbance calculated using Comsol for several values of the oxide thickness. In these cases, the slab thickness is 0.3 µm. There is not much difference between the plotted curves when the thickness of the oxide layer is 0.4 µm and larger. But the absorbance is noticeably degraded when the oxide layer is absent. The highly absorbing metal reflector imposes a boundary condition on the optical field to have a value of zero at the metal surface. Thus, the intensity of light is weak in those portions of a slab immediately adjacent to the metal surface. The oxide layer may be used to move the absorbing slab away from the metal surface. The oxide spacer layer may also increase the intensity of the light in the absorbing slab, as seen from the plots of optical-field distribution shown in FIGS. 44*c-d*.

It may be instructive to compare the absorbance shown in FIG. 44*b* for a structure with h=5 µm, w=5 µm and t=0.3 µm with the absorbance shown in FIG. 36*c* for a structure with h=6 µm, w=5 µm and t=0.8 µm. The structure of FIG. 36*c* has 1.4× more light-absorber material than the structure of FIG. 44*b*. As can be seen, when the absorbance is high, the improvement in absorbance achieved as a result of the greater absorber volume is significant—from approximately 0.90 to approximately 0.94—but it is not comparable to the increase in absorber volume. Nevertheless, to achieve absorbance >0.98, it is desirable to have the height of the light-absorbing pyramids be at least $4\lambda_{max}/n_A$.

Figures 45A, 45B:
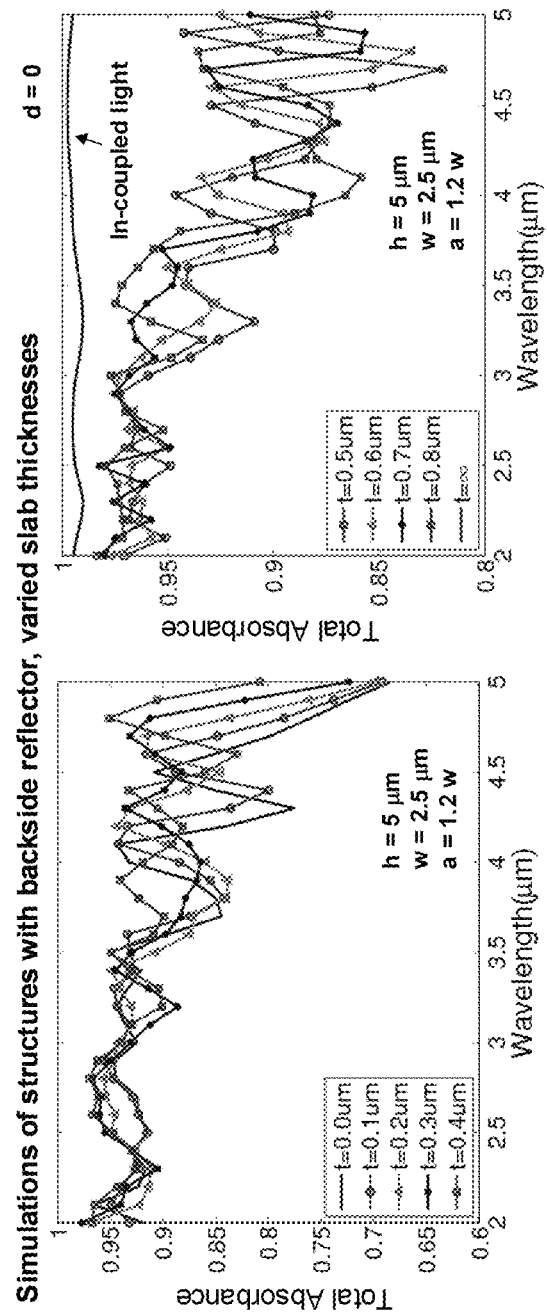
FIGS. 45a-b depict effect of absorbing slab thickness on the overall absorbance of structure with metal backside reflector according to the present disclosure.

It may also be instructive to separately consider the effects of increased pyramid height and increased slab thickness, as discussed below with reference to FIGS. 45*a-b*. The effect of the slab thickness for a structure that does not have an oxide layer between the absorbing slab and the metal backside reflector has been investigated. Such a structure is representative of the absorbing extractor region of a detector. The thickness of the slab was varied and the absorption in the pyramids was monitored in different slices through the slab, with each slice having a thickness of 0.1 µm. The height of the pyramid was set to h=5 µm and the width of the pyramid was set to w=2.5 µm, with a/w=1.2. Thus, the effect of the gap between adjacent pyramids should be minimal. FIGS. 45a-b plot the Comsol calculated absorbance of the structure and shows how the absorbance changes as the thickness of the slab is increased from 0 µm to 0.8 µm. FIG. 45b further shows that as t=∞ the normalized amount of incident light that is coupled into the light-absorbing material rather than being reflected from the front side of the structure.

The plots of FIGS. 45a-b show that for this structure, with h=5 µm and w/h=0.5, the front-side reflectance is very low since the in-coupled light is nearly 99%. That reflectance is only 0.01 or lower over the entire wavelength range. For the longer wavelengths of the incident light, the spectral oscillations in the absorbance spectra become larger in magnitude. The plots of FIGS. 45a-b further show the mean value of the total absorbance about which these oscillations occur become lower for the longer wavelengths. These oscillations occur because a substantial amount of light remains after the first pass through the absorber material and must be absorbed on subsequent passes from being trapped in the pyramidal structure. As the slab thickness is progressively increased, the overall thickness of the absorber material is increased. Thus, the magnitude of the spectral oscillations becomes smaller and smaller. Also, the mean value of the total absorbance becomes higher. When the absorbing slab has a total thickness of at least 0.7 µm, the absorbance is greater than 0.85 over the entire 2-5 µm wavelength range. But at this slab thickness, the structure would have the same absorber volume as a structure with a pyramid height of 6 µm and a slab thickness of approximately 0.35 µm.

Figures 46A, 46B, 46C:
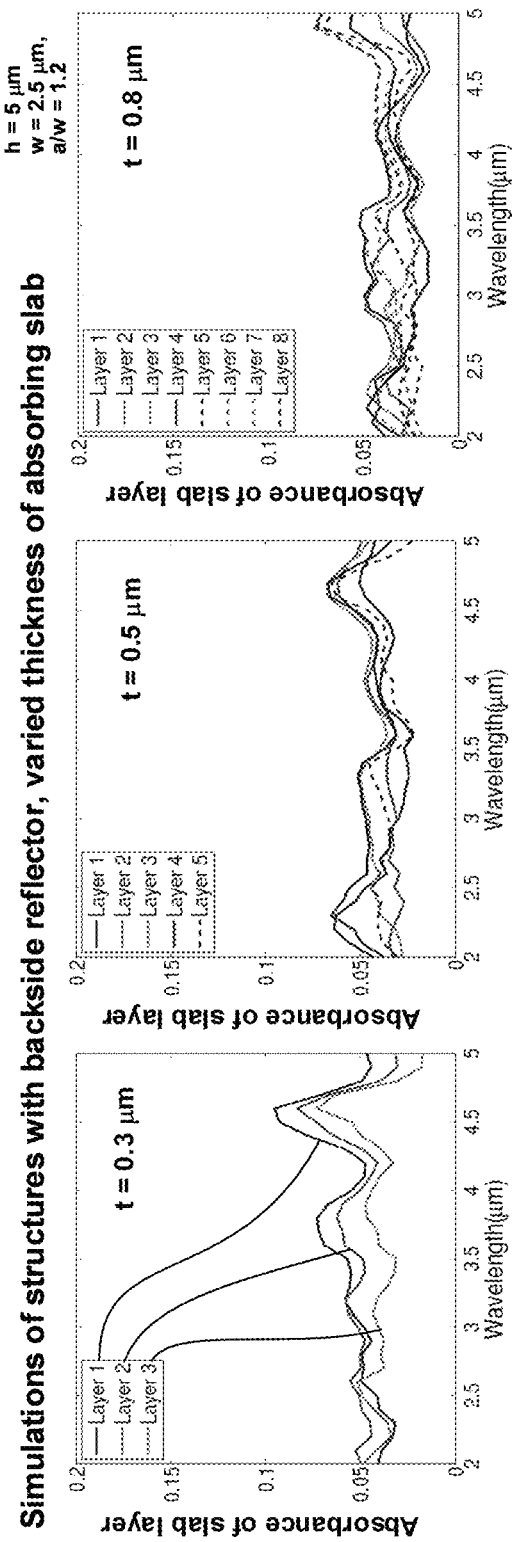
FIGS. 46a-c depict absorbance of the slices in the slab region of an absorber structure with backside metal according to the present disclosure.

FIGS. 46a-c depict the slab-slice absorbance that was calculated for structures having 3 different values of the total slab thickness. For a slab thickness of 0.3 µm or smaller (shown in FIG. 46a), the slice closest to the metal reflector (i.e., layer 3) has noticeably lower absorbance than the slices located farther from that reflector. However, when the slab thickness is 0.5 µm and larger (shown in FIGS. 46b-c), all of the slices have roughly comparable values of absorbance. The absorbance per slice may become smaller and smaller as the total thickness of the slab is increased and the slab is thus divided into a larger number of slices.

Figures 47A, 47B:
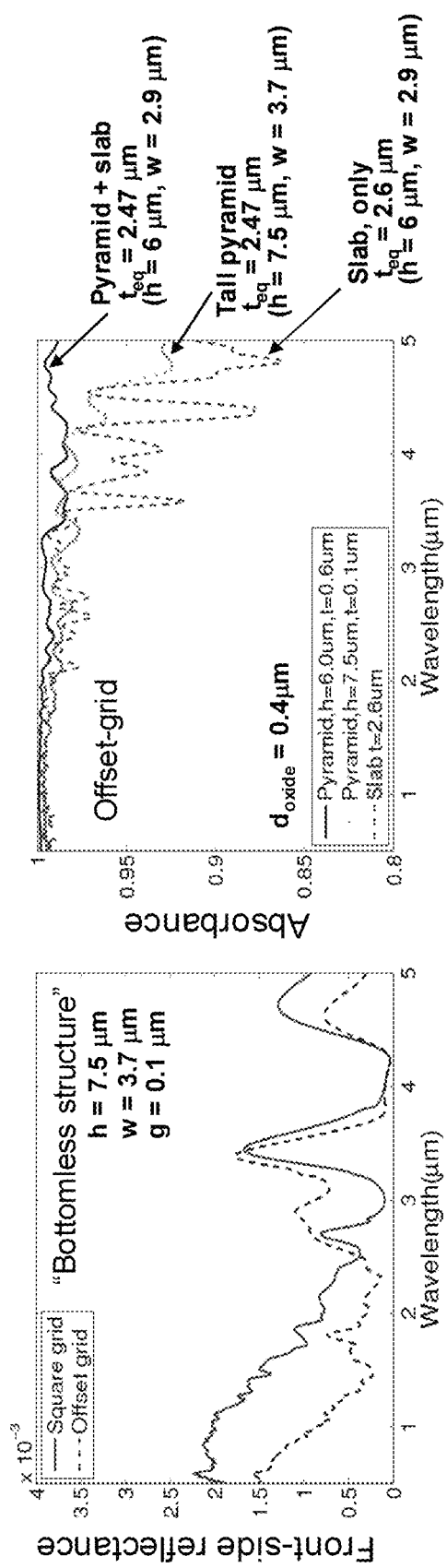
FIG. 47a depicts front-side reflectance of structure with tall pyramid according to the present disclosure.
FIG. 47b depicts comparison of absorbance for three structures that have approximately the same absorber volume according to the present disclosure.

The effects of the relative distribution of the light-absorbing material between the pyramids and the slab was also investigated and are discussed below. Referring to FIGS. 47a-b, a structure in which the height of the light-absorbing pyramid is 7.5 µm but the thickness of the light-absorbing slab is only 0.1 µm was simulated. A structure that has pyramids of similar shape as those in the structure of FIGS. 37a-d but that comprise non-absorbing material with the same optical refractive index as the absorbing material of its 2.6 µm thick slab was also simulated. FIG. 47b shows the calculated absorbance for these two structures and compares them to the absorbance for the structure of FIGS. 37a-d. All of these structures have roughly the same volume of light-absorbing material. The value for the w/h ratio is approximately 0.48-0.49 for all three structures. Also, the gap width is 0.1 µm in all three structures.

FIG. 47a shows the front-side reflectance for the structure that has pyramids of 7.5 µm height. The plotted results indicate that low front-side reflectance (0.002 or lower) may be achieved over the entire wavelength range when the pyramid width-to-height ratio is maintained at the preferred value of approximately 0.5 and the gap between adjacent pyramids is minimized. Low reflectance may be achieved even though the actual height of the pyramid is changed from 6.0 to 7.5 µm.

Figures 48A, 48B:
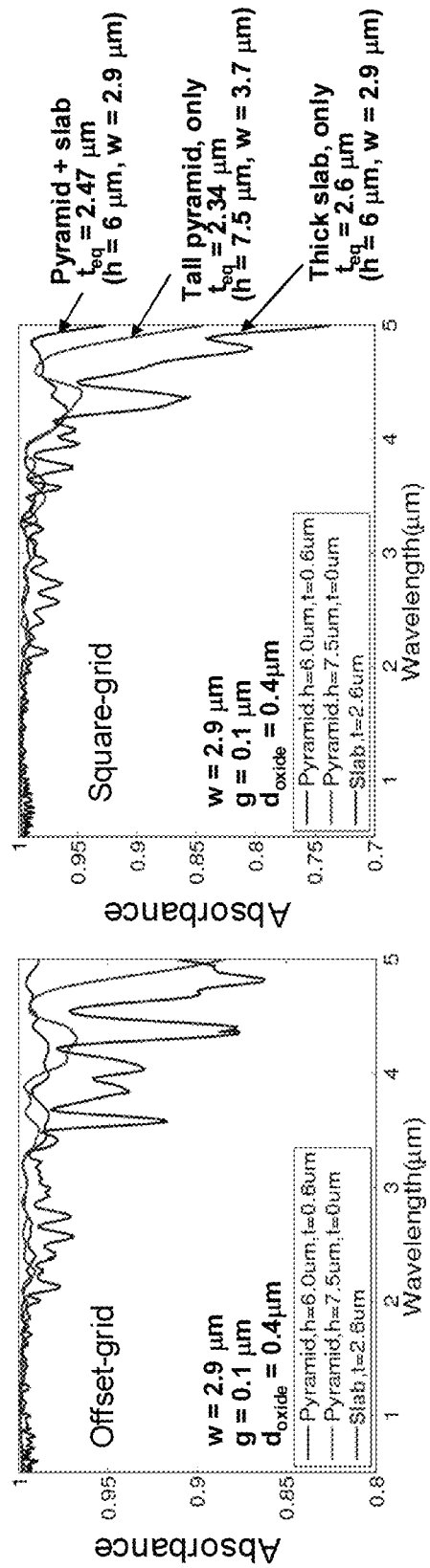
FIGS. 48a-b depict absorbance of structures that have light-absorbing pyramids but no slab layer, compared to the absorbance of structures that have light-absorbing slab layers according to the present disclosure.

FIG. 47b and FIGS. 48a-b depict the absorbance calculated using MEEP for the three structures being compared. For each structure, one can define an equivalent thickness of the absorber material as being the overall absorber volume in a unit cell (or in a pixel) divided by the area of the unit cell (or of the pixel). For the two structures with absorbing pyramids, the equivalent absorber thickness is 2.47 µm. For the structure in which only the slab is absorbing, the equivalent absorber thickness is slightly greater, being 2.6 µm. This comparison shows that the absorbance is greatest for the structure in which the light-absorbing material is distributed in both the pyramid and the slab. This comparison further shows that for the same volume of absorber material, it may be preferable to have the absorber located mainly in the pyramid instead of being located mainly in the slab. High absorbance may also be achieved for structures that contain only light-absorbing pyramids but no absorbing slab. FIGS. 48a-b show the absorbance spectra for structures whose absorbing pyramids have a height of 7.5 µm. For these structures the bases of the pyramids directly abut the oxide spacer layer, which also abuts the metal reflector. In this example, the pyramids have a width-to-height ratio of 0.39 and the gap between adjacent pyramids is 0.1 µm. Like the structures having an absorbing slab, the offset-grid arrangement of the pyramids produces higher absorbance at the longer wavelengths than the square-grid arrangement for these "slabless" structures. But for the longest wavelengths of the incident light, the absorbance of the "slabless" structures is somewhat lower compared to the absorbance that can be achieved with a structure that includes both absorbing pyramids and an absorbing slab (as shown in FIGS. 48a-b).

Figure 49B:
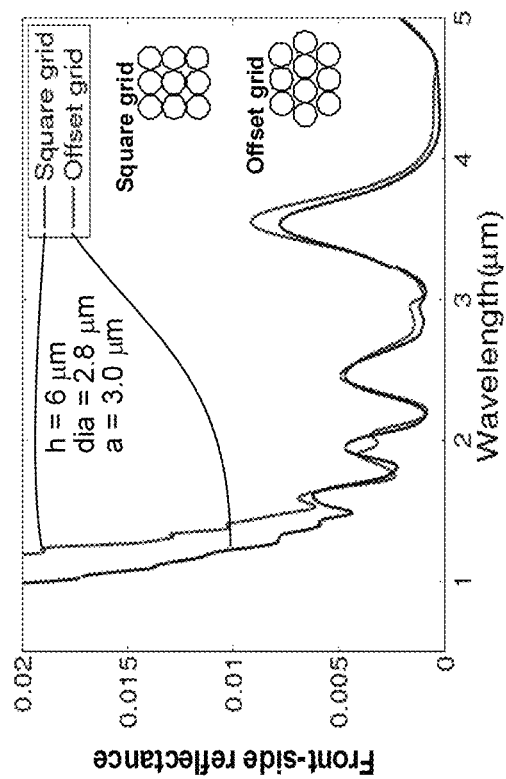
FIGS. 49a-b depict simulation results for detector structure with cone-shaped absorbers above the absorbing spacer layer according to the present disclosure.
Figure 49A:
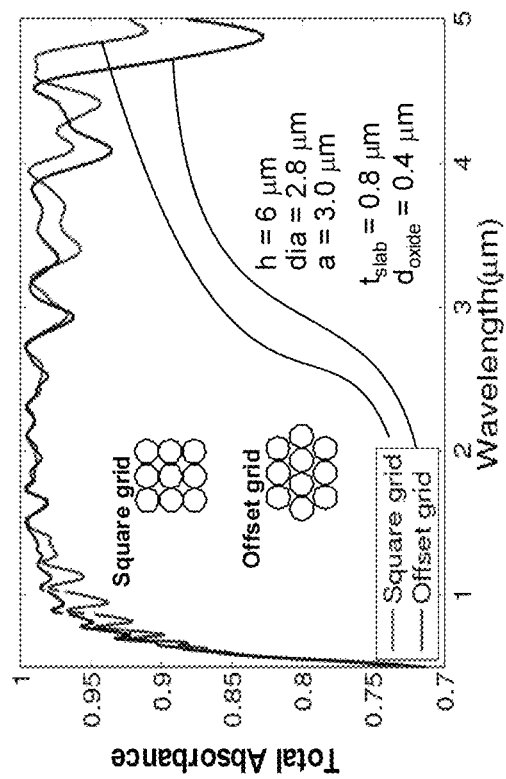

The pyramids need not have square cross-section. For example, the cross section also could be circular or oval or hexagonal or rectangular. FIGS. 49a-b show the MEEP calculated absorbance and front-side reflectance of a structure that has pyramids shaped like circular cones. In this case, the height of those cones is h=6 µm and the diameter of the base of the cones is 2.8 µm. The cones have a smaller volume of absorber material compared to the square-base pyramids. Thus, the absorbance is reduced compared to that of a detector with those square-base pyramids, especially for the longer-wavelength light. With the cone-shaped structures, the benefits of the offset-grid arrangement on the front-side reflectance are even more prominent. When the cones have a square-grid arrangement, as illustrated in the inserts, there are large regions at the corners of a grid where the gap is large. However, with an offset-grid arrangement, although there always is some gap between adjacent cones, the width of that gap is smaller. Thus, the good anti-reflection provided by the offset-grid arrangement of cones extends to shorter wavelengths, compared to that provided by the square-grid arrangement. But for the cones, the square-grid arrangement achieves higher absorbance at the longer wavelengths of the incident light.

Figure 50A:
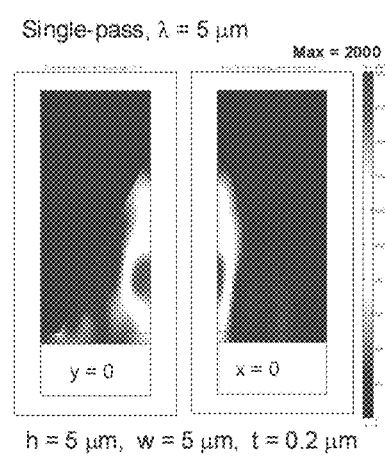
FIGS. 50a-c depict trapped-energy distribution of pyramidal structures according to the present disclosure.
Figure 50B:
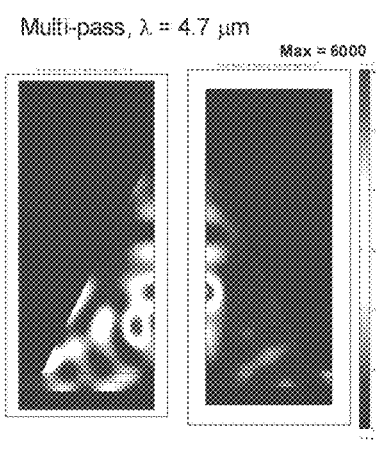
Figure 50C:
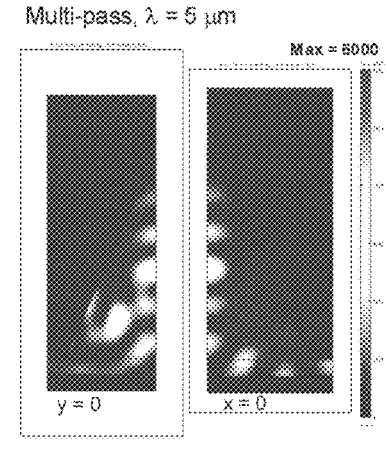

The relative amounts of absorption that occurs in different lateral portions of a light-absorbing pyramid were also investigated and discussed below. This may provide insight on where to more optimally place the light-absorbing material in an absorber structure in which only a portion, but not all, of each pyramid contains light-absorbing material, with the remaining portion containing high-index but transparent material. FIGS. 50a-c show exemplary Comsol calculated plots of the intensity of the optical field in the wideband absorber structure. This structure has a w/h ratio of 1.0, so it is not optimal. The optical field for a single-pass "bottomless" structure is shown in FIG. 50a. The optical field calculated at two different wavelengths of a structure with a back-side metal reflector is shown in FIGS. 50b and 50c. As can be seen in FIGS. 50b-c, the intensity of the light is much greater in the structure with back-side reflector. This higher intensity of the light is an indication of the light-trapping or photon-trapping effectiveness of the structure. Referring to FIGS. 50a-c, it may be noted that more of the light is near the central portion of the pyramid (under the tip of the pyramid where the pyramid is tallest) than in the edge portions (where the pyramid is shorter).

Figure 51A:
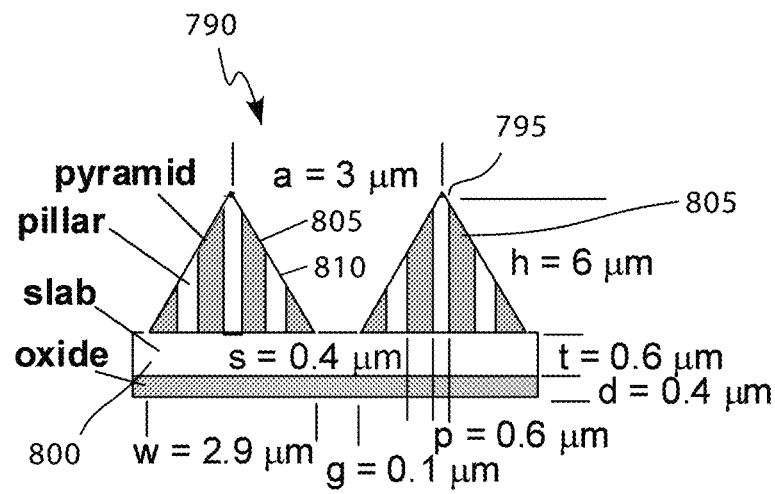
FIG. 51a depicts side view of an exemplary embodiment according to the present disclosure.
Figure 51B:
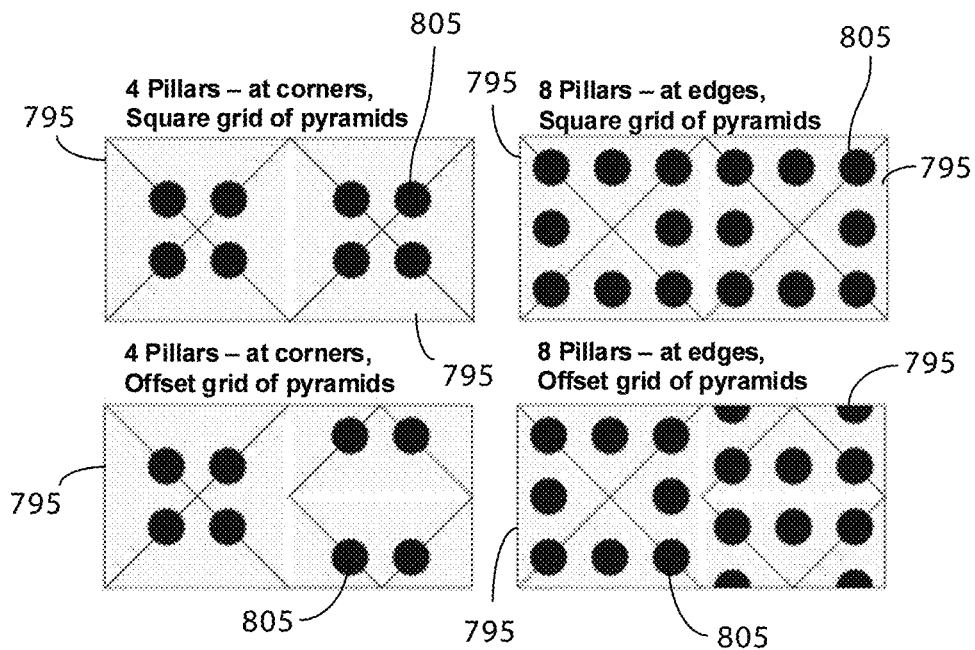
FIG. 51b depicts top view of an exemplary embodiment according to the present disclosure.

Another embodiment of a wideband absorber and detector 790 is illustrated in FIG. 51a. The absorber and detector 790 may comprise an array of pyramids 795 that are above a laterally continuous light-absorbing slab or base region 800. Each pyramid 795 may contain one or more light-absorbing pillars 805 that are buried in a filler 810 comprising transparent material of the same high refractive index as the light-absorbing pillars 805. The height and width of the pyramids 805 used for these simulations are the same as those of the detectors with solid light-absorbing pyramids that have provided the highest absorbance, as discussed regarding FIG. 37a above. For most of the exemplary structures discussed below, each pyramid 795 may comprise one or more narrow cylindrical pillars 805. Unless indicated otherwise, the pillars 805 have a diameter 0.6 μm and have a center-to-center spacing of 1.0 μm. Although only cylindrical pillars are discussed, pillars of other shapes such as rectangular pillars or cones or narrow pyramids also could be used. FIG. 51b depicts top view of pyramids 795 comprising either 4 or 8 pillars 805 disposed at different configurations in the pyramids 795.

FIGS. 52a-f show the absorbance spectra obtained using MEEP for structures that have absorbing pillars in a transparent pyramid and compares them with the spectrum for a structure whose pyramid entirely comprises light-absorbing material (the solid pyramid). The solid pyramid structure has a square-grid arrangement of those pyramids. Results for both the offset-grid arrangement and the square-grid arrangement of the pillared pyramids are shown. These results indicate that the pillared-pyramid structures have poorer absorbance at almost all wavelengths of the incident light. However, if one considers the absorption per unit volume of light-absorbing material, the pillared-pyramid structures actually have approximately 2× more efficient absorption. We note that the volume of the pillars is approximately equal to the volume of the light-absorbing slab layer below those pillars. FIGS. 52a-f also compare the absorbance spectra obtained for the structures with 4 pillars (FIGS. 52d-f) and with 8 pillars (FIGS. 52a-c) in each of their pyramids. The structure with 8 pillars (FIGS. 52a-c) has those pillars located near the edges of the pyramid, where the pyramid is quite short. The absorbance is weakest for this structure. Also, for the longer wavelengths of the incident light (i.e., >3 μm), the absorption per unit absorber volume contributed by the pillars in this structure is approximately equal to the absorption per unit volume contributed by the underlying slab layer. In contrast, the structure with 4 pillars (FIGS. 52d-f) in each pyramid has greater absorption per unit absorber volume contributed by its pillars than by its slab. The 4 pillars in this structure are located closer to the center of the pyramid, where the pyramid is taller, and are placed at the corners of the pyramid walls.

The results above indicate that the portion of the pyramid that is near its 4 edges, where the pyramid is shorter, is less effective for absorbing the incident light than the portion of the pyramid near its center, where the pyramid is taller. This is especially evident for the longer-wavelength incident light but also is noticeable from the results for the shorter wavelength light (i.e., wavelength between 1 μm and 3 μm). For the shortest wavelengths of the incident light (i.e., wavelength between 0.5 μm and 1.0 μm), the absorption from the pillars at the edges of the pyramid is greater since the thickness of that edge portion already is sufficient for absorbing those shortest wavelengths of the light.

FIGS. 53a-d show the absorbance of additional structures as well as their absorption per unit absorber volume, both calculated using MEEP. The overall absorber volume includes the absorbing material in the pillars as well as the absorbing material in the slab. For these comparisons, the area of the unit cell is 3 μm×3 μm and the slab thickness is 0.6 μm, contributing an absorber volume of 5.4 μm$^3$ to each unit cell. The structures tested in FIGS. 53a-d comprise pillars positioned as shown in FIGS. 54a-e.

Referring to FIGS. 53a-d it is evident that the sizes of the peaks and dips in the absorbance spectrum may be related to the overall absorber volume. As can be seen in FIGS. 53a-d, the peaks and dips are greater or more pronounced when the absorber volume is smaller. The structure with a centered square placement of 9 pillars (shown in FIG. 54a) has the largest absorber volume and the smallest peaks and dips in its spectral response as shown in FIGS. 53a-b. In contrast, the structure with a single centered pillar (shown in FIG. 54e) has the smallest absorber volume and the most pronounced peaks and dips in its spectral response as shown in FIGS. 53c-d. Referring to FIGS. 53a-b, it is evident that having 4 pillars that are placed close to the center of the pyramid (as shown in FIG. 54b) provides greater absorption per unit absorber volume than having 1 narrow pillar placed directly at the center of the pyramid with the other pillars placed near the edges (as shown in FIG. 54a). Referring to FIGS. 53c-d, for the shorter-wavelengths of the incident light, the general values for the absorption per unit absorber volume are comparable for the three structures (shown in FIGS. 54c-e) that do not have a pillar located directly at the center of the pyramid. However, for the longer wavelengths of the incident light, the placement of the pillars becomes more important. For these wavelengths, the central portion of the pyramids is preferred for placing the pillars. Further, the structure that has only one pillar, which is located at the center of the pyramid, has the largest absorption per unit absorber volume. This occurs because the relative reduction in the absorption for this structure is less than the relative reduction in its absorber volume. These results indicate that it may be preferable to have the absorbing material located in the central portion of an otherwise transparent pyramid.

Figure 55B:
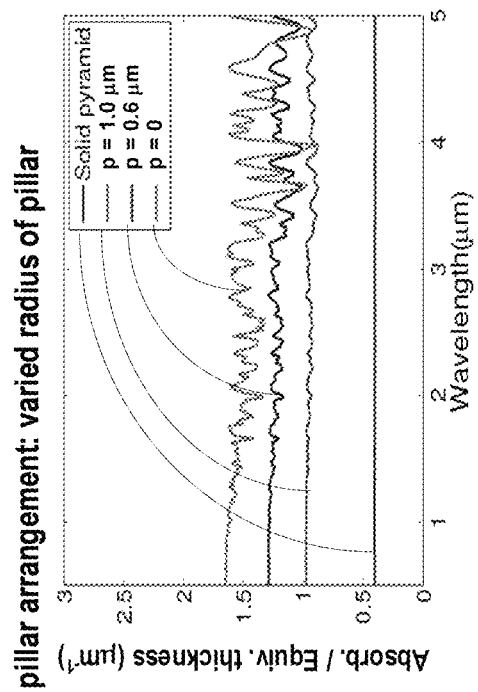
FIGS. 55a-b depict absorbance of structures that have one absorbing pillar within a high-index pyramid where the diameter p of the cylindrical pillar is varied according to the present disclosure.
Figure 55A:
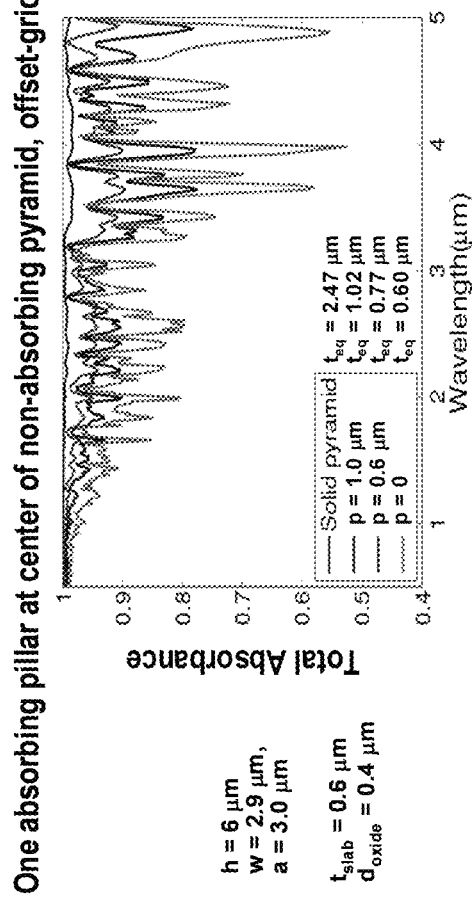

FIGS. 55a-b depict results of MEEP simulated performance characteristics of structures that have a single absorbing pillar at the center of the pyramid with varying diameter of that cylindrical pillar. The absorbance spectra shown in FIGS. 55a-b indicate that when the diameter of the pillar is 1.0 μm, the absorbance may be greater than or equal to 0.9 over the entire wavelength range, although there are noticeable dips in the absorbance spectrum. When the diameter of the pillar is reduced, the dips in the absorbance spectrum become deeper. When the pillar is removed altogether, such that the entire pyramid is transparent, the dips in the absorbance spectrum are very deep, with the absorbance being below 0.6 at some wavelengths. As can be seen in FIGS. 55a-b the specific wavelengths at which those dips occur does not depend strongly on the diameter of the pillar.

For each structure, an equivalent thickness of the absorber material may be defined as being the overall absorber volume in a unit cell (or in a pixel) divided by the area of the unit cell (or of the pixel). The structure in which the entire pyramid comprises light-absorbing material has an equivalent absorber thickness of 2.47 µm. In comparison, the structure containing a single absorbing pillar within each transparent pyramid has an equivalent absorber thickness of only 1.02 µm. FIG. 55*b* depicts a plot comparing the absorbance per equivalent thickness of the structures. As the pillar diameter is reduced, the absorbance per equivalent thickness is improved for the shorter wavelength light. However, for certain ones of the wavelengths, the absorbance per equivalent thickness is not improved compared to the case with the 1.0 µm diameter pillar. This indicates that when deep dips in the absorbance spectrum are undesirable, the structure with a single 1.0 µm diameter absorbing pillar at the center of each transparent pyramid above a 0.6 µm thick absorbing slab is close to optimal. Compared to the structure in which the entire pyramid also is absorbing, the VFR of this single-pillar structure has been reduced to 0.165.

Figure 56:
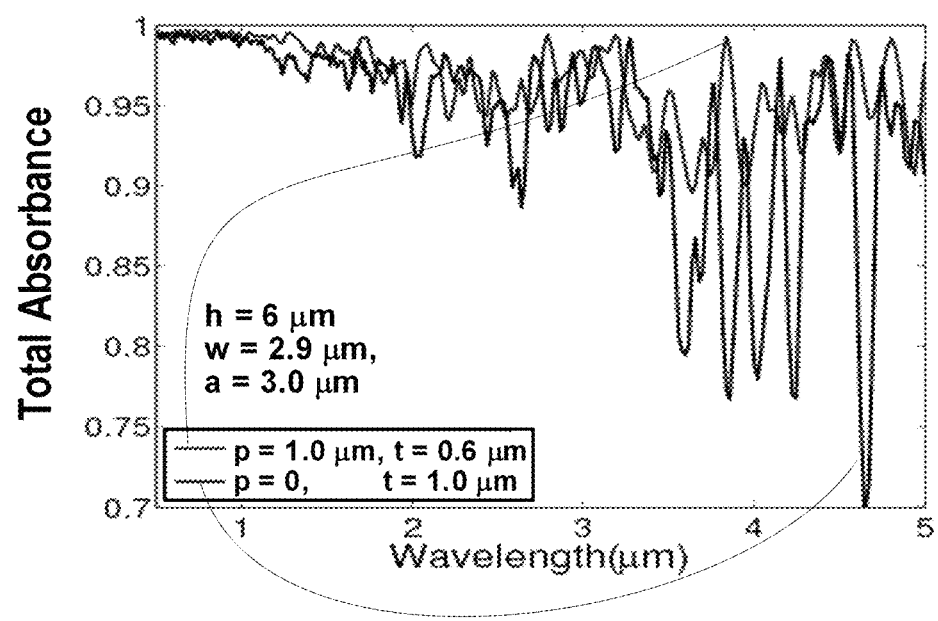
FIG. 56 depicts absorbance calculated for structures that have either one or no absorbing pillar within a high-index pyramid according to the present disclosure.

Referring to FIG. 56, simulations were made using MEEP to determine whether, for the same overall absorber volume, higher overall absorbance is obtained when some of that absorbing material is in a single pillar within a transparent pyramid or higher absorbance is obtained when all of the absorbing material is in the absorbing slab (with the entire pyramid being transparent). FIG. 56 shows the calculated absorbance for a structure with an offset-grid arrangement of pyramids in which the absorbing slab thickness is increased to 1.0 µm and the entire pyramid is transparent. This structure has approximately the same absorber volume as the structure with the 1.0 µm diameter pillar discussed above, whose absorbance spectrum is shown again in the FIG. 56, for comparison. FIG. 56 shows that the absorbance spectrum for the structure in which only the slab contains light-absorbing material has very deep dips at certain wavelengths. The depth of some dips is as low as 0.7. Thus, in those cases if for some reason when it is preferable or necessary to have all of the absorber material located in a slab underneath an array of transparent pyramids, the thickness of that absorbing slab would need to be increased substantially, so the overall VFR would be higher. For example, the deepest dip in the absorbance spectrum shown in FIG. 47*b* is approximately 0.86 for a structure with transparent pyramids and an absorbing slab of 2.6 µm thickness. But a comparison of FIGS. 56 and 47*b* indicates the structure with the single absorbing pillar within a transparent pyramid, having equivalent absorber thickness of 1.0 µm, has higher minimum absorbance than the structure with a totally transparent pyramid and equivalent absorber thickness of 2.6 µm, although its spectrally averaged absorbance is lower.

In some structures, the pyramids may be transparent to some wavelengths of the incident light but may absorb other wavelengths of the incident light. In these cases, the pyramids generally may absorb the shorter-wavelength light but be transparent to the longer-wavelength light. Also, the pillars may absorb light of a different wavelength range than the light absorbed by the slab. For example, the slab may absorb the entire wavelength range but the pillars may absorb only the longer wavelength light.

In order to more clearly point out the benefits of the presently disclosed wideband absorbers, which may have high-refractive-index pyramidal structures with base width $>\lambda_{max}/2$, compared to the narrow-width pillared structures of the prior art, simulations were performed for structures that have progressively narrower pyramids. FIGS. 57*a-f* show results obtained using MEEP for structures with pyramid base widths of 1.0 µm (i.e., $\lambda_{max}/5$) and 1.5 µm (i.e., $\lambda_{max}/3.3$). These simulations also considered the effect of the gap between adjacent pyramids. FIGS. 57*a* and 57*d* depict the effect of the pyramid base-width and gap on the front-side reflectance. When the gap is small, <0.5 µm, the front-side reflectance is almost negligible, as shown in FIGS. 57*a* and 57*d*. But, even for such narrow gaps, the front-side reflectance for the longer-wavelength light becomes appreciable when the pyramid width-to-height ratio is smaller than 0.2 (as is the case for the 1 µm wide pyramids). Incidentally, for wider gaps between these narrow pyramids of steep sidewalls, the front-side reflectance becomes appreciable when the width of that gap exceeds the wavelength of the light. Thus, compared to the results from previous simulations, structures with narrow and tall pyramids are somewhat more tolerant of having gaps between those pyramids. Nevertheless, the presence of larger gaps does increase the "baseline" front-side reflectance over the entire range of wavelengths of the incident light. When the front-side reflectance is appreciable, the absorbance spectrum of a structure with back-side metal may have oscillations, as shown in FIGS. 57*b* and 57*e*. These oscillations are more pronounced when the front-side reflectance is higher. To avoid these oscillations, the front-side reflectance may be kept below 1%.

The narrow pyramids may not be effective photon-trapping structures for the longer wavelength light as shown FIGS. 57*b* and 57*e*. Absorption of the longer-wavelength light starts to become strongly degraded when the wavelength of that light is approximately 2× the pyramid width. This is further evident in the simulation result shown in FIGS. 36*a* through 39*b*.

By using a combination of the results obtained from the "bottomless" structures and the results obtained from the structures with metal back-side reflectors, it may be possible to derive the net absorbance of the nominally in-coupled light, examples of which are shown in FIGS. 57*c* and 57*f*. The nominally in-coupled light is defined as the light that is not reflected as a result of the front-side reflection but that may potentially be absorbed. Note that the value for the net absorbance shown in FIGS. 57*c* and 57*f* may be larger than 1. This highlights optical cavity effects that occur when the front-side partially reflecting "mirror" operates in resonance with the back-side totally reflecting mirror. The greater the front-side reflectance, the more pronounced these oscillations are. Also, such plots highlight the effectiveness of the photon trapping. When the front-side reflectance is negligible, the structure with 1 µm wide pyramids provides essentially complete photon trapping for light of wavelengths shorter than 2 µm and the structure with 1.5 µm wide pyramids provides essentially complete photon trapping for light of wavelengths shorter than 3 µm. Note, however, that this complete photon trapping is achieved only when the pyramids are 6 µm high but is not achieved when the pyramids are 4 µm high, for those same widths.

Figure 58A:
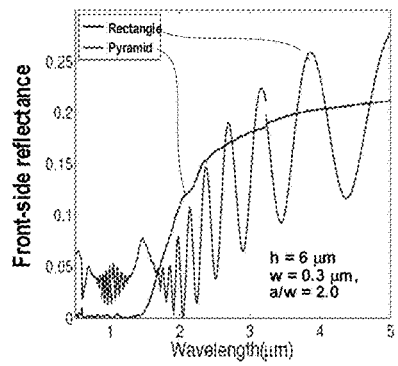
FIGS. 58a-c depict simulation results for a "bottomless" structure that has an array of narrow absorbing pillars above the absorbing slab according to the present disclosure.
Figure 58B:
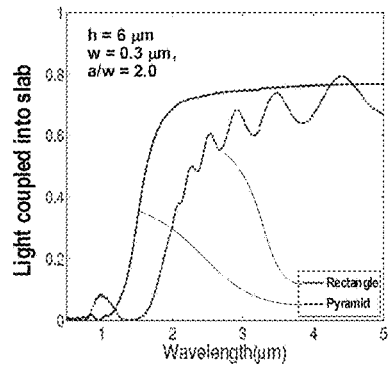

Referring to FIGS. 58*a-c* and 59*a-b*, MEEP simulations were done to compare pillars that have an even narrower pyramidal shape (e.g., having base width $<\lambda_{min}$) with pillars of comparable width that have a rectangular cross-section and flat tops. Structures that have pillars with base width of 0.3 µm and gap between adjacent pillars of 0.3 µm were considered. For such small gaps, none of the incident light should encounter the slab without having first been affected by the pillars. FIGS. 58*a-b* show results obtained for the "bottomless" structure, which was used to investigate the front-side reflectance and to isolate the absorbance in the pillar (or pyramid) regions from the effects of the back-side mirror that is in the detector. FIGS. 58a-b plot the front-side reflectance as well as the relative amount of light coupled into an infinitely thick slab. The results show that for the shorter-wavelength light, the pillars (of either shape) may provide reasonable anti-reflection. The pyramidal pillars, because of their pointed shape, may be more effective than the rectangular pillars. For the longer-wavelength light, in this case for wavelengths >2 µm, the narrow pillars act more like an equivalent film that has a lower effective refractive index that is averaged between the index of the air between the pillars and the index of the pillars. The rectangular pillars appear to the incident light like an equivalent film that presents an abrupt change in refractive index. Thus, the plot for their front-side reflectance spectrum shows the resonance oscillations that would be associated with such a film. The pyramid-shaped pillars, however, appear to have a vertically graded effective index and thus their front-side reflectance spectrum is free of oscillations.

Figure 58C:
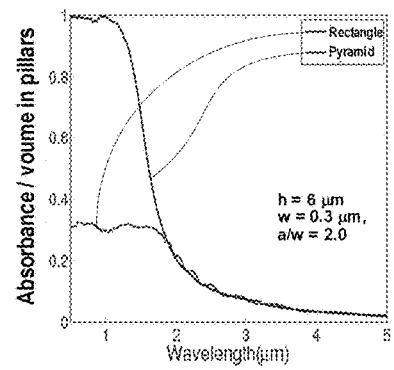

Shorter-wavelength incident light may be trapped in the pillars rather than being coupled into the slab, as suggested by the results shown in FIGS. 58b-c. The rectangular pillars absorb more of the incident light compared to the pyramidal pillars. This relatively greater absorption, however, is due to the 3× larger volume of absorber material for the rectangular pillars. When one considers the absorbance per unit volume of absorber material, the pyramidal pillars may achieve more efficient absorption of the incident shorter-wavelength light.

Figure 59A:
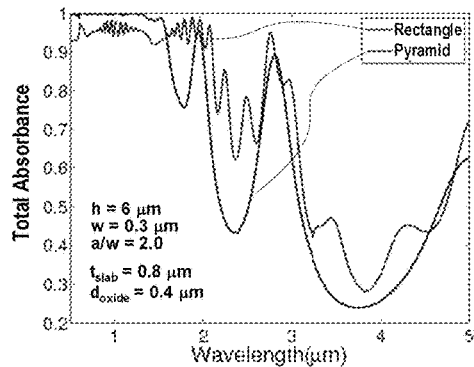
FIGS. 59a-b depict calculated absorbance for structure with bottom reflector that has narrow absorbing pillars above the absorbing slab according to the present disclosure.
Figure 59B:
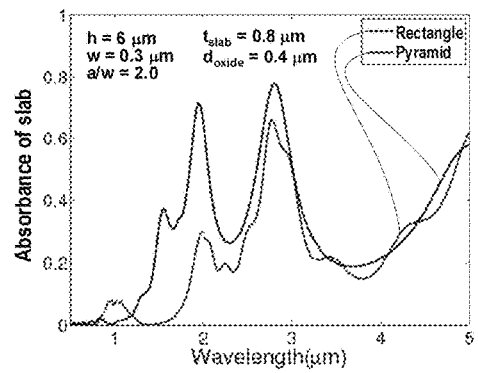

FIGS. 59a-b show the absorbance calculated for structures that have a back-side metal reflector. The total absorbance of the detector actually is quite poor for the longer-wavelength (>2 µm) light. There are very strong oscillations in the absorbance spectrum, and for many wavelengths of the light the absorbance is less than 0.5. Thus, an array of narrow pillars may not provide effective photon trapping for the longer-wavelength light. The rectangular pillars may achieve somewhat higher absorbance compared to the pyramidal pillars, but their absorbance per unit volume of absorber material may actually be poorer. Also, the absorbance spectrum for the detector with rectangular pillars has many more oscillatory features, because of the combined effects of the resonances associated with the equivalent pillared film, which is quite thick, and the resonances associated with the slab layer. The absorbance contributed by the laterally continuous absorber layer or slab of those detectors also is plotted in the FIGS. 59a-b. The slabs for both structures contribute roughly the same amount of absorbance for the longer wavelengths. For the shorter wavelengths, the contribution of the slab is greater for the detector with pyramidal pillars only because those pyramidal pillars pass more of the light into the slab.

Exemplary Detector with Transparent Pyramids and an Absorbing Slab

Although the above described pyramids 78, 120, 134, 268, 376 (shown in FIGS. 6, 10, 12a-b, 20, 21) comprise light absorbing material, a detector described below may comprise pyramids that do not contain any light absorbing material.

A wideband detector may have a relatively uniform spectral response and a small diffusion-current component of the detector's dark current noise because the presently disclosed detector may comprise only a thin light-absorbing layer. Such a structure typically would have large peaks and dips in its spectral response, because of its strong photon trapping and its relatively weak single-pass absorption. But for the presently disclosed detector structure, different lateral portions of a given detector may be designed to have slightly shifted spectral responses such that the spectral peak for one lateral portion of a detector coincides with the spectral dip for another lateral portion. By this means, those large peaks and dips in the spectral response may be averaged out. The different portions of the presently disclosed wideband detector structure may have different collector thickness, different thickness of dielectric layer, and/or different pyramid center-to-center spacing, pyramid height, and pyramid base width.

In one exemplary embodiment, a presently disclosed wideband detector and/or detector array may comprise a thin contiguous layer of light absorbing material, multiple non-absorbing pyramid-shaped structures adjacent to that light-absorbing layer, regions of non-absorbing dielectric material and a metal reflector. The pyramid-shaped structures are located on the side of the light-absorbing layer that faces the incident light to be absorbed and detected by the detector. The dielectric material and the metal reflector are located on the side of the light-absorbing layer opposite the side that faces the incident light. There may be multiple pyramid shaped structures in one photo-detector pixel of the detector array. The real-part of the refractive index for the material of the pyramid shaped structures and for the light-absorbing material may be about the same. The refractive index for the dielectric material may be smaller than the real part of the refractive index for the light-absorbing material.

In one exemplary embodiment, a presently disclosed detector may comprise collector regions or carrier extraction regions that collect or extract the photo-generated minority carriers produced in the light-absorbing layer. Different collector mesas, in the same pixel, may have different thickness. The regions of the back side that are not covered by the collector mesas may be covered by the oxide layer, whose thickness may also vary in different portions of the pixel. A metal reflector (which may also serve as the contact metal for the pixel) may cover the oxide portions and/or the collector mesas. The thickness of the metal reflector may vary in different portions of the pixel. The metal reflector may be in electrical contact with the collector regions. Additional metal contact region may also be in electrical contact with a portion of the light-absorbing layer. The additional metal contact region may be located on the side of the light-absorbing layer that is opposite the side facing the incident light and different ones of these metal contact regions could be interconnected by metal interconnect lines.

In an exemplary embodiment presently disclosed, the total lateral area of the collector regions and the total lateral area of the dielectric regions in a pixel may be constrained to achieve an absorbance spectrum for the detector pixel that is free of pronounced peaks and dips, and thus may be without abrupt and pronounced variation in the absorbance over the range of wavelengths of the incident light to be absorbed. The thickness of the collector regions and the thickness of the dielectric regions may be selected such that wavelengths of the peaks and dips in the spectral response that is associated with the collector regions in combination with the light-absorbing layer and the pyramid-shaped structures match at least some of the wavelengths of the dips and peaks, respectively, in the spectral response that is associated with the dielectric regions in combination with the light-absorbing layer and the pyramid-shaped structures.

In another exemplary embodiment presently disclosed, the thickness of the dielectric regions in one portion of the detector pixel and the thickness of the dielectric regions in another portion of the detector pixel may be different, with those thickness values being selected such that wavelengths of the peaks and dips in the spectral response that is associated with the first dielectric regions in combination with the light-absorbing layer and the pyramid-shaped structures match at least some of the wavelengths of the dips and peaks, respectively, in the spectral response that is associated with the second dielectric regions in combination with the light-absorbing layer and the pyramid-shaped structures. In this way, the spectral responses associated with those two portions of a detector pixel compensate each other to result in a net spectral response that is free of prominent peaks and dips.

In another exemplary embodiment presently disclosed, a detector or a detector pixel of an array may comprise two or more collector regions that are transparent to the incident light to be absorbed and the thicknesses of the two collector regions are different, with those thickness values being selected such that wavelengths of the peaks and dips in the spectral response that is associated with the first collector regions in combination with the light-absorbing layer and the pyramid-shaped structures match the wavelengths of at least some of the dips and peaks, respectively, in the spectral response that is associated with the second collector regions in combination with the light-absorbing layer and the pyramid-shaped structures. In another embodiment presently disclosed, different pyramids in a pixel may have different center-to-center spacing, different base width, and/or different height.

In an exemplary embodiment presently disclosed, a detector may comprise a small volume of light-absorbing material to achieve low dark current associated with spontaneous generation of electrical carriers in the light-absorbing portion of the detector. Despite its small volume of light-absorbing material, the detector may have high-efficiency absorption of the incident light, and high quantum efficiency (for photo-generation of electrical carriers per incident photon of light), because it may have low front-side reflection of the incident light and also because it may trap the not yet absorbed incident light causing that light to make more than two passes through the overall detector structure and through its light absorbing region.

A resonant cavity enhanced (RCE) photo-detector is one prior photo-detector that can provide strong absorption for certain wavelengths of the incident light despite having only a thin light-absorbing layer. However, these RCE photo-detectors have pronounced peaks and dips in their absorbance spectrum, since their enhanced absorption occurs because of the optical resonances in an optical cavity that has a fixed spacing between the front-side reflector of these RCE photo-detectors and their back-side reflector. In contrast, the disclosed detectors are designed to have an absorbance spectrum that is free of the most prominent ones of such peaks and dips because its effective cavity spacing is different in different portions of each detector pixel. As a result, the presently disclosed detectors are suitable for spectrometry and for hyper-spectral sensing.

In one exemplary embodiment presently disclosed, a detector may be able to detect incident light in the short-wave infrared (SWIR) to mid-wave infrared (MWIR) range, between 1.5 and 5.0 micrometer wavelength. It is to be understood that the design principles presently disclosed may be applicable to other wavelength ranges.

FIG. 60 depicts one exemplary embodiment of a novel wideband detector 850a and/or detector 850b according to the present disclosure. The detector 850a may comprise a light-absorbing layer 855 and multiple non-absorbing pyramids 860 that are located on the side of the light-absorbing layer 855 facing the incident light 865, which is called the front side of the detector 850a. The detector 850a may also comprise one or more collector regions 870 disposed on the side of the light-absorbing layer 855 opposite the incident light 865, which is called the back side of the detector 850a. In one exemplary embodiment, the collector regions 870 may absorb the incident light. In another exemplary embodiment, the collector regions 870 do not absorb the incident light. The detector 850a may also comprise regions of dielectric material 871 that do not absorb the incident light. The detector 850a may also comprise one or more metal reflectors 875 disposed on the back side of the detector 850a. The detector 850a may also comprise electrical contacts 880 providing electrical contact to the collector regions 870 and/or light-absorbing layer 855. In one exemplary embodiment, the electrical contacts 880 are Ohmic contacts.

Each detector 850a-b may be a detector pixel of a detector array 890. The detector array 890 may be part of a focal-plane-array optical imaging system (not shown). The detector array 890 may be electrically connected to a read-out integrated circuit 895. As shown in FIG. 60, the detector array 890 may be connected to the read-out circuit 895 by means of solder bumps 900. The metal reflector 875 of a detector 850a may serve an additional role as the electrical interconnect between the collector regions 870 of the detector 850. The metal reflector 875 may also could serve as a bond pad for connecting to the solder bump 900. Each of the electrical contacts 880 providing electrical contact to the light-absorbing layer 855 may be made to each detector 850 or to groups of multiple detectors 850. The electrical contacts 880 may also be electrically interconnected to an additional contact pad 885 for the common electrical contact of the detector array 890.

In one exemplary embodiment, the light-absorbing layer 855 may comprise material configured to absorb light of 1.5-5.0 μm wavelength range. In another exemplary embodiment, the light-absorbing layer 855 may comprise InAsSb material. In this exemplary embodiment, the non-absorbing pyramids 860 may be formed of material that has a larger bandgap than InAsSb and may form a heterojunction with the InAsSb such that barriers are presented to both the flow of electrons and holes from the InAsSb into the non-absorbing pyramids 860, as shown in FIG. 61a. The material forming the non-absorbing pyramids 860 may also have the bandgap large enough that the non-absorbing pyramids 860 are transparent and do not absorb the 1.5-5.0 μm wavelength light. In one exemplary embodiment, the non-absorbing pyramids 860 may comprise GaAlAsSb material. In one exemplary embodiment, the material forming the non-absorbing pyramids 860 may be un-intentionally doped, to reduce the free-carrier absorption of light by the non-absorbing pyramids 860.

In another exemplary embodiment, the collector regions 870 may comprise the same InAsSb material as the light-absorbing layer 855. However, in another exemplary embodiment, the collector regions 870 may be transparent to the 1.5-5.0 μm wavelength light. In an exemplary embodiment, the combination of the collector regions 870 and the light-absorbing layer 855 forms a heterojunction that may block the flow of majority carriers (e.g., electrons) generated in the light-absorbing layer 855 but that may permit the flow of minority carriers (e.g., holes) generated in the light-absorbing layer 855, as shown in FIG. 61b. In one exemplary embodiment, the collector regions 870 may comprise GaAlAsSb material.

In another exemplary embodiment, the HgCdZnTe family of alloys may be used in the presently disclosed detectors 850a-b. For example, the light absorbing layer 855 may comprise a HgCdTe material and the non-absorbing pyramids 860 may comprise another HgCdTe alloy material with similar optical refractive index. In one exemplary embodiment, the collector regions 870 may comprise a HgCdZnTe material.

In another exemplary embodiment, the presently disclosed detector 850a may comprise a barrier structure (not shown) disposed between the light absorbing layer 855 and the collector regions 870. In one exemplary embodiment, the barrier structure (not shown) may comprise AlAsSb, GaAlSb and/or InGaAlSb if the light-absorbing layer 855 comprises GaAlInAsSb containing materials. In another exemplary embodiment, the barrier structure (not shown) may comprise HgCdZnTe alloy if the light absorbing layer 855 comprises HgCdZnTe containing materials. Barrier structures are further discussed in an article by P. Klipstein ("XBn barrier photodetectors for high sensitivity and high operating temperature infrared sensors," Proceedings of SPIE Volume 6940 (2008), p. 69402U), an article by S. Maimon and G. W. Wicks ("nBn detector, an infrared detector with reduced dark current and higher operating temperature," Applied Physics Letters, Vol. 89, p. 151109 (2006)), which is incorporated herein by reference.

Figure 4B:
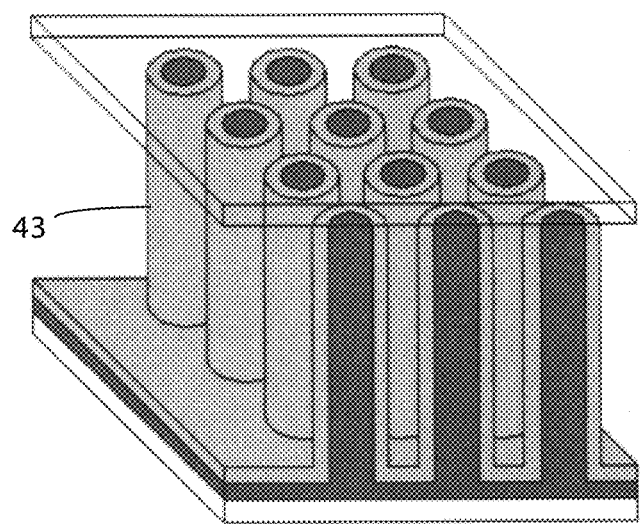
FIG. 4b depicts Prior-Art solar cell with nanorods with PN junction.
Figure 4C:
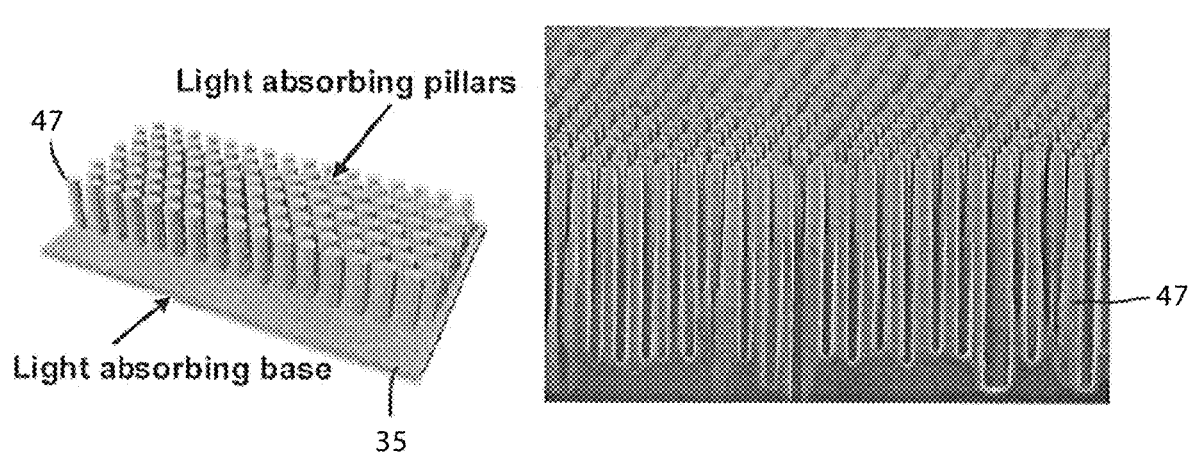
FIG. 4c depicts Prior-Art solar cells structure with an array of light-absorbing rods.
Figure 4D:
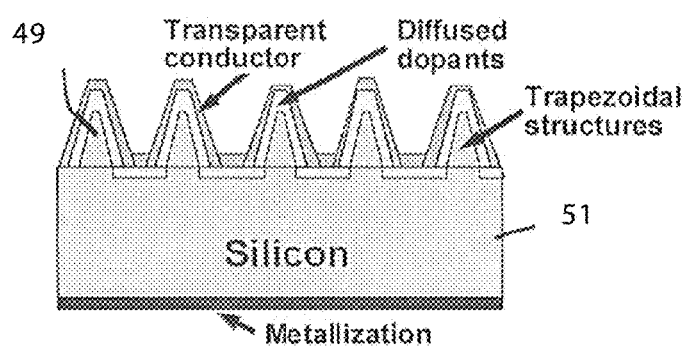
FIG. 4d depicts Prior-Art optical absorber with trapezoidal absorber structures.
Figure 4E:
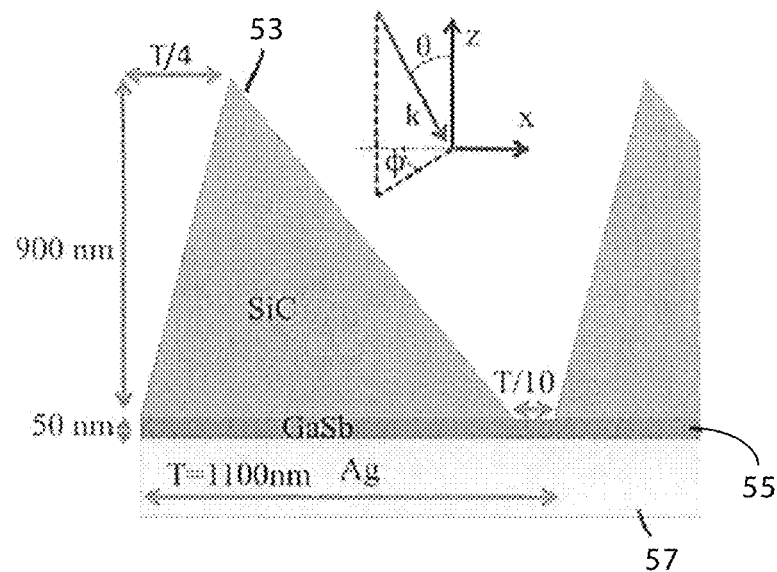
FIG. 4e depicts Prior-Art solar cell with non-absorbing saw-tooth grating and laterally contiguous absorber layer.
Figure 4F:
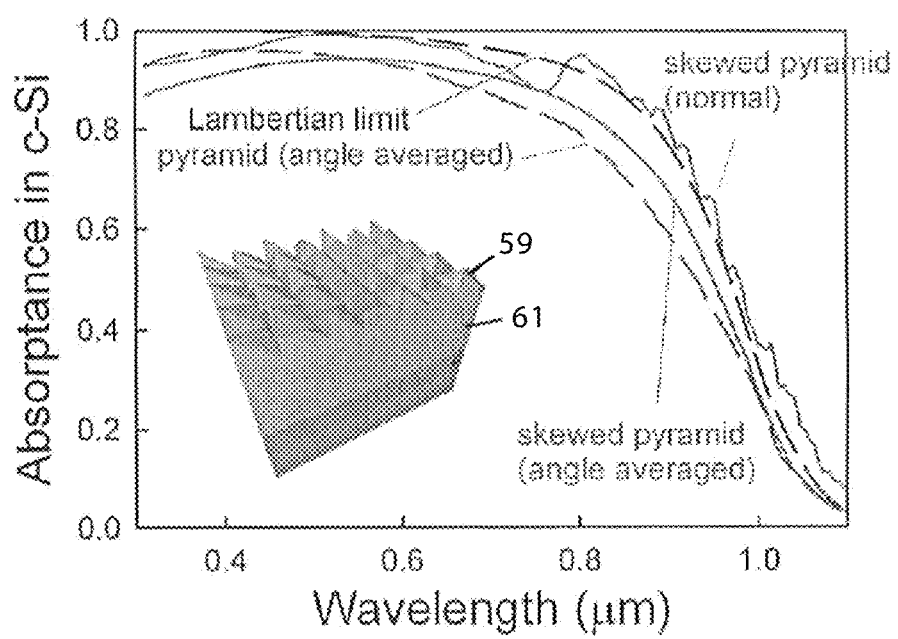
FIG. 4f depicts calculated absorbance of light-absorbing structure with array of short, tilted light-absorbing pyramids located above a thicker light-absorbing layer.
Figure 62A:
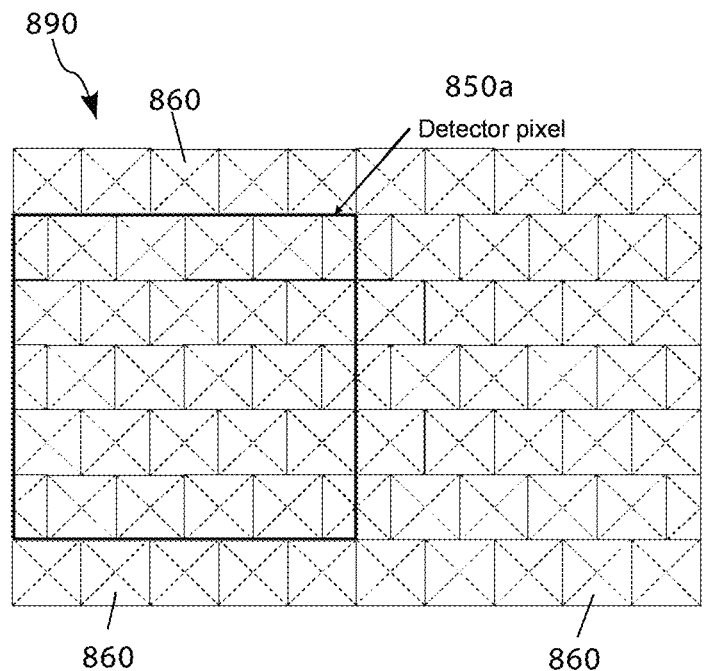
FIG. 62a depicts a front side view of an exemplary embodiment of a detector according to the present disclosure.

In one exemplary embodiment, the non-absorbing pyramids 860 of the detector array 890 form a continuous, uninterrupted pattern to the incident light 865. On the side facing the incident light 865, there are no distinguishing features that indicate the spatial extent of an individual detector 850a of the detector array 890, as shown in FIG. 62a. FIG. 62a depicts a staggered or offset-grid arrangement of the non-absorbing pyramids 860. It is to be understood that other arrangements of the non-absorbing pyramids 860 may also be used. In one exemplary embodiment, the non-absorbing pyramids 860 are not staggered. FIG. 62a also depicts the non-absorbing pyramids 860 that are symmetric. It is to be understood that asymmetric pyramid shapes (as, for example, shown in FIG. 4f) may be used. In one exemplary embodiment, asymmetric pyramids may be used when the angle of the incident light 865 relative to the plane of the detectors 850 is 90 degrees. Asymmetric pyramids are described in an article by P. Campbell, S. R. Wenham and M. A. Green, "Light trapping and reflection control with tilted pyramids and grooves," Conference Record of the Twentieth IEEE Photovoltaic Specialists Conference, 1988, pp. 713-716, which is incorporated herein by reference.

As shown in FIG. 62a, each detector 850a may comprise a plurality of the non-absorbing pyramids 860. In one exemplary embodiment, the detector 850a having a size of approximately 30 μm×30 μm would comprise 100 non-absorbing pyramids 860 having a base width of 3 μm.

Figure 62B:
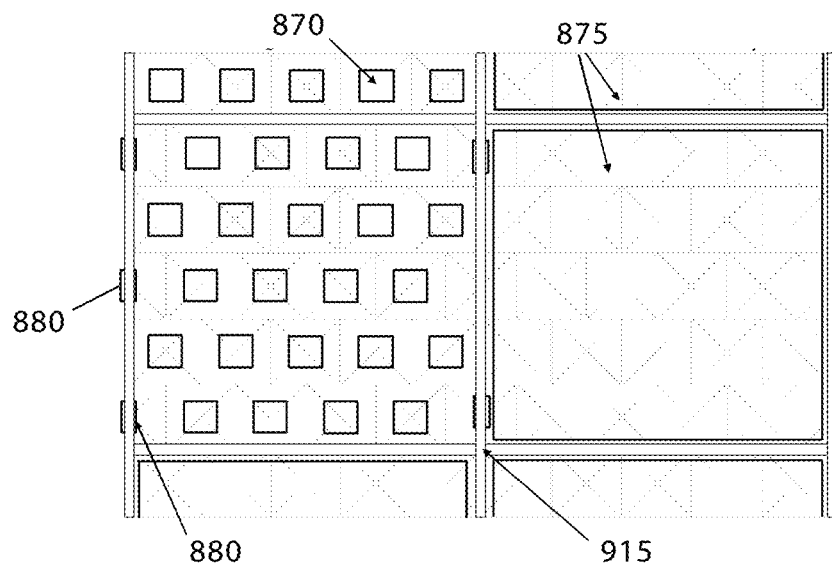
FIG. 62b depicts a back side view of an exemplary embodiment of a detector according to the present disclosure.

The detector 850a of the detector array 890 may comprise multiple collector regions 870 that may be electrically connected to a common metal reflector 875, which may also serve as an electrical interconnect for the collector regions 870. For clarity, FIG. 60 only depicts only a portion of the detector array 890 comprising two detectors 850a-b. FIG. 62b depicts a slightly larger portion of the detector array 890. As can be seen in FIG. 62b there may be many collector regions 870 in each detector 850a and/or 850b. In one exemplary embodiment, each detector 850a or 850b is associated with a single metal reflector 875.

Referring to FIGS. 60 and 62b, the detector array 890 may comprise electrical contacts 880 that are made to electrically contact with the light-absorbing layer 855. The electrical contacts 880 may be electrically connected together by means of metal interconnect lines 915 to one or more solder bumps 900 that are located away from the detector 850a-b.

It is to be understood that the collector regions 870 are not necessarily required to be placed only at specific locations with respect to the pyramids. In one exemplary embodiment, the collector regions 870 are placed beneath each of the tips of the pyramids 860 as shown in FIGS. 60 and 62b. In another exemplary embodiment, referring to FIGS. 63 and 64, a detector array 940 may comprise collector regions 930 forming rings such that the collector is present near the edges of the pyramids 935 but not near the central parts of the pyramids 935. The portions of the back-side of the detector array 940 that are not covered by the collectors may be covered by a dielectric layer 950. With such annular collectors as collector regions 930, a detector 945 may be thought of as comprising central regions 955, edge regions 960 and the collector regions 930. A central region 955 is the dielectric-covered portion at the center of an annular collector. An edge region 960 is the dielectric-covered portion between the annular collectors.

Figure 63:
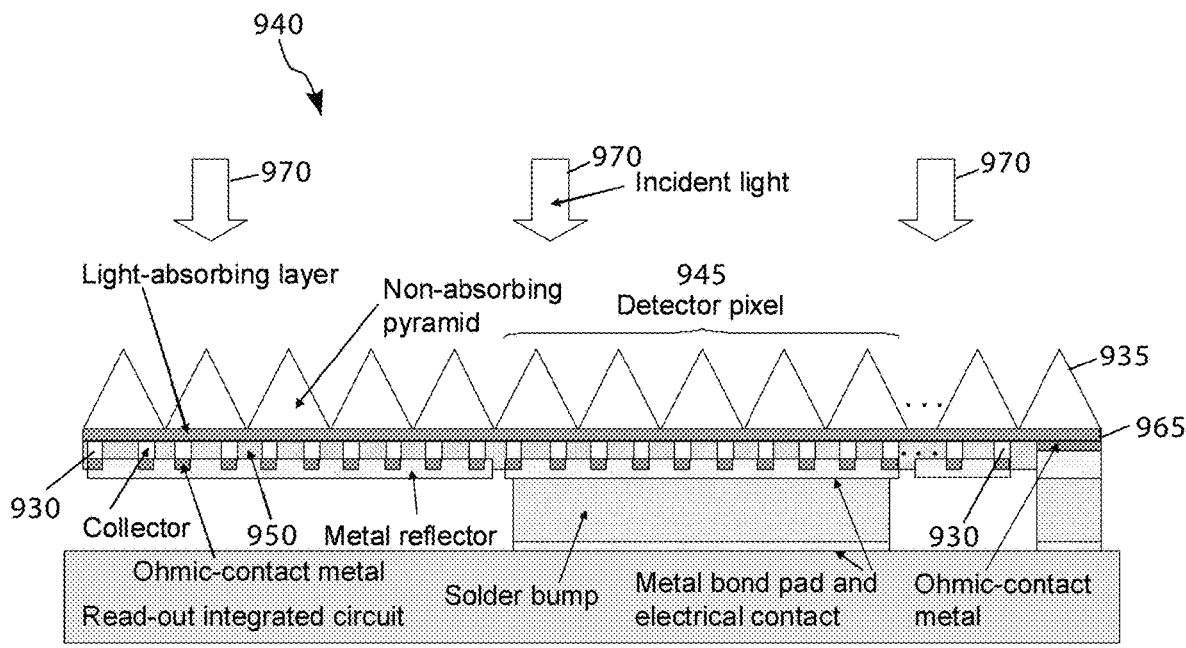
FIG. 63 depicts another exemplary embodiment of a detector according to the present disclosure.
Figure 64:
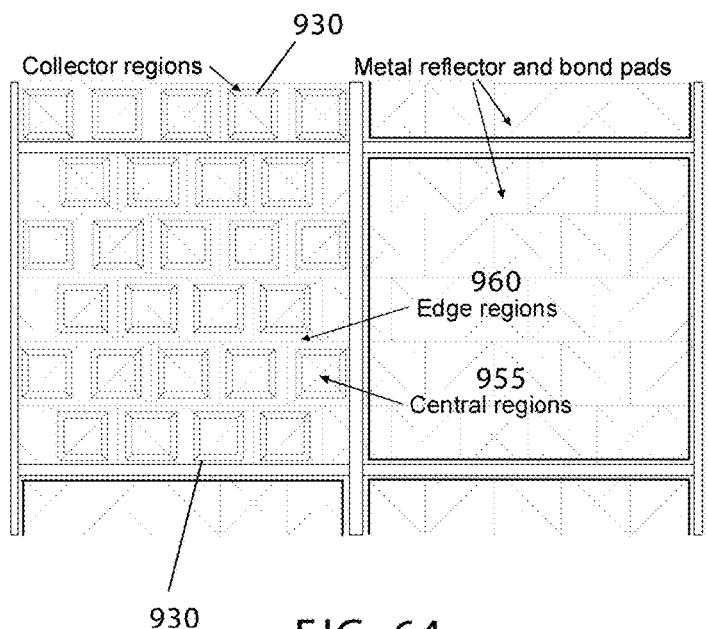
FIG. 64 depicts a back side view of an exemplary embodiment of a detector shown in FIG. 63 according to the present disclosure.

Referring to FIG. 63, in one exemplary embodiment, the back-side of the light-absorbing layer 965 is in contact either with collector regions 930 or with dielectric regions 950. The front-side of the light-absorbing layer 965 is in contact with the pyramids 935. The light-absorbing layer 965 may comprise material having a complex optical refractive index with a real component and an imaginary component. The imaginary refractive index indicates the strength of absorption of the light 970. The real refractive index provides the "refraction" of the light 970. The pyramids 935 do not absorb the light 970, so the imaginary refractive index of the material comprising the pyramids 935 is essentially zero for the wavelengths of interest. The real refractive index of the pyramids 935 may be about equal to the real refractive index of the light-absorbing layer 965's material. Thus, there is minimal optical discontinuity at the interfaces between the pyramids 935 and the light-absorbing layer 965. Similarly, the imaginary refractive index of the material comprising the collector regions 930, when those collector regions 930 are transparent, also is zero. Like the pyramids 935, the real refractive index of the collector region 930's material may be about equal to the real refractive index of the light-absorbing layer 965's material.

In one exemplary embodiment, a presently disclosed detector structure with pyramids may have negligible (<1%) front-side reflectance of the incident light. Although the high-index pyramids of this detector provides negligible front-side reflection, so that the usual Fabry Perot resonances that would otherwise be associated with a resonance-cavity enhanced photo-detector are suppressed, other resonances may be formed within the overall detector structure and produce peaks and dips in the absorbance spectrum, as discussed with reference to FIGS. 53a and 53c. When the pyramids themselves also comprise light-absorbing material, the combination of the absorbing pyramids plus the light-absorbing layer may result in almost complete absorption (>95%) of the incident light over a large range of wavelengths, as shown in FIG. 53a (curve labeled "solid pyramid"). However, when the amount of light-absorbing material in the pyramids is reduced, many sharp peaks and dips can be seen in the absorbance spectrum of the resulting detector (e.g., see curves labeled "centered square" and "square"). This occurs because a greater percentage of the light must now be absorbed by the absorber layer rather than being absorbed in the pyramids. In fact, the depths of the dips in the spectra may be related to the amount of absorber material in the pyramid. Structures with less absorber material in their pyramids have deeper dips in their absorbance spectra as indicated by FIG. 53c. When the pyramid is transparent, one would expect that the peaks and dips in the absorbance spectrum would be even more pronounced as indicated by FIG. 55a. The results in FIGS. 53s, 53c and 55a also indicate that the specific wavelengths at which the peaks and dips occur depend, in general, only weakly on the amount of absorber material in the pyramids.

Although it may not be possible to fully eliminate these resonances, one can average out the effect of these resonances on the absorbance spectrum of a detector. By averaging away the deep dips, an absorbance of >0.9 (>90% absorption) should be achievable. The specific geometry such as the height (h) and width (w) of the pyramids and the gap (g) between adjacent pyramids are typically set to minimize the front-side reflectance. Also, the thickness (t) of the light-absorbing layer may need to be set according to some other constraints, such as the overall absorbance or the dark-current noise level. Thus, the parameters that can be varied readily are the thickness (d) of the low-index dielectric layer and the thickness of the non-absorbing collectors. Furthermore, one can vary the relative areas of the dielectric regions and collector regions in each detector. In some cases, one also may vary the center-to-center spacing and width and possibly also the height of different pyramids in a detector.

FIG. 44b depicts the absorbance calculated for a detector structure in which the thickness (d) of the dielectric layer is varied. These simulations were made for a structure with absorbing pyramids of non-optimal geometry. The plots indicate that for certain wavelengths, such as around 4.6 µm, a dielectric thickness of 0.8 µm produces a local peak in the spectrum but a dielectric thickness of 0.2 µm produces a local dip in the spectrum. Similarly, for wavelengths around 2.6 µm, a dielectric thickness of 0.8 µm produces a local peak in the spectrum but a dielectric thickness of 0.4 µm produces a local dip in the spectrum. However, for other wavelengths, such as those around 3-4 µm, the various dielectric thickness values considered give similar absorbance spectra.

If one assumes the dielectric layer has a refractive index of 1.5, an effective quarter-wave thickness of the dielectric material at 4.6 µm wavelength is 0.77 µm. Thus, for light that is perpendicular (or normal) to the plane of that dielectric layer, a change in the thickness of that layer by 0.77 µm would represent a two-pass change in optical phase of 180 degrees. This would change the optical interference of the light passing through the dielectric layer and reflected from the back-side reflector from being constructive to being destructive, and vice versa. If the light passes through the dielectric layer at a shallower angle, the required thickness of dielectric layer needed to produce the same reversal of interference would be reduced. Specifically, the thickness of the dielectric layer would be reduced by a factor of cos θ, where θ is the angle away from perpendicular. For example, if the angle of the light is 40 degrees, the change in thickness of dielectric layer for achieving the reversal in interference would be approximately 0.6 µm. Now, for this propagation angle of the light, if one assumes the wavelength of light is 2.7 µm, a change in the dielectric thickness of 0.35 µm would produce a change in the two-pass phase shift of 180 degrees. In actuality, the shorter-wavelength light is refracted by a smaller angle by the sloped sidewall of the pyramids. Thus, the propagation angle of that shorter-wavelength light likely is closer to being perpendicular to the plane of the absorbing layer. In which case, a change in the dielectric thickness of approximately 0.4 µm could produce the reversal in interference. This discussion illustrates that changes in the thickness of the dielectric region can be used to change the wavelength locations of the peaks and dips in the absorbance spectrum.

Another way to change the specific wavelengths of the peaks and dips in the absorbance spectrum is depicted in FIGS. 45a-b. FIGS. 45a-b depict the spectra obtained for a detector structure in which the thickness of the dielectric layer is zero and the high-index material is in contact with the metal reflector. This is similar to the case of the collector regions. However, for the structure represented by the results of FIGS. 45a-b all of the high-index material also absorbs the light. That means, for these simulations, the pyramids absorb the light and the collector regions also absorb the light. Nevertheless, the spectral dependence of the optical refraction and reflection properties and the photon trapping characteristics of the structure are dependent primarily on the real refractive index of the materials rather than on whether those materials are absorbing.

The results in FIGS. 45a-b show that the thickness of the high-index material between the pyramids and the metal reflector affects the specific wavelengths of the peaks and dips in the absorbance spectrum. For example, the dips that occur for an absorbing collector thickness of 0.5-0.6 µm coincide with peaks that occur for an absorbing collector thickness of 0.8 µm. If the real refractive index is 3.5 is assumed, for a wavelength of 4.7 µm, a change in the absorbing collector thickness of 0.34 µm would produce a 180 degree phase change for a double pass of the light. But if the light propagates at an angle of 40 degrees from the normal to the plane of the absorber layer, the actual change in absorbing collector thickness for achieving the 180 degree phase change would be 0.26 µm.

Thus, the results of FIGS. 45a-b suggest that if the detector structure has an absorber layer that is 0.5 µm thick and also has a high-index collector layer whose thickness is varied between 0.1 µm and 0.3 µm, the resulting absorbance spectrum would show a gradual drop-off as the wavelength increases from 2 to 5 µm, partly because the imaginary part of the permittivity of the material assumed for these simulations becomes smaller as the wavelength increases, but that spectrum should not have pronounced peak and dips. The structure simulated by FIGS. 45a-b has an absorbing collector region. However, it is preferable that the collector region be transparent to the incident light because any light absorbed in the collector region does not produce electrical carriers that are included in output current of the photodetector.

Figure 65:
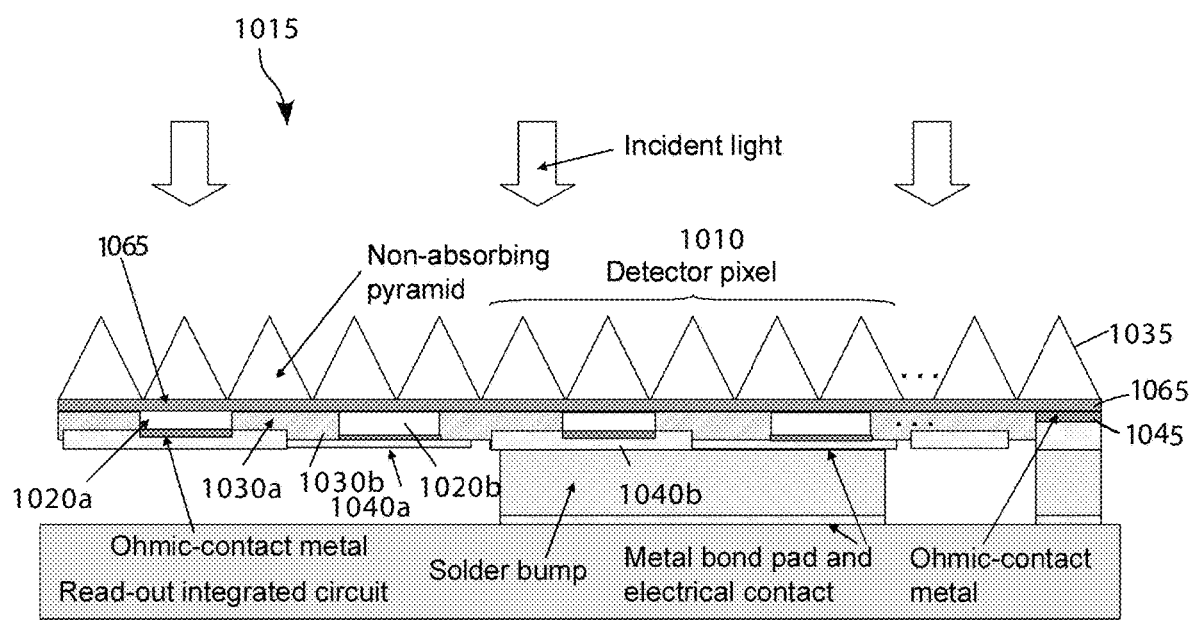
FIG. 65 depicts another exemplary embodiment of a detector according to the present disclosure.

In one exemplary embodiment according to the present disclosure, referring to FIG. 65, a detector 1010 may comprise collector regions 1020a-b of two different thickness values and may comprise dielectric regions 1030a-b of two different thickness values. The thickness of these collector regions 1020a-b and dielectric regions 1030a-b may be chosen such that the dips in the absorbance spectrum associated with a given region will overlap at least some of the peaks in the absorbance spectrum of another region. In this way, the absorbance spectrum of the composite structure may be free of deep dips. However, the peak absorbance at any wavelength may also be reduced. The relative lateral areas of the various collector regions 1020a-b and dielectric regions 1030a-b may be chosen to remove the dips in the absorbance spectrum of the composite structure. For example, if the absorbance spectra of two regions have dips that coincide at the same wavelength, and the absorbance spectrum of a third region has a peak at that wavelength, it may be desirable to have the area of that third region equal the combined areas of the other two regions. The specific location of the collector regions 1020*a-b* and dielectric regions 1030*a-b* relative to the locations of the pyramids 1035 also may affect the absorbance spectra associated with those regions. Thus, the placement of those regions also may be a design variable. For example, referring to the illustrations in FIGS. 60 and 63, it may be desirable to have one thickness for the dielectric regions in the central portion inside the annular collectors 930 and to have a different thickness for the dielectric regions in the edge regions 960. FIG. 65 further shows that as the thicknesses of the collector regions 1020*a-b* and/or dielectric regions 1030*a-b* are varied, the relative thickness of the metal reflector 1040*a-b* may be varied as well.

FIGS. 66*a-g* illustrates an exemplary fabrication process for manufacturing the detector array 1015 shown in FIG. 65. Referring to FIG. 66*a*, an etch stop layer 1055, a collector layer 1060, the light-absorber layer 1065 and a wide band-gap layer 1070 for the pyramids 1035 may be grown on a substrate 1050 by using, for example, molecular beam epitaxy. In one exemplary embodiment, the collector layer 1060 may comprise material that is approximately lattice matched to the material of the light-absorber layer 1065. This generally may result in light-absorber layer 1065's material of improved quality and longer carrier lifetime. The material for the pyramids 1035 may be grown last. In one exemplary embodiment, the material used for the pyramids 1035 may have a larger lattice mismatch. Referring to FIG. 66*b*, pyramids 1035 are formed in the top wide band-gap layer 1070. Known lithography and etching techniques may be used to form the pyramids 1035. In one exemplary embodiment, the pyramids 1035 may be etched such that the bases of the pyramids 1035 are still part of the wide band-gap layer 1070. In another exemplary embodiment, the pyramids 1035 may be etched such that the etching stops at, or even penetrates partially into, the absorber layer 1065. In one exemplary embodiment, a thin coating of a surface-passivation material (not shown) may be applied to cover the exposed sidewalls of the pyramids 1035 and any exposed gaps between adjacent pyramids 1035.

Referring to FIG. 66*c*, the substrate 1050 with the etched pyramids 1035 may be mounted onto a separate carrier substrate 1080 using, for example, a planarization/adhesion layer 1075 as shown in the FIG. 66*c*. Referring to FIG. 66*d*, the substrate 1050 may be removed by known techniques. In one exemplary embodiment, the etch stop layer 1055 may be useful for controlling the removal of the substrate 1050 and protecting the other epitaxially grown layers. The etch stop layer 1055, exposed after the removal of the substrate 1050, may be removed using known etching techniques. Referring to FIG. 66*e*, collector regions may be patterned and etched from the collector layer 1060, using known techniques. In one exemplary embodiment, different collector regions may be defined by etching the collector layer 1060 to different depths. In some areas, the collector layer 1060 may be removed completely, thereby forming recesses 1085, to expose the absorber layer 1065. Ohmic contacts 1090 may be formed onto the collector regions using known techniques. A dielectric material 1095 may be deposited to fill in the etched recesses 1085 as shown in FIG. 66*f*. The dielectric material 1095 may also be patterned and etched to form different dielectric regions that have different thickness of the dielectric material 1095 as shown in FIG. 66*f*. Referring to FIG. 66*g*, a metal layer 1100 may be deposited, using one or several known techniques, to cover the dielectric regions 1095 and the collector regions. The lateral extent of the metal layer 1100 may be defined by known patterning techniques so that each detector has one metal piece, which serves as the detector contact.

With referenced to FIG. 65, in another part of the detector array 1015, Ohmic contacts 1045 may be formed onto portions of the exposed absorber layer 1065 (for the detector-array common contact). These Ohmic contacts may optionally be interconnected by metal interconnect patterns (not shown) that can be deposited onto the back-side of the detector.

Figure 67:
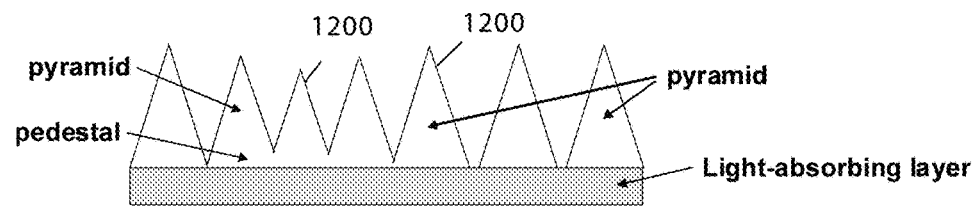
FIG. 67 depicts exemplary embodiment in which the center-to-center spacing of the pyramids is varied according to the present disclosure.

In another exemplary embodiment, it may be possible to vary the specific wavelengths of the peaks and dips of the absorbance spectrum by changing the center-to-center spacing of the pyramids 1200 as shown in FIG. 67. The pyramids 1200 may be formed by etching in the wide band-gap layer 1070 above the light-absorbing layer 1065. By using an etch mask pattern that has different values of the center-to-center spacing for those pyramids 1200, the regions between different ones of the pyramids 1200 may be etched to different depths. This process may also be used to produce differences in the base width of the different pyramids 1200 as well as differencest in their height. Pyramids 1200 with narrower base width may have pedestal regions under them. Also, the regions around other, wider pyramids 1200 may be etched completely to the light-absorbing layer 1065 such that a small gap exists between those pyramids.

In one exemplary embodiment, it may be desirable to avoid having to grow a wide-gap collector layer before growing the light-absorber layer. In this embodiment, a thin cap layer (not shown) of the same material as the absorber layer 1065, but preferably having a higher doping level, may be grown, instead, between the etch stop layer 1055 and the light-absorber layer 1065. The pyramids may then comprise a material that functions as the transparent high-index collector. The features of that collector material are illustrated in FIG. 61*b*.

Figure 68:
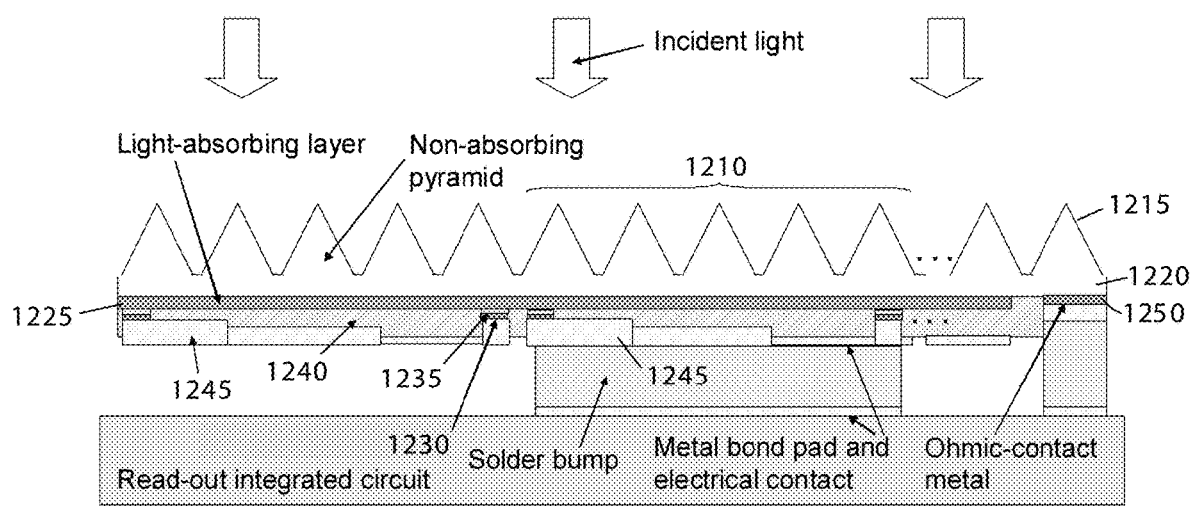
FIG. 68 depicts another exemplary embodiment of a detector according to the present disclosure.

FIG. 68 shows a side view of an embodiment of the detector 1210 comprising a pyramidal layer 1215 which may also serve as the collector 1220. In this embodiment, the pyramids 1215 are not etched completely through to the light-absorber layer 1225. Instead, a portion of that wide-gap material for the pyramids remains such that there is a laterally contiguous path extending throughout the detector array. The Ohmic contact 1230 for the detector 1210 may be formed onto the cap layer 1235. In general, the cap layer 1235 may be retained near the edges or perimeter of each detector 1210 and that cap layer 1235 may be removed over the rest of the area under the detector 1210. Those regions in which the cap layer 1235 is removed and the absorber layer 1225 is exposed on its back side may be covered with the dielectric material 1240. The cap layer 1235 and the dielectric material 1240 may be covered by the metal reflector 1245. The dielectric material 1240 may be etched to have regions of different dielectric thickness. Although abrupt steps are shown in FIG. 68, other shapes such as ramps or curves may also be etched into the dielectric material 1240. The reason for shaping the dielectric material 1240 is to achieve an absorbance spectrum for the detector 1210 that is free of pronounced dips, as discussed above. Other Ohmic contacts may be formed onto the pyramidal layer 1215 by etching away the light-absorbing layer 1225 in the areas for those other contacts, to expose the wide-gap pyramid material 1215, and then forming the Ohmic contacts 1250, for the detector-array contact.

Figure 69:
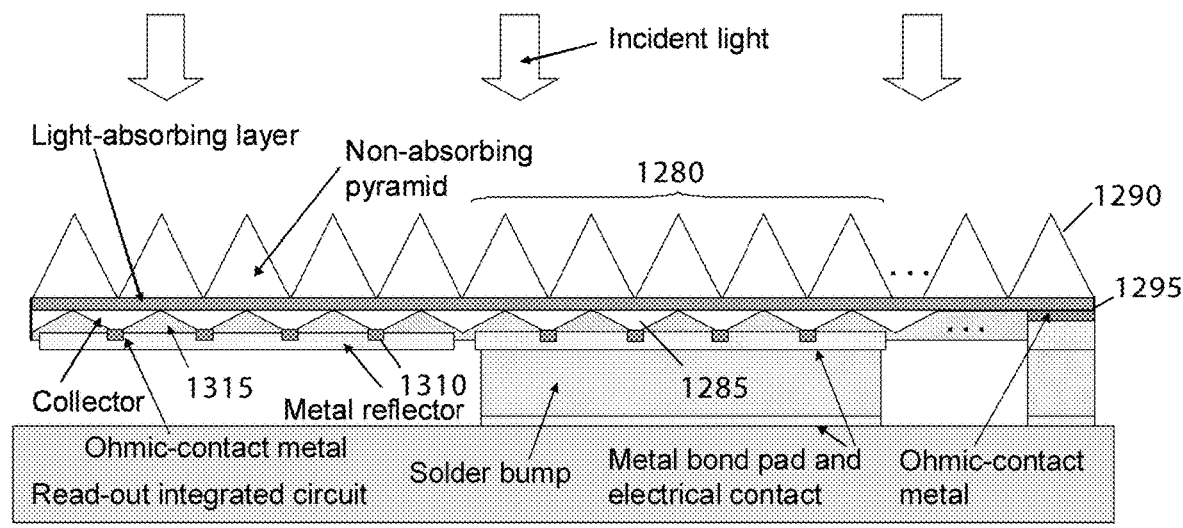
FIG. 69 depicts another exemplary embodiment of a detector according to the present disclosure.

In another exemplary embodiment, the detector structures presently disclosed may comprise gradually varying thickness of the high-index collector regions and gradually varying thickness of the low-index dielectric layer. Referring to FIG. 69, a detector structure 1280 may comprise trapezoid-shaped collector regions 1285 with respect to the high-index pyramids 1290 that are on the opposite side of the light-absorbing layer 1295. The detector structure 1280 may also comprise Ohmic contacts 1310 be that are formed, for example, onto the tips of the trapezoid-shaped collector regions 1285, as shown in the FIG. 69. The gradual variation in the thickness of a dielectric layer 1315 and the thickness of the collector regions 1285 may provide even more averaging of the dips in the absorbance spectrum that might be associated with any given thickness of collector or dielectric layer.

Figure 70:
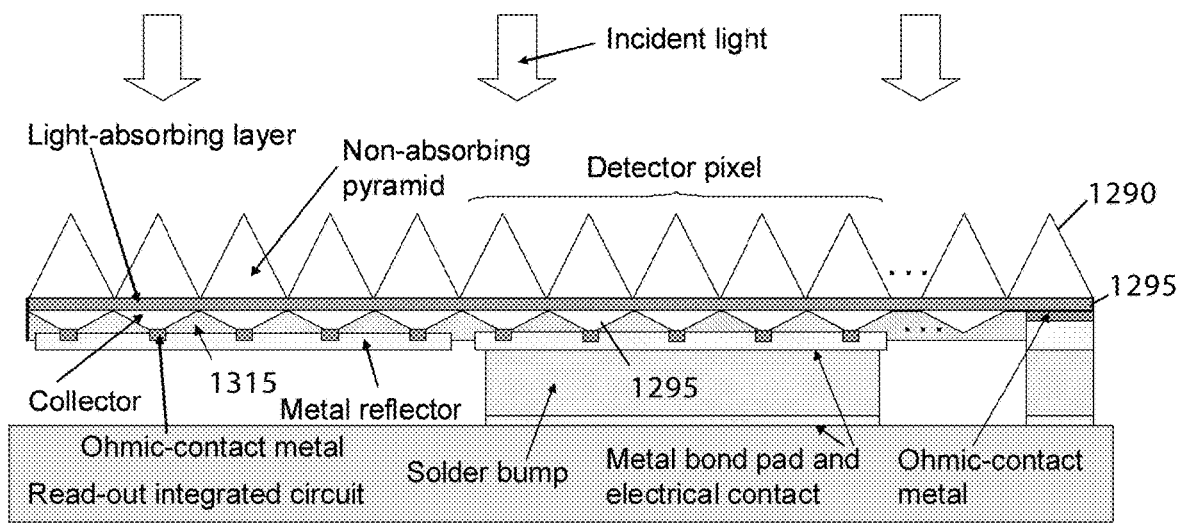
FIG. 70 depicts another exemplary embodiment of a detector according to the present disclosure.

Although the tips of the trapezoid-shaped collector regions 1285 are depicted as being located between the pyramids 1290 in FIG. 69, it is to be understood that the tips of the trapezoid-shaped collector regions 1285 may be located under the tips of the pyramids 1290 as shown in FIG. 70. The preferred alignment may depend on the specifics of an implementation, such as the values of the refractive indices of the various materials and the height and width of the pyramids 1290, the height and width of the trapezoid-shaped collector regions 1285, the thickness of the light-absorbing layer 1295 and the maximum thickness of the dielectric layer 1315.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A detector comprising:
    a non-absorbing layer shaped as a plurality of pyramids;
    a plurality of collector regions;
    an absorber layer disposed between the plurality of collector regions and the non-absorbing layer, the absorber layer extending continuously across the plurality of collector regions;
    a first electrical contact; and
    a second electrical contact,
    wherein the absorber layer is configured to absorb photons of incident light and thereby photo-generate minority electrical carriers and majority electrical carriers, and
    wherein the plurality of collector regions are electrically connected with the absorber layer and with the first electrical contact, and are configured to extract the minority electrical carriers, and the absorber layer is electrically connected with the plurality of collector regions and with the second electrical contact to extract the majority electrical carriers.

2. The detector of claim 1, wherein one collector region of the plurality of collector regions comprises:
    at least a first collector portion having a first thickness; and
    a second collector portion having a second thickness.

3. The detector of claim 1, wherein each one of the plurality of collector regions is disposed substantially under a different one of the plurality of pyramids.

4. The detector of claim 1, wherein at least one surface of at least one pyramid of the plurality of pyramids is curved.

5. The detector of claim 1, wherein the plurality of collector regions are configured to extract photo-generated minority electrical carriers generated by the absorber layer.

6. The detector of claim 1, further comprising a read-out integrated circuit configured to process signals from the first electrical contact and the second electrical contact.

7. The detector of claim 1, further comprising at least one metal reflector adjacent to the absorber layer, wherein the at least one metal reflector is configured to reflect incident light into the absorber layer.

8. The detector of claim 7, wherein a first portion of the at least one metal reflector is separated from the absorber layer by a greater distance than separation of a second portion of the at least one metal reflector from the absorber layer.

9. The detector of claim 7, wherein a first portion of the at least one metal reflector is thicker than a second portion of the at least one metal reflector.

10. The detector of claim 7, further comprising a dielectric material separating the absorber layer and the at least one metal reflector.

11. The detector of claim 10, wherein a first portion of the dielectric material is thicker than a second portion of the dielectric material.

12. The detector of claim 1, wherein a shape of a base of one of the plurality of pyramids is square, rectangular, hexagon, triangular, circular, or elliptical.

13. The detector of claim 1, wherein the non-absorbing layer comprises material with refractive index higher than 1.5.

14. The detector of claim 1, wherein one of the plurality of collector regions has a first thickness and another one of the plurality of collector regions has a second thickness, wherein the first thickness is different from the second thickness.

15. The detector of claim 1, wherein the absorber layer comprises lightly doped n-type material or p-type material.

16. The detector of claim 1, wherein at least one of the collector regions out of the plurality of collector regions is shaped as a trapezoid or cone.

17. The detector of claim 1, further comprising one or more pillars embedded in at least one pyramid of the non-absorbing layer, wherein the one or more pillars are configured to absorb photons of incident light and generate minority electrical carriers and majority electrical carriers.

18. The detector of claim 17, wherein the minority electrical carriers and the majority electrical carriers flow substantially vertically through the one or more pillars towards the absorber layer.

19. The detector of claim 17, wherein the minority electrical carriers flow substantially vertically through the one or more pillars towards the absorber layer and the majority electrical carriers flow laterally through the one or more pillars and the non-absorbing layer shaped as a plurality of pyramids.

20. The detector of claim 17, wherein the non-absorbing layer comprises material with refractive index higher than 1.5.

21. The detector of claim 17, wherein a height of the one or more pillars is predetermined to provide a common pyramidal outline shared by the one or more pillars.

22. The detector of claim 1, wherein the plurality of collector regions are non-absorbing.

23. The detector of claim 7, wherein a first portion of the at least one metal reflector is separated from the absorber layer by a first distance and a second portion of the at least one metal reflector is separated from the absorber layer by a second distance, wherein the first distance and the second distance are different.

24. The detector of claim 1, wherein at least two pyramids of the plurality of pyramids have different height.

25. The detector of claim 1, wherein at least two pyramids of the plurality of pyramids have different base width.

26. The detector of claim 1, wherein at least two pairs of pyramids of the plurality of pyramids have different center to center spacing.

27. A detector comprising:
a collector layer, wherein a top surface of the collector layer is shaped as one or more pyramids;
an absorber layer disposed adjacent to the collector layer;
a first electrical contact;
a second electrical contact; and
a plurality of metal reflectors adjacent to the absorber layer, wherein the plurality of metal reflectors are configured to reflect incident light into the absorber layer, the plurality of metal reflectors being at a same layer as one another;
wherein the absorber layer extends continuously across the plurality of metal reflectors and is configured to absorb photons of incident light and thereby photo-generate minority electrical carriers and majority electrical carriers, and
wherein the collector layer is electrically connected with the absorber layer and with the first electrical contact, and is configured to extract the minority electrical carriers, and the absorber layer is electrically connected with the collector layer and with the second electrical contact to extract the majority electrical carriers.

28. The detector of claim 27, wherein the collector layer is configured to collect the minority electrical carriers.

29. The detector of claim 27 further comprising a dielectric material separating the absorber layer and the plurality of metal reflectors, wherein a first portion of the dielectric material is thicker than a second portion of the dielectric material.

* * * * *